(12) United States Patent
Jikutani

(10) Patent No.: US 7,940,825 B2
(45) Date of Patent: *May 10, 2011

(54) SURFACE-EMISSION LASER DIODE AND SURFACE-EMISSION LASER ARRAY, OPTICAL INTERCONNECTION SYSTEM, OPTICAL COMMUNICATION SYSTEM, ELECTROPHOTOGRAPHIC SYSTEM, AND OPTICAL DISK SYSTEM

(75) Inventor: Naoto Jikutani, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 43 days.

This patent is subject to a terminal disclaimer.

(21) Appl. No.: 12/429,614

(22) Filed: Apr. 24, 2009

(65) Prior Publication Data

US 2009/0268769 A1    Oct. 29, 2009

Related U.S. Application Data

(62) Division of application No. 10/995,284, filed on Nov. 24, 2004, now Pat. No. 7,542,499.

(30) Foreign Application Priority Data

| Nov. 27, 2003 | (JP) | 2003-396815 |
| May 19, 2004 | (JP) | 2004-148902 |
| Jun. 23, 2004 | (JP) | 2004-184492 |
| Nov. 5, 2004 | (JP) | 2004-322041 |

(51) Int. Cl.
*H01S 5/00* (2006.01)
(52) U.S. Cl. .......... 372/46.013; 372/46.015; 372/50.124
(58) Field of Classification Search .............. 372/43.01, 372/44.01, 46.013, 46.015, 50.1, 50.11, 50.124
See application file for complete search history.

(56) References Cited

U.S. PATENT DOCUMENTS

| 6,061,381 A | 5/2000 | Adams et al. |
| 7,009,216 B2 | 3/2006 | Otsuka et al. |
| 7,170,916 B2 | 1/2007 | Kim |
| 2001/0030319 A1 | 10/2001 | Sato et al. |

FOREIGN PATENT DOCUMENTS

| JP | 11-054838 | 2/1999 |
| JP | 11-513534 | 11/1999 |
| JP | 2001-060739 | 3/2001 |
| WO | WO 03/067724 A1 | 8/2003 |

OTHER PUBLICATIONS

K. D. Choquette, et al., "Cavity characteristics of selectively oxidized vertical-cavity lasers," Applied Phs. Lett., vol. 66, No. 25, Jun. 19, 1995, pp. 3413-3415.
K. D. Choquette, et al., "Low threshold voltage vertical-cavity lasers fabricated by selective oxidation," Electronic Letters, Nov. 24, 1994, vol. 30, No. 24, pp. 2043-2044.

(Continued)

*Primary Examiner* — Armando Rodriguez
(74) *Attorney, Agent, or Firm* — Dickstein Shapiro LLP

(57) ABSTRACT

A surface-emission laser diode includes an active layer, a pair of cavity spacer layers formed at both sides of the active layer, a current confinement structure defining a current injection region into the active layer, and a pair of distributed Bragg reflectors opposing with each other across a structure formed of the active layer and the cavity spacer layers, the current confinement structure being formed by a selective oxidation process of a semiconductor layer, the pair of distributed Bragg reflectors being formed of semiconductor materials, wherein there is provided a region containing an oxide of Al and having a relatively low refractive index as compared with a surrounding region in any of the semiconductor distributed Bragg reflector or the cavity spacer layer in correspondence to a part spatially overlapping with the current injection region in a laser cavity direction.

11 Claims, 22 Drawing Sheets

OTHER PUBLICATIONS

L. W. Tu, et al., "High Temperature Performance of Three-Quantum-Well Vertical-Cavity Top-Emitting Lasers," Electronic Letters, Feb. 28, 1991, vol. 27, No. 5, pp. 457-458.

T. H. Oh, et al, "Cavity-Induced Antiguiding in a Selectively Oxidized Vertical-Cavity Surface-Emitting Laser," IEEE Photonics Technology Letters, vol. 10, No. 1, Jan. 1998, pp. 12-14.

D. Zhou, et al., "Simplified-antiresonant reflecting optical waveguide-type vertical-cavity surface-emitting lasers," Applied Physics Letters, vol. 76, No. 13, Mar. 27, 2000, pp. 1659-1661.

D. Zhou, et al., "High-Power Single-Mode Antiresonant Reflecting Optical Waveguide-Type Vertical-Cavity Surface-Emitting Lasers," IEEE Journal of Quantum Electronics, vol. 38, No. 12, Dec. 2002, pp. 1599-1606.

GAIN REGION

GAIN REGION

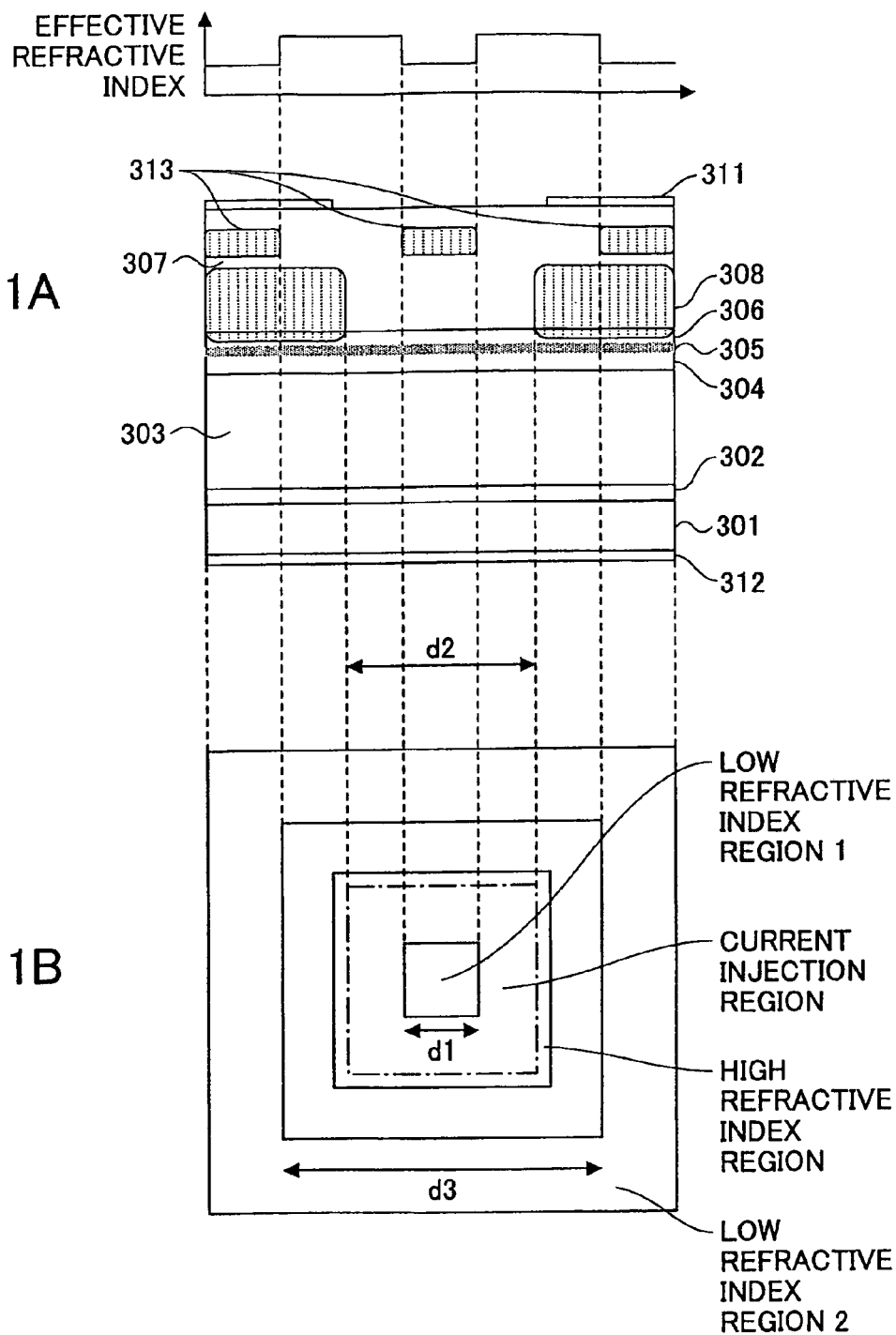

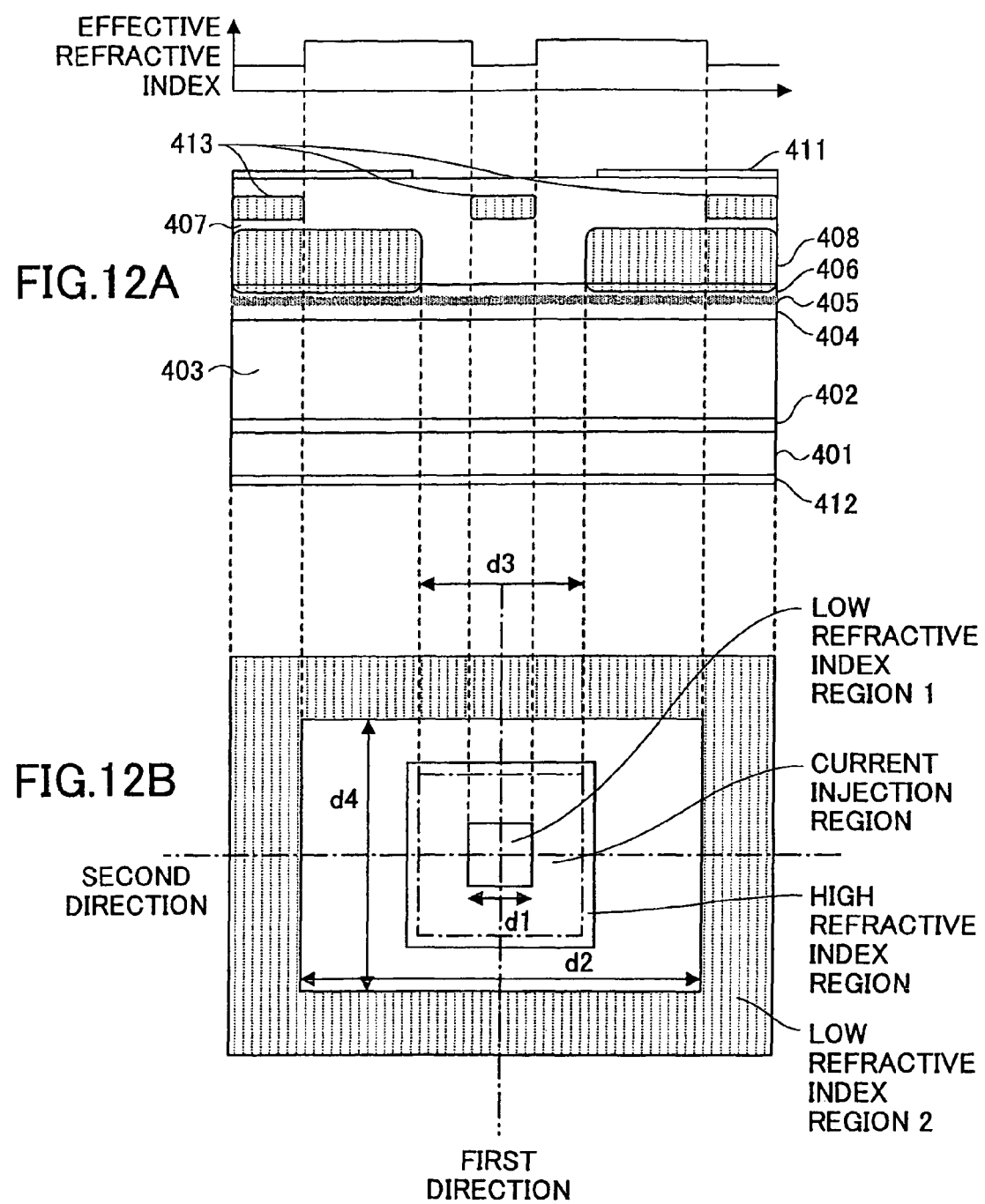

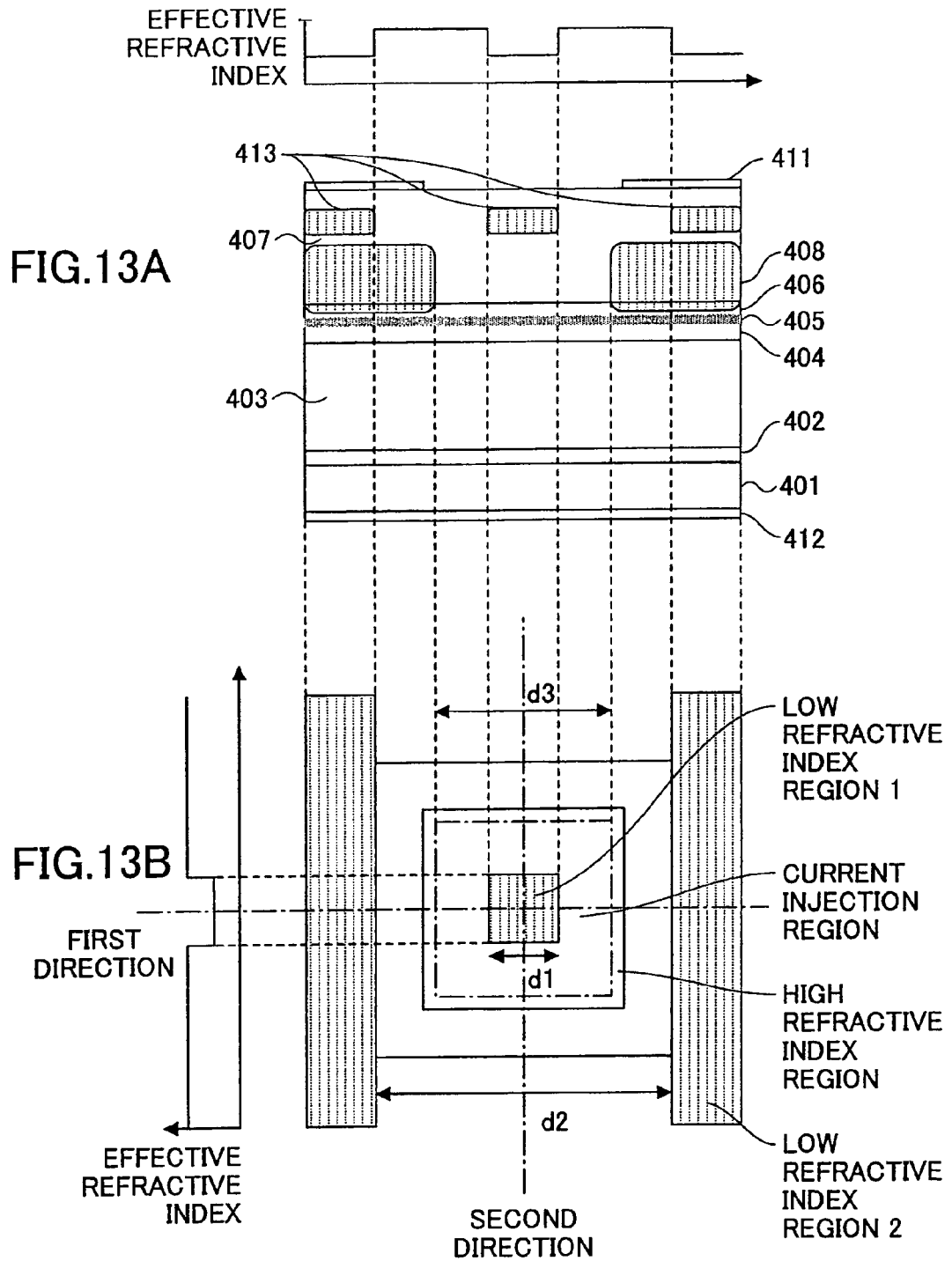

QUARTZ SINGLE MODE FIBER ARRAY

DEVICE 1

DEVICE 2

SURFACE-EMISSION LASER ARRAY MODULE

PHOTODIODE ARRAY MODULE

OPTICAL EXIT PART

DEVICE PART

WIRING

ONE-DIMENSIONAL SURFACE-EMISSION LASER ARRAY

QUARTZ SINGLE MODE FIBER

SILICON SUBSTRATE

MICROLENS ARRAY

SURFACE-EMISSION LASER DIODE AND SURFACE-EMISSION LASER ARRAY, OPTICAL INTERCONNECTION SYSTEM, OPTICAL COMMUNICATION SYSTEM, ELECTROPHOTOGRAPHIC SYSTEM, AND OPTICAL DISK SYSTEM

CROSS-REFERENCE TO RELATED APPLICATIONS

This application is a divisional of U.S. patent application Ser. No. 10/995,284, filed Nov. 24, 2004 now U.S. Pat. No. 7,542,499, the subject matter of which is incorporated in its entirety by reference herein.

BACKGROUND OF THE INVENTION

The present invention relates to surface-emission laser diodes and surface-emission laser arrays, optical interconnection systems, optical communication systems, electrophotographic systems, and optical disk systems.

In recent years, intensive studies are made with regard to surface-emission laser devices (surface-emission laser diodes) that produce a laser beam in the direction perpendicular to the substrate surface. As compared with an edge-emission laser diode, a surface-emission laser diode has a characteristically a small active layer volume, and hence, low threshold current for laser oscillation. Further, a surface-emission laser diode has an advantageous feature of the cavity structure suitable for high-speed modulation and can produce high-quality laser beam having a circular beam cross-section. Thus, a surface-emission laser diode attracts much attention in relation to the optical source of high-speed communication systems such as LAN or in relation to the optical source of electrophotographic systems.

Further, a surface-emission laser diode, emitting a laser beam in the direction perpendicularly to the substrate, can be easily integrated in the form of high-density two-dimensional array, and application of such a surface-emission laser array to the optical source of parallel optical interconnection systems, high-speed and high-resolution electrophotographic systems, and the like, is studied.

Currently, there are two major structures in the surface-emission laser diode according to the construction of the current confinement structure used for confining the injected current, the one being the surface-emission laser diode of selective oxidation type, and the other being the surface-emission laser diode of hydrogen ion implantation type. Any of these structures realizes significant decrease of oscillation threshold current by confining the current injection region to a specific region at the central part of the device.

The surface-emission laser diode of selective oxidation type achieves the current confinement by using an oxide layer of Al formed by selective oxidation of a semiconductor layer containing Al and is capable of achieving optical confinement of transverse mode in addition to the current confinement. Thereby, the laser diode can achieve the advantageous feature of low threshold current and high efficiency of operation.

In the case of the surface-emission laser diode of hydrogen ion implantation type, the current confinement structure is realized by ion implantation of hydrogen ions in the form of high-resistance region. With this, the surface-emission laser diode of hydrogen ion implantation type also achieves low threshold operation, similarly to the case of the laser diode of the selective oxidation type.

In any of these laser diodes, it should be noted that the feature of low-threshold current of laser oscillation is achieved by restricting the region of current injection to a particular area of the device located at a central part of the device structure.

For example, the Non-Patent Reference 1 discloses a surface-emission laser diode having an active layer of InGaAs and oscillating at the wavelength band of 0.98 µm. In this surface-emission laser diode, there is formed a selectively oxidized layer of $Al_{0.98}Ga_{0.02}As$ in the upper Bragg reflector of the $p-Al_{0.9}Ga_{0.1}As/GaAs$ structure formed above the active layer.

Such a surface-emission laser diode is produced by the steps of: etching the upper distributed Bragg reflector, after the crystal growth process thereof, to form a square mesa structure in such a manner that the sidewall surface of the $Al_{0.98}Ga_{0.02}As$ layer to be oxidized is exposed; and forming the selectively oxidized layer by applying a selective oxidizing process to the foregoing $Al_{0.98}Ga_{0.02}As$ layer starting from the mesa sidewall surface toward a mesa central region at the temperature of 425° C. in a water vapor ambient produced by bubbling water heated to 85° C. by a nitrogen gas.

As a result of the foregoing selective oxidation process, there is formed an insulation region of AlOx (oxide of Al) around the mesa structure, and associated with this, there is formed a conductive region at the central part of the mesa structure in the form of a non-oxidized region.

Thus, the selectively oxidized region of a surface-emission laser diode is generally formed by exposing a part of the AlGaAs selectively oxidizing layer to an ambient containing water vapor by an etching process, or the like.

With the surface-emission laser diode of this type, the holes supplied from the surface of the upper distributed Bragg reflector is injected into the active layer with confinement into the non-oxidized conductive region at the central part of the mesa structure. It should be noted that AlOx is an excellent insulator and can effectively restrict the region of hole injection to the active layer to the foregoing central part of the mesa structure. By using such a selectively oxidized structure, it becomes possible to reduce the oscillation threshold current drastically. In the Non-Patent Reference 2, a very low threshold current of 900 µA is achieved in the device having the non-oxidized region of 4.5 µm×8 µm.

Further, because of the fact that AlOx has a low refractive index of about 1.6, which is lower than the refractive index of other semiconductor layers, the surface-emission laser diode of the selective-oxidation type has an advantageous feature in that the optical beam formed as a result of laser oscillation is confined at the central part of the mesa structure as a result of formation of the lateral refractive index profile within the laser cavity structure. Thereby, optical loss caused by diffraction is reduced and the efficiency of the laser diode is improved.

On the other hand, associated with the increased degree of optical confinement, it becomes necessary to decrease diameter of the oxidized confinement region with such a laser diode for suppressing higher transverse mode oscillation. While it depends on the wavelength band, it is known that a single fundamental mode oscillation can be achieved with a surface-emission laser diode having a single oxidized current confinement structure, by reducing the diameter or edge length of the oxidized confinement structure down to 3-4 times as large as the oscillation wavelength. Thus, by using such a selective oxidizing structure, it becomes possible to achieve decrease of laser oscillation threshold and decrease of diffraction loss, in addition to the single fundamental mode control.

In the case of the surface-emission laser diode of the hydrogen ion implantation type, on the other hand, no built-in waveguide structure is provided contrary to the case of the surface-emission laser diode of the selective oxidation type.

In a surface-emission laser diode of the hydrogen ion implantation type, a waveguide structure is inducted by a refractive index change that is caused at the time of operation of the laser diode by the heat flowing through the device (thermal lens effect), and confinement of the transverse mode is achieved by using such a waveguide structure induced by the thermal lens effect.

Because the optical confinement obtained with such a laser diode is generally weak, it is possible with the surface-emission laser diode of the hydrogen ion implantation type, to obtain a single fundamental transverse mode oscillation even in the case the diameter of current confinement is relatively large. In the Non-Patent Reference 3, there is disclosed a surface-emission laser diode of the hydrogen ion implantation type using GaAs for the active layer and operating at the wavelength band of 0.85 μm. With the laser diode of the Non-Patent Reference 3, an oscillation threshold current of 2.5 mA is obtained by using a hole injection region having a diameter of 10 μm.

In many applications of surface-emission laser diode, there exists a request, in addition to the request for low threshold characteristics, in that the laser diode provides a single peak beam shape at high output power state. Thus, control of single transverse mode is a very important object in the surface-emission laser diode. Generally, in surface-emission laser diode, control of the single transverse mode is possible only in the state in which the laser diode is operating at a relatively low current injection level. When the current injection level is increased, there is caused oscillation of higher order transverse mode due to the spatial hole-burning effect of carriers.

More specifically, when the laser diode is operating under the high current injection state, there occurs an increase in the photon density inside the optical cavity, while such an increase of the photon density facilitates increase of stimulated emission in the part where the optical intensity is large. As a result of such an increased stimulated emission, there is caused a localized dip of carrier density (spatial hole-burning phenomenon).

Because the fundamental transverse mode has a large mode amplitude (electric field distribution) at the central part of the mesa structure, there occurs a decrease of carrier density at such a central part of the mesa structure with increase of the injection current, while this decrease of the carrier density at the mesa central part leads to saturation of laser gain for the fundamental transverse mode. On the other hand, at the peripheral part of the mesa structure surrounding the mesa central part, there occurs an increase of carrier density, and with this, a laser oscillation is caused for the higher-order transverse mode having a mode amplitude in the region between the mesa central part and the mesa peripheral part because of increase of laser gain in such a part of the laser diode.

It should be noted that this phenomenon appears particularly conspicuous in the selective-oxidation type surface emission laser diode in which there is caused a strong mode confinement by using the selective oxidized structure. Thereby, the quality of the exiting laser beam is deteriorated seriously.

In the case of the surface-emission laser diode of the hydrogen ion implantation type, there is provided no such built-in optical confinement structure, and because of this, the laser diode shows poor stability for the transverse mode. Thus, the laser diode easily causes higher mode oscillation when the injection current is increased.

In order to suppress the laser oscillation of higher order transverse mode in such a surface-emission laser diode, various proposals have been made so far.

For example, the Non-Patent Reference 4 discloses an approach of suppressing the higher order transverse mode oscillation by forming an antiguiding structure in a part of the cavity structure, by selectively oxidizing a layer of $Al_{0.9}Ga_{0.1}As$ from the crystal growth surface in correspondence to the current injection region at the central part of the mesa structure.

In this example, there is formed an antiguiding structure, in a surface-emission laser diode oscillating at the 0.98 μm wavelength and having a current confinement structure of the diameter of 10-17 μm, the current confinement structure being the one formed by selective oxidation of the AlAs selective oxidizing layer having the thickness of 18.6 nm in a high-temperature water vapor ambient, starting from the mesa etching sidewall surface, by selectively oxidizing a mixed crystal of $Al_{0.9}Ga_{0.1}As$ having a thickness of ½λ, leaving the current injection region at the central part of the mesa structure over the region of 15 μm in diameter. With this, the higher order transverse mode oscillation is effectively suppressed and a single peak radiation pattern is obtained even in the case a drive current twenty times as large as the threshold current is injected.

In the example of the Non-Patent Reference 4, the spatial overlapping of the higher transverse mode and the gain region in the active layer (current injection region) is decreased by providing the antiguiding structure at the central part of the cavity structure. With this, it becomes possible to suppress the laser oscillation at the higher transverse mode.

FIGS. 3A and 3B are diagrams for explaining the effect of the antiguiding structure provided partially in the optical cavity on the electric field distribution of the fundamental mode and the first-order higher mode. Here, it should be noted that FIG. 3A is a diagram showing the mode distribution for the case the anti-guiding structure is not provided, while FIG. 3B shows the mode distribution for the case an antiguiding structure is provided at the central part of the device. In FIGS. 3A and 3B, the upper diagram shows the fundamental transverse mode distribution, while the lower diagram shows the first-order transverse mode distribution. Further, the gain region formed with the current injection is also represented in FIGS. 3A and 3B.

As can be seen from FIG. 3A, it is difficult to spread the mode distribution, in the case of the fundamental transverse mode having a large mode distribution at the central part of the mesa structure, toward the peripheral direction of the mesa structure by the antiguiding structure, while in the case of the higher order transverse mode, the electric field strength is zero at the center of the mesa structure and there appears a large mode distribution at the peripheral part of the mesa structure as shown in FIG. 3B. Thus, it becomes possible with the antiguiding structure to deform and expand the mode distribution profile laterally toward the mesa peripheral direction, and it becomes possible to decrease the mode distribution (electric field strength) at the mesa central part.

Thus, from the reason explained above, the surface-emission laser diode can maintain the fundamental transverse mode operation up to high output state with such an antiguiding structure, which decreases the gain for the higher order transverse modes. Further, with regard to the fundamental transverse mode, it is difficult to modify and expand the mode distribution profile in the lateral direction by the antiguiding structure, although it is also expected that the use of such an antiguiding structure results in somewhat broadening of the electric field distribution at the mesa central part. Thereby, the electric field intensity at the mesa central part is decreased, and it is expected that occurrence of the spatial hole-burning phenomenon is suppressed.

Meanwhile, in the case of a surface-emission laser diode for use as the optical source in the applications other than the optical communication technology, there is a strong demand, in addition to the demand for the circular beam shape suitable for optical coupling with optical fibers, in that the laser diode provides a single fundamental mode oscillation, while this requirement can be met, in the case of the surface-emission laser diode of the selective oxidation type, by setting the diameter of the current confinement structure to be less than about three times as large as the oscillation wavelength. In the case of the single-mode device, on the other hand, increase of device resistance and electrical capacitance associated with the selective oxidation structure imposes a limitation upon the modulation frequency band. Further, spatial hole-burning effect raises the problem that it is difficult to achieve high-power laser oscillation in the single fundamental mode.

In the case of the surface-emission laser diode of the hydrogen ion implantation type, on the other hand, there occurs no problem of parasitic capacitance as in the case of the current confinement structure formed by the selective oxidation process. In the surface-emission laser diode of the hydrogen ion implantation type, there exists no built-in waveguide structure, and confinement of transverse mode is achieved by the small refractive index change caused by heat generation, which in turn is caused primarily by the current injection. Thus, in the case of the surface-emission laser diode of the hydrogen ion implantation type, the degree of lateral confinement in the device is inherently weak, while this leads to the disadvantageous feature of unstable transverse mode control associated with the weak lateral confinement, although there is obtained an advantageous feature that it is possible to achieve single fundamental transverse mode oscillation for the case of relatively large confinement diameter.

Non-Patent Reference 5 discloses a surface-emission laser diode capable of maintaining the single fundamental transverse mode oscillation under the state of laser oscillation with high output power, called ARROW (antiresonant reflecting optical waveguides) structure or S-ARROW (Simplified ARROW) structure.

In Non-Patent Reference 5, it should be noted that the object of providing a surface-emission laser diode structure capable of maintaining the single fundamental transverse mode oscillation under the state of high laser oscillation power is attempted by way of using an antiguiding structure. Here, it should be noted that an antiguiding structure is a waveguide structure in which there is provided a low refractive index core part in correspondence to the oscillation region of the laser diode in such a manner that the low refractive index core part is sandwiched by regions of relatively large refractive index in the direction of the laser cavity. With such an antiguiding structure, leakage of higher-order transverse mode is facilitated in the direction perpendicular to the laser cavity direction, and with this, it becomes possible to maintain the single fundamental transverse mode oscillation up to the state of high output power.

Further, Non-Patent Reference 6 teaches an antiguiding structure in which there is provided a periodic structure formed of a low refractive index region and a high refractive index region adjacent to the oscillation region of the device constituting the low refractive index core such that there is formed a cavity structure in which the low refractive index core forms a half-wavelength resonator.

In this Non-Patent Reference 6, leakage of the transverse mode pertinent to the antiguiding structure is reduced, and with this, a single fundamental transverse mode oscillation is achieved with the power exceeding 7 mW.

Meanwhile, in the application of the surface-emission laser diode to the long-range and super-fast optical communications, there arises a problem, in addition to the single fundamental transverse mode oscillation, of noise caused by the change of reflectivity of the optical components used therein depending on the polarization direction of the laser beam. Thus, there is a demand that the laser diode produces the laser beam with polarization controlled to a specific polarization direction.

Conventionally, there has been disclosed a method of controlling the polarization direction of laser beam by using a strained film as disclosed in the Patent Reference 5, in which anisotropic stress is applied to the laser diode or anisotropy is caused in the gain of the active layer. Further, the Patent Reference 6 discloses a method of forming the surface-emission laser diode on an inclined substrate. In any of these methods, there is induced an anisotropy in the gain caused in the active layer, and it becomes possible to control the polarization direction in the direction of large optical gain.

(Non-Patent Reference 1)
Applied Physics Letters vol. 66, No. 25 pp. 3413-3415, 1995 and Electronics Letters No. 24, Vol. 30, pp. 2043-2044, 1994
(Non-Patent Reference 2)
Electronics Letters No. 24, Vol. 30, pp. 2043-2044, 1994
(Non-Patent Reference 3)
Electronics Letters No. 5, Vol. 27, 1991, pp. 457-458
(Non-Patent Reference 4)
IEEE Photonics Technology Letters Vol. 10, No. 1, 1998, pp. 12-14
(Non-Patent Reference 5)
Applied Physics Letters vol. 76, No. 13, 2000, pp. 1659; IEEE Journal of Quantum Electronics vol. 38, No. 12, 2002, pp. 1599.
(Non-Patent Reference 6)
IEEE Journal of Quantum Electronics, vol. 38, No. 12, pp. 1599.
(Patent Reference 1)
Japanese Laid-Open Patent Application 11-54838
(Patent Reference 2)
Japanese Laid-Open Patent Application 20001-60739

In the surface-emission laser diode according to the Non-Patent Reference 4 cited before, it should be noted that the antiguiding structure of AlOx is provided inside the cavity. Thus, in order to form such an antiguiding structure, there is conducted a selective oxidation process of an AlGaAs layer having a large Al content in a high-temperature water vapor environment. This process will be referred to hereinafter as water vapor selective oxidation.

Now, in the case of forming such an antiguiding structure, it is necessary to provide the AlOx layer constituting the antiguiding structure at the central part of the cavity structure where the fundamental mode amplitude is large. This means that it is not possible to apply a conventional method of oxidizing the selectively oxidizing layer starting from the sidewall surface of the mesa structure as used in the conventional surface-emission laser diode, and the selective oxidation has to be conducted from the device surface.

Further, in order to secure sufficient effect of the antiguiding structure for the higher mode oscillation, it is necessary to provide the anti-guiding structure in correspondence to the part of the cavity where the electric field strength is relatively large. This means that the antiguiding structure has to be formed inside the upper distributed Bragg reflector.

However, epitaxial growth of a semiconductor layer is not possible on an AlOx layer, and thus, it is necessary with such a surface-emission laser diode to provide a dielectric distributed Bragg reflector on such an AlOx layer to form a laser structure. However, such a laser structure has a drawback in that it requires not only an additional process of evaporation deposition of the dielectric layers but also an etching process for removing a part of the distributed Bragg reflector so as to enable injection of drive current via a top electrode.

Further, because there is a need of providing the selective oxidizing layer used for forming the antiguiding structure always at the surface part of the device structure with the laser diode of such a structure in anticipation of the selective oxidation processing conducted in the high temperature ambient containing water vapor, there is imposed a restriction on the degree of freedom of designing the device.

Further, because a dielectric multilayer mirror is provided in the upper part of the laser diode with the surface-emission laser diode of this type, the distance between the p-side electrode and the selective oxidation layer is reduced, and thus, the holes are injected into the confinement region in the lateral direction from the peripheral part of the AlOx layer constituting the antiguiding structure. Thereby, the device resistance of the laser diode is inevitably increased.

Further, as noted before, it is necessary that the polarization direction of the output laser beam is controlled to a specific direction in the case the laser diode is to be used for the optical fiber communications or for the optical source of electro-photographic systems.

In the application of the surface-emission laser diode to high-speed optical fiber communications, there arises a problem of noise caused by the polarization-dependent difference of reflection or transmission characteristics of the optical components constituting the system. Further, in the application of optical writing, too, there arises a problem with the polarization dependence of the optical systems used therein that an optical beam spot is distorted on the surface of the photosensitive body.

Because the foregoing reference does not describe the control of polarization direction, it is difficult to use the teaching therein directly for the laser diode device used for actual applications.

With regard to the attempt of controlling the polarization direction, it is proposed to form the laser diode on an inclined substrate or apply an anisotropic stress to the device as noted before. However, the former approach has a drawback in that the range of crystal growth condition used at the time of the crystal growth process of the laser diode structure is limited. Further, in the latter approach, controllability of polarization depends heavily on the controllability and reproducibility of processing condition.

Further, with the method of forming a surface-emission laser diode on an inclined substrate as described in the foregoing Patent Reference 2, there is a problem that adjustment and control of crystal growth condition is difficult ion such an inclined substrate as compared with the substrate having the (100) surface orientation. Further, while it is possible to control the polarization direction of the laser oscillation beam in a particular direction along a specific crystal orientation with such a method, it is difficult to control the polarization direction in an arbitrary direction for individual devices.

Further, with the method of applying an anisotropic strain to the active layer by using the thin film accumulating therein a stress as set forth in Patent Reference 1, there arises a problem that the control of polarization becomes unstable because of the reproducibility and controllability of the processing condition.

SUMMARY OF THE INVENTION

The present invention provides a surface-emission laser diode capable of increasing the degree of freedom of design, capable of suppressing higher order transverse mode oscillation more effectively, maintaining single fundamental transverse mode operation even under the operational state of high optical output, and capable of controlling the polarization direction of the laser beam in a specific direction. Further, the present invention provides a surface-emission laser array, an optical interconnection system, an optical communication system, an electro-photographic system and an optical disk system that uses such a surface-emission laser diode.

In a first aspect of the present invention, there is provided a surface-emission laser diode, comprising:
an active layer;
a pair of cavity spacer layers formed at both sides of said active layer;
a current confinement structure defining a current injection region into said active layer; and
a pair of distributed Bragg reflectors opposing with each other across a structure formed of said active layer and said cavity spacer layers,
said current confinement structure being formed by a selective oxidation process of a semiconductor layer,
said pair of distributed Bragg reflectors being formed of semiconductor materials,
wherein there is provided a region containing an oxide of Al and having a relatively low refractive index as compared with a surrounding region in any of said semiconductor distributed Bragg reflector or said cavity spacer layer in correspondence to a part spatially overlapping with said current injection region in a laser cavity direction.

In a second aspect of the present invention, there is provided a surface-emission laser diode, comprising:
an active layer;
a pair of cavity spacer layers formed at both sides of said active layer;
a current confinement structure defining a current injection region into said active layer; and
a pair of distributed Bragg reflectors opposing with each other across a structure formed of said active layer and said pair of cavity spacer layers,
said current confinement structure comprising a high resistance region formed by an ion implantation process,
said pair of distributed Bragg reflectors being formed of semiconductor materials,
wherein there is provided a region containing an oxide of Al and having a relatively low refractive index than a surrounding region in any of said semiconductor distributed Bragg reflector or said cavity spacer layer in correspondence to a part spatially overlapping with said current injection region in a laser cavity direction.

In a third aspect of the present invention, there is provided a surface-emission laser diode, comprising:
an active layer;
a current confinement structure defining a current injection region into said active layer; and
a pair of distributed Bragg reflectors opposing with each other across said active layer;
said current confinement structure being formed of a selective oxidation process of a semiconductor material,
said surface-emission laser diode comprising an AlGaAs mixed crystal layer,
a part of said AlGaAs mixed crystal layer having spatial overlapping with said current injection region in a laser cavity direction, said part of said AlGaAs mixed crystal being formed by selective ion implantation of molecules containing oxygen and a thermal annealing process following said selective ion implantation process, said part of said AlGaAs mixed crystal having a relatively low refractive index as compared with a surrounding region wherein ion implantation of molecules containing oxygen is not made and located on an identical plane of said part, said plane being perpendicular to said laser cavity direction.

In a fourth aspect of the present invention, there is provided a surface-emission laser diode, comprising:

an active layer;

a current confinement structure defining a current injection region into said active layer; and a pair of distributed Bragg reflectors opposing with each other across said active layer, said current confinement structure comprising a high resistance region formed by an ion implantation process, said surface-emission laser diode comprising an AlGaAs mixed crystal layer, a part of said AlGaAs mixed crystal layer having a spatial overlapping with said current injection region in a laser cavity direction, said part of said AlGaAs mixed crystal spatially overlapping with said current injection region being processed by an ion implantation process of molecules containing oxygen and a thermal annealing process following said ion implantation process and having a relatively low refractive index as compared with a surrounding region not injected with molecules containing oxygen and located on an identical plane of said part, said plane being perpendicular to said laser cavity direction.

In a fifth aspect of the present invention, there is provided a surface-emission laser diode according to any of the first through fourth aspects, wherein there is provided any of a GaAs layer or a GaInP mixed crystal layer adjacent with said AlGaAs mixed crystal layer constituting said region of relatively low refractive index with respect to said surrounding region not injected with said molecules containing oxygen and located on said identical plane of said part where said ion implantation of said molecules has been made.

In a sixth aspect of the present invention, there is provided a surface emission laser diode according to any of the first through fifth aspects, wherein said AlGaAs mixed crystal layer, constituting said region of relatively low refractive index with respect to said surrounding region not made with ion implantation of molecules containing oxygen and located on said identical plane perpendicular to said laser cavity direction, is provided at a location corresponding to an antinode of a standing wave of laser oscillation occurring in said cavity structure, said AlGaAs mixed crystal layer being doped to a higher concentration level as compared with other AlGaAs mixed crystal layers constituting said surface-emission laser diode.

In a seventh aspect of the present invention, there is provided a surface-emission laser diode according to any of said first through sixth aspects, wherein said region of relatively low refractive index is provided in plural numbers.

In an eighth aspect of the present invention, there is provided a surface-emission laser diode according to any of the first through seventh aspects, wherein said region of relatively low refractive index is provided inside an n-type distributed Bragg reflector constituting one of said pair of distributed Bragg reflectors.

In a ninth aspect of the present invention, there is provided a surface-emission laser diode according to any of the first through eighth aspects, wherein there is further provided a region of relatively high refractive index around said region of relatively low refractive index provided in spatial overlapping with said laser cavity region in said laser cavity direction, and wherein there is further provided a cladding region of low refractive index with respect to said high refractive region such that said cladding region is located around said region of high refractive index.

In a tenth aspect of the present invention, there is provided a surface-emission laser diode according to the ninth aspect, wherein there is provided an anisotropy in a width of said high refractive region surrounded by said cladding region.

In an eleventh aspect of the present invention, there is provided a surface-emission laser diode according to the ninth aspect, wherein said cladding region is provided in a pair in a direction perpendicular to said laser cavity direction across a laser cavity region.

In a twelfth aspect of the present invention, there is provided a surface-emission laser diode according to any of the first through eleventh aspects, wherein said region of relatively low refractive index has an anisotropic shape.

In a thirteenth aspect of the present invention, there is provided a surface-emission laser diode according to any of the first through twelfth aspects, wherein said active layer comprises a group III-V compound semiconductor material, said group III element comprises at least one of Ga and In, and wherein said group V element comprises one or more of As, N, Sb and P.

In a fourteenth aspect of the present invention, there is provided a surface-emission laser array comprising a plurality of surface-emission laser diodes each according to any of first through thirteenth aspects, said plurality of surface-emission laser diodes being arranged to form an array.

In a fifteenth aspect of the present invention, there is provided an optical interconnection system having an optical source comprising a surface-emission laser diode according to any of the first through thirteenth aspect of the present invention or an surface-emission laser array according to a fourteenth aspect of the present invention.

In a sixteenth aspect of the present invention, there is provided an optical communication system that uses the surface-emission laser diode according to any of the first through thirteenth aspects of the present invention or the surface-emission laser array according to the fourteenth aspect of the present invention.

In a seventeenth aspect of the present invention, there is provided an electro-photographic system using any of the surface-emission laser diode according to any of the first through thirteenth aspect of the present invention or the surface-emission laser array according to the fourteenth aspect of the present invention.

In an eighteenth aspect of the present invention, there is provided an optical disk system that uses the surface-emission laser diode according to any of the first through thirteenth aspect of the present invention or the surface-emission laser array according to the fourteenth aspect of the present invention as the reading/writing optical source.

Another object of the preset invention is to provide a surface-emission laser diode capable of controlling the polarization direction in an arbitrarily determined desired direction while producing high out put power in single fundamental transverse mode laser oscillation and further capable of conducting high speed modulation.

In a nineteenth aspect of the present invention, there is provided a surface-emission laser diode constructed on a substrate having a substrate surface, comprising:

an active layer parallel to said substrate surface;

a pair of cavity spacer layers provided so as to sandwich said active layer;

a pair of distributed Bragg reflectors provided across said active layer and said cavity spacer layers so as to sandwich said active layer and said cavity spacer layers therebetween;

a high resistance region defining a current injection region for injecting a current into said active layer, laser oscillation being caused in a laser cavity region between said pair of distributed Bragg reflectors acting as cavity mirrors in a direction perpendicular to said substrate surface in correspondence to said current injection region, a refractive index structure provided in a plane parallel to said substrate surface, said refractive index structure comprising: a low refractive index core including said laser cavity region at a central part thereof; and a periodic structure provided around said low refractive index core, said periodic structure comprising a low refractive region surrounding said low refractive index core and a high refractive index region surrounding said low refractive index region, said low refractive index region and said high refractive index region being repeated alternately in said plane parallel to said substrate, wherein any of a width of said low refractive index core or a shape of said periodic structure is changed between a specific direction parallel to said substrate surface and other directions parallel to said substrate surface different from said specific direction.

In a twentieth aspect of the present invention, there is provided a surface-emission laser diode according to the nineteenth aspect of the present invention, wherein said low refractive index core has a width different between two directions parallel to said substrate surface and crossing perpendicularly with each other.

In a twenty first aspect of the present invention, there is provided a surface-emission laser diode according to the nineteenth aspect of the present invention, wherein said periodic structure is different between two directions parallel to said substrate surface and crossing perpendicularly with each other.

In a twenty second aspects of the present invention, there is provided a surface-emission layer diode according to any of the twentieth or twenty first aspects of the present invention, wherein a reflection wavelength band of said periodic structure is set, in one of said two directions crossing perpendicularly with each other, to be longer than a wavelength of a fundamental transverse mode in said same direction and projected upon said substrate surface.

In a twenty third aspects of the present invention, there is provided a surface-emission laser diode constructed on a substrate having a substrate surface, comprising:

an active layer parallel to said substrate surface;

a pair of cavity spacer layers provided so as to sandwich said active layer;

a pair of distributed Bragg reflectors provided across said active layer and said cavity spacer layers so as to sandwich said active layer and said cavity spacer layers therebetween;

a high resistance region defining a current injection region for injecting a current into said active layer, laser oscillation being caused in a laser cavity region between said pair of distributed Bragg reflectors acting as cavity mirrors in a direction perpendicular to said substrate surface in correspondence to said current injection region, a refractive index structure provided in a plane parallel to said substrate surface, said refractive index structure comprising: a low refractive index core including said laser cavity region at a central part thereof; and a periodic structure provided around said low refractive index core, said periodic structure comprising a low refractive region surrounding said low refractive index core and a high refractive index region surrounding said low refractive index region, said low refractive index region and said high refractive index region being repeated alternately in said plane parallel to said substrate, wherein said periodic structure is provided partially in said plane parallel to said substrate surface in a specific direction.

In a twenty fourth aspect of the present invention, there is provided a surface-emission laser diode according to any of the nineteenth through twenty third aspects of the present invention, wherein said active layer is formed of a III-V semiconductor material, said active layer containing any or both of Ga and In as a group III element, said active layer containing any or all of As, N, Sb and P as a group V element.

In a twenty fifth aspect of the present invention, there is provided a surface-emission laser array formed of a surface-emission laser diode according to any of the nineteenth through twenty fourth aspects of the present invention.

In a twenty sixth aspect of the present invention, there is provided an optical interconnection system that uses the surface-emission laser diode according to any of the nineteenth through twenty fourth aspects of the present invention or the surface-emission laser array according to the twenty fifth aspect of the present invention.

In a twenty seventh aspect of the present invention, there is provided an optical communication system that uses the surface-emission laser diode according to any of the nineteenth through twenty fourth aspects of the present invention or the surface-emission laser array according to the twenty fifth aspect of the present invention.

In a twenty eighth aspect of the present invention, there is provided an electrophotographic system that uses the surface-emission laser diode of any of the nineteenth through twenty fourth aspects of the present invention or the surface-emission laser array according to the twenty fifth aspect of the present invention.

In a twenty ninth aspect of the present invention, there is provided an optical disk system that uses a surface emission laser diode according to any of the nineteenth through twenty fourth aspects of the present invention or the surface-emission layer array according to the twenty ninth aspect of the present invention.

According to the first aspect of the present invention, in which there is provided a surface-emission laser diode, comprising: an active layer; a pair of cavity spacer layers formed at both sides of said active layer; a current confinement structure defining a current injection region into said active layer; and a pair of distributed Bragg reflectors opposing with each other across a structure formed of said active layer and said cavity spacer layers, said current confinement structure being formed by a selective oxidation process of a semiconductor layer, said pair of distributed Bragg reflectors being formed of semiconductor materials, wherein there is provided a region containing an oxide of Al and having a relatively low refractive index as compared with a surrounding region in any of said semiconductor distributed Bragg reflector or said cavity spacer layer in correspondence to a part spatially overlapping with said current injection region in a laser cavity direction, it becomes possible to provide a selectively-oxidized surface-emission laser diode having an antiguiding structure characterized by low manufacturing cost, high degree of freedom of design and low device resistance.

Thus, according to the first aspect of the present invention, the degree of freedom of design is increased in the selectively oxidized surface-emission laser diode having the anti-guiding structure formed of an oxide of Al, and it becomes possible to provide a device in which oscillation of higher transverse mode is suppressed more effectively and is capable of providing high output operation in the single fundamental transverse mode According to the second aspect of the present invention, in which there is provided a surface-emission laser diode, comprising: an active layer; a pair of cavity spacer layers formed at both sides of said active layer; a current confinement structure defining a current injection region into said active layer; and a pair of distributed Bragg reflectors opposing with each other across a structure formed of said active layer and said pair of cavity spacer layers, said current confinement structure comprising a high resistance region formed by an ion implantation process, said pair of distributed Bragg reflectors being formed of semiconductor materials, wherein there is provided a region containing an oxide of Al and having a relatively low refractive index than a surrounding region in any of said semiconductor distributed Bragg reflector or said cavity spacer layer in correspondence to a part spatially overlapping with said current injection region in a laser cavity direction. it becomes possible to obtain a hydrogen ion implantation type surface-emission laser diode having an antiguiding structure of an Al oxide in which the degree of freedom of design is increased and device resistance is decreased.

Thus, according to the second aspect of the present invention, the degree of freedom of design is increased in the hydrogen-ion implantation type surface-emission laser diode having the anti-guiding structure formed of an oxide of Al, and it becomes possible to provide a device in which oscillation of higher transverse mode is suppressed more effectively and is capable of providing high output operation in the single fundamental transverse mode Further, according to the third aspect of the present invention, the degree of freedom of design is increased and the oscillation of higher transverse mode is suppressed more effectively, and it becomes possible to provide a surface-emission laser diode capable of providing high output operation in the single fundamental transverse mode.

In the prior art device according to Non-Patent Reference 4, it should be noted that there is provided a low refractive index region containing an oxide of Al as an antiguiding structure in the vicinity of the laser oscillation region. In order to obtain such a structure, the reference uses the process of selectively oxidizing, after the step of forming the cavity spacer layer and a part of the distributed Bragg reflector, the semiconductor layer containing Al at the surface in an ambient containing water vapor, such that there is formed a low refractive index region of oxide of Al in correspondence to the part spatially overlapping with the laser oscillation region.

Thus, there is formed a region of oxide on the surface of the partly formed device structure, it is difficult to continue crystal growth of semiconductor material with such a conventional process, and because of this, the prior art device has a construction that uses a dielectric distributed Bragg reflector for the upper reflector.

However, the use of such a distributed Bragg reflector imposes a constraint on the current injection path and there arises a tendency that the device resistance is increased as a result of such a constraint. Further, such a process requires an evaporation deposition apparatus for dielectric films, in addition to the growth apparatus of the semiconductor films. Thereby, it becomes necessary to adjust the deposition rate equal in both deposition apparatuses in order to achieve precise film thickness control at the time of formation of the distributed Bragg reflector. Thereby, the cost for production of the device is increased.

Such a problem of conventional art can be resolved by forming an oxide region inside the semiconductor structure without causing oxidation at the outermost surface of the device structure. Such formation of the oxide region can be achieved for example by implantation of oxygen ions from the device surface by an ion implantation process. After the implantation of the oxygen ions, a thermal annealing process is conducted, and with this, only the part of the device structure where the oxygen ions have been injected is selectively oxidized.

Thus, according to the third aspect of the present invention, it becomes possible to form the low refractive index region necessary for formation of the antiguiding structure by conducting ion implantation of oxygen ions from the crystal growth surface, followed by a thermal annealing process. Thereby, the low refractive index layer is formed selectively in correspondence to the region where the implantation of the oxygen ions has been made.

It should be noted that Japanese Laid-Open Patent Application 9-27650 and Japanese Laid-Open Patent Application 2002-289967 describe that oxidation of an AlGaAs mixed crystal is possible by an ion implantation process of oxygen ions or molecules containing oxygen, followed by a thermal annealing process. Thereby, it should be noted that an AlGaAs mixed crystal is oxidized with high rate when the Al content thereof is large. On the other hand, there occurs little oxidation in a GaAs layer.

Thus, the foregoing prior art references merely discloses the technology of building a waveguide structure inside an optical cavity by oxidizing the AlGaAs region outside the cavity region upon completion of the crystal growth process. Associated therewith, the prior art references achieves oxidation of the entire epitaxial layers from the device surface down to the substrate. There is no reference in these prior art references about formation of the antiguiding structure or regrowth of semiconductor layers resumed after the crystal growth process.

With the foregoing oxidation process of AlGaAs layer by implantation of oxygen ions, it is possible to selectively cause oxidation in a specific AlGaAs layer in an epitaxial structure without exposing the layer to be oxidized to the high temperature ambient containing water vapor, contrary to the case of the conventional device, by choosing the ion implantation depth and ion implantation area. Thus, there is no need of exposing the AlGaAs layer at the device surface and apply an oxidation process. Further, there is formed no AlOx layer at the device surface. Thus, it is possible to resume the crystal growth of the device part by merely recovering the defects caused by the ion implantation process by conducting a thermal annealing process. Thereby, it becomes possible to form an antiguiding structure in a desired region inside the device structure easily, and the degree of freedom of design of the laser diode is improved significantly.

Because it is merely required that the oxidation structure constituting the antiguiding structure at the mesa central part has a relatively low refractive index as compared with the surrounding part, there is no need that the AlGaAs mixed crystal is oxidized completely. In other words, with the present invention, it is possible to adjust the dose of the oxygen ions such that the desired refractive change is achieved. Thus, with the present invention, the degree of freedom of design of the surface-emission laser diode having the antiguiding structure of low refractive index is increased significantly.

Thus, according to the third aspect of the present invention, it becomes possible to form the antiguiding structure, in a surface-emission laser diode having a current confinement structure formed by a selective oxidation process, at a desired region inside the device structure by conducting the selective oxidation of the AlGaAs mixed crystal in the form of an ion implantation process of molecules containing oxygen, followed by a thermal annealing process. Thereby, the degree of freedom of design of the device is increased, and it becomes possible to obtain a device operable at high output power state in the single fundamental transverse mode while suppressing the higher order transverse mode oscillation more efficiently.

According to the fourth aspect of the present invention, in which there is provided a surface-emission laser diode, comprising: an active layer; a current confinement structure defining a current injection region into said active layer; and a pair of distributed Bragg reflectors opposing with each other across said active layer, said current confinement structure comprising a high resistance region formed by an ion implantation process, said surface-emission laser diode comprising an AlGaAs mixed crystal layer, a part of said AlGaAs mixed crystal layer having a spatial overlapping with said current injection region in a laser cavity direction, said part of said AlGaAs mixed crystal spatially overlapping with said current injection region being processed by an ion implantation process of molecules containing oxygen and a thermal annealing process following said ion implantation process and having a relatively low refractive index as compared with a surrounding region not injected with molecules containing oxygen and located on an identical plane of said part, said plane being perpendicular to said laser cavity direction, the degree of freedom of design of the device is increased, and a surface-emission laser diode capable of providing a high output power operation in the single fundamental transverse mode is obtained, while suppressing higher-order transverse mode oscillation more effectively.

Thus, with the hydrogen ion implantation type surface-emission laser diode of the fourth aspect of the present invention that achieves the current confinement by forming a high resistance region by ion implantation of hydrogen ions, it is also possible to form an antiguiding structure at an arbitrary region inside the device structure similarly to the case of the device of the third aspect of the present invention, and the degree of freedom of design of the laser diode is increased.

Because a hydrogen-ion implantation type surface-emission laser diode lacks a built-in waveguide structure, it is possible with such a laser diode to change the mode distribution easily by causing a small change of the refractive index. Thus, in the case such an antiguiding structure is formed in the optical cavity, it becomes possible with the surface-emission laser diode of the fourth aspect of the present invention to move the part of the higher-order transverse mode where the mode amplitude is large to the region outside the current injection region (gain region). Thereby, it becomes possible to suppress the laser oscillation at the higher transverse mode more effectively.

Because lateral optical confinement is weak in a surface-emission laser diode of hydrogen ion implantation type, the laser diode of this type has an advantageous feature of causing a single fundamental transverse mode oscillation even when the current confinement diameter is large. On the other hand, the laser diode has a disadvantageous feature, because of the lack of the built-in waveguide structure, that the transverse mode is unstable and there occurs higher mode oscillation easily when the level of drive current injection is increased.

By forming a slight antiguiding structure partially as set forth in the surface-emission laser diode of the fourth aspect of the present invention, it is now easy to move the part of the higher transverse mode where the mode amplitude is large away from the gain region.

Further, because the laser diode of the fourth aspect of the present invention is the hydrogen ion implantation type surface emission laser diode, it becomes possible with the fourth aspect of the present invention to increase the current confinement diameter as compared with the surface-emission laser diode of the oxide-confinement type. Thus, the laser diode of the fourth embodiment has and advantageous feature of realizing high output operation easily.

In view of high susceptibility of mode distribution on the variation of the refractive index in such a hydrogen ion implantation type surface-emission laser diode that lacks the built-in waveguide structure, it is preferable that the antiguiding structure is provided in the laser diode according to the fourth aspect of the present invention at a location away from the active region where there is caused large optical intensity for reducing the effect on the fundamental transverse mode. Further, in the case the antiguiding structure is provided by way of oxygen ion implantation and thermal annealing processing, it is possible to suppress the magnitude of refractive index change by adjusting the amount of the injected oxygen ions.

Thus, with the hydrogen ion implantation type surface-emission laser diode of the fourth aspect of the present invention, the laser oscillation at higher-order transverse mode is suppressed effectively and high output power is obtained in the single fundamental transverse mode oscillation.

According to the fifth aspect of the present invention, in which there is provided a surface-emission laser diode configured according to any of the first through fourth aspects of the present invention, wherein there is provided any of a GaAs layer or a GaInP mixed crystal layer adjacent with said AlGaAs mixed crystal layer constituting said region of relatively low refractive index with respect to said surrounding region not injected with said molecules containing oxygen and located on said identical plane of said part where said ion implantation of said molecules has been made, it becomes possible to limit the oxidized region, and it becomes possible to adjust the phase condition more precisely.

With the technology of ion implantation, injected ions generally distribute with a continuous depth profile having a peak corresponding to the acceleration voltage used for the ion implantation process.

For example, when the acceleration voltage is low and the peak depth of ion implantation is shallow, the injected ions distribute with a sharp depth profile. Thereby, it is easy to oxidize an AlGaAs mixed crystal layer of desired depth selectively. When the ion implantation is to be conducted to a depth larger than a certain depth, the depth profile of the injected ions is broadened, and oxidation is induced also in the AlGaAs layers adjacent to the AlGaAs layer to be oxidized. Thereby, there is caused a problem that the refractive index is changed unwontedly. In a distributed Bragg reflector, it is preferable that the AlGaAs layer in the antiguiding structure has a thickness satisfying the phase condition of multiple reflection of a Bragg reflector after it is oxidized, while such unpredicted change of refractive index causes a decrease in the reflectivity of the Bragg reflector.

On the other hand, by providing a GaInP mixed crystal layer or a GaAs layer or a GaInP/GaAs distributed Bragg reflector (semiconductor structure) adjacent to the Bragg reflector including the AlGaAs layer to be selectively oxidized, the extent of the oxide region is restricted, and it becomes possible to adjust the phase condition more precisely. Here, it should be noted that GaInP can be grown continuously to a GaAs substrate with lattice matching therewith. Because GaInP does not contain Al as a constituent element, there is caused no substantial progress of oxidation even when the oxygen ion implantation has been made. Thereby, it becomes possible to oxidize a specific AlGaAs layer selectively even in the case there is a depth distribution in the profile of the injected ions. By selectively oxidizing a specific AlGaAs layer of a desired position, it becomes possible to control the reflection wavelength (reflection wavelength to the fundamental transverse mode) of the distributed Bragg reflector at the mesa central part, and a laser diode having excellent device characteristics such as oscillation threshold characteristics is obtained.

According to the sixth aspect of the present invention, in which there is provided a surface emission laser diode configured according to any of the first through fifth aspects of the present invention, wherein said AlGaAs mixed crystal layer, constituting said region of relatively low refractive index with respect to said surrounding region not made with ion implantation of molecules containing oxygen and located on said identical plane perpendicular to said laser cavity direction, is provided at a location corresponding to an anti-node of a standing wave of laser oscillation occurring in said cavity structure, said AlGaAs mixed crystal layer being doped to a higher concentration level as compared with other AlGaAs mixed crystal layers constituting said surface-emission laser diode, occurrence of higher transverse mode oscillation is suppressed more effectively, and a device capable of operating at high output power in the single fundamental transverse mode is obtained.

It should be noted that a semiconductor material doped to a high concentration level shows conspicuous optical absorption by the mechanism of free carrier absorption, and the like. In addition to this, a p-type semiconductor material has a property that the optical absorption of long wavelength band is large because of the intra-valence band absorption. Thus, it is possible to increase the free carrier absorption or the absorption loss by intra-valence band absorption in the AlGaAs layer that forms the low refractive index layer upon application of the selective oxidation processing by the oxygen ion implantation and subsequent thermal annealing process, when the AlGaAs layer is doped to high concentration level at the time of crystal growth thereof as compared with the surrounding AlGaAs layers. Thereby, it should be noted that, because of the formation of the insulating material of AlOx at the part where the oxygen ion implantation has been made after the foregoing thermal annealing process, such a part undergoes a change to a transparent state with the formation of the AlOx insulating material. Thereby, the absorption loss for the fundamental transverse mode, which has a large mode amplitude at the mesa central part (ion injected region), is vanished in correspondence to the mesa central part, while there is caused a strong absorption for the higher-order transverse mode having a large mode amplitude in the region between the central part and the peripheral part of the mesa structure. Thereby, it becomes possible to effectively suppress the laser oscillation with the higher-order transverse mode.

In a distributed Bragg reflector, there is formed a standing wave with such a distribution that a node and an anti-node are repeated alternately in each optical thickness of ¼λ. Thus, in the case of an nλ-cavity, the interface transiting from the AlGaAs layer (low refractive index layer) to the GaAs layer (high refractive index layer) as viewed from the cavity corresponds to the node of the electric field while the interface transiting from the GaAs layer to the AlGaAs layer corresponds to the anti-node of the electric field.

By providing a highly doped AlGaAs layer in correspondence to the anti-node of the standing wave and by selectively oxidizing the part of the AlGaAs layer corresponding to the center of the oscillation region by the oxygen ion implantation process and the thermal annealing process, absorption of the higher-order transverse mode, which has a large electric field strength at the part of the anti-node, is increased and it becomes possible to obtain a larger effect of suppressing the higher-order transverse mode.

According to the seventh aspect of the present invention, in which there is provided a surface-emission laser diode configured according to any of said first through sixth aspects of the present invention, wherein said region of relatively low refractive index is provided in plural numbers, it becomes possible to obtain a surface-emission laser diode in which the degree of freedom of design is improved and is capable of operating more efficiently at high output power while maintaining the single fundamental transverse mode.

Thus, with the seventh aspect of the present invention, the adjustment of antiguiding function is achieved easily by providing plural antiguiding structures of a region of relatively low refractive index with the surrounding regions, and the degree of freedom of design is increased. Further, by providing plural antiguiding structures, a large antiguiding function is attained, and the higher-order transverse mode is suppressed more effectively.

Further, according to the eight aspect of the present invention, in which there is provided a surface-emission laser diode according to any of the first through seventh aspects, wherein said region of relatively low refractive index is provided inside an n-type distributed Bragg reflector constituting one of said pair of distributed Bragg reflectors, it becomes possible to obtain a device having a reduced device resistance and capable of operating with high output power while maintaining a single fundamental transverse mode operation.

It should be noted that the carrier mobility is one order smaller in a p-type semiconductor material as compared with an n-type semiconductor material. Thus, a p-type semiconductor material inherently shows a high resistance. Because of this, the holes circumvent the oxidation region constituting the antiguiding structure, in the case of the device of the Non-Patent Reference 4 in which the oxidation region is provided in a p-type semiconductor layer so as to overlap with the conductive region formed by the current confinement structure and are then injected to the central part of the mesa structure as a result of the current confinement action of the current confinement structure. Thus, there arises a drawback of large and limited current path. This problem of increase of resistance is enhanced because of the high resistance of the p-type semiconductor material.

By providing the antiguiding structure in the n-type distributed Bragg reflector as in the eighth aspect of the present invention, on the other hand, increase of resistance is held minimum even in the case there exists an insulation region or high resistance region at the central part of the mesa structure in view of the fact that there is provided no current confinement structure between the antiguiding structure and the active layer and in view of the inherently large electron mobility. Thus, it becomes possible to suppress the device resistance generally equal to that of the conventional device.

With the device of the present invention, it is possible to form the antiguiding structure inside the epitaxial structure by conducting the oxygen ion implantation and thermal annealing process. Thereby, there is caused no formation of AlOx at the surface part, contrary to the device that has been applied with the selective oxidation process in a high temperature ambient containing water vapor starting from the surface part, while this allows regrowth of semiconductor crystal layers, and the semiconductor structure for the surface-emission laser diode is obtained easily. Further, it should be noted that the function of the antiguiding structure is generally the same with regard to the transverse mode when it is provided in the p-type distributed Bragg reflector or when it is provided in the n-type distributed Bragg reflector. Thus, with the present invention, it is also possible to achieve the effect of suppressing the higher transverse mode oscillation similarly to the other surface-emission laser diodes. Further, as a result of reduced device resistance, heating of the device is suppressed with the laser diode, and the laser diode according to the eight aspect of the present invention can be operated with high output power.

Thus, as noted above, it becomes possible to obtain a device capable of performing a high power operation in the single fundamental transverse mode.

According to the ninth aspect of the present invention, in which there is provided a surface-emission laser diode configured according to any of the first through eighth aspects of the present invention, wherein there is further provided a region of relatively high refractive index around said region of relatively low refractive index provided in spatial overlapping with said laser cavity region in said laser cavity direction, and wherein there is further provided a cladding region of low refractive index with respect to said high refractive region such that said cladding region is located around said region of high refractive index, the leakage (diffraction) loss of light is prevented, and single fundamental transverse mode oscillation becomes possible up to higher output power.

Thus, according to the ninth aspect of the present invention, it becomes possible to provide a surface-emission laser diode having an antiguiding structure of oxide of Al, in which laser oscillation in higher transverse mode is suppressed more efficiently and is capable performing high output operation in the single fundamental transverse mode.

According to the tenth aspect of the present invention, in which there is provided a surface-emission laser diode configured according to the ninth aspect of the present invention, wherein there is provided an anisotropy in a width of said high refractive region surrounded by said cladding region, the polarization direction of the laser beam is controlled in a specific direction, and that the laser diode can maintain the single fundamental transverse mode operation up to further higher output power.

Thus, according to the present invention, higher transverse mode laser oscillation is suppressed further effectively with the surface-emission laser diode having the antiguiding structure of oxide of Al, by providing the cladding region having an anisotropic shape. Thereby, a laser beam having a polarization direction in a specific direction is obtained.

According to the eleventh aspect of the present invention, in which there is provided a surface-emission laser diode configured according to the ninth aspect of the present invention, wherein said cladding region is provided in a pair in a direction perpendicular to said laser cavity direction across a laser cavity region, in other words, a pair of cladding regions of low refractive index formed of oxide of Al outside the region including the laser oscillation region at the central part thereof are provided only in one direction across the cavity region, the polarization direction is controlled in a specific direction and single fundamental mode operation becomes possible up to further higher output power.

Thus, according to the eleventh aspect of the present invention, laser oscillation in the higher-order transverse mode is suppressed further effectively with the surface-emission laser diode having an antiguiding structure of an oxide of Al by providing a cladding region having an anisotropic shape, wherein the laser diode of such a construction can produce a laser beam with polarization direction thereof controlled in a specific direction and can provide with high output power while maintaining the single fundamental transverse mode operation.

According to the twelfth aspect of the present invention, in which there is provided a surface-emission laser diode according to any of the first through eleventh aspects, wherein said region of relatively low refractive index has an anisotropic shape, in other words, the region of relatively low refractive index, formed of oxide of Al and provided in spatial overlapping with the laser oscillation region for formation of the antiguiding structure, is formed to have an anisotropic form such as rectangular form or elliptical form, the polarization plane of the laser beam is controlled in a specific direction. Further, the laser diode can maintain single fundamental transverse mode operation up to high output power state.

Thus, according to the twelfth aspect of the present invention, the higher-order transverse mode oscillation is suppressed further effectively in a surface-emission laser diode having an antiguiding structure of oxide of Al, by providing the low refractive index region constituting the anti-guiding structure to have an anisotropic shape. Thereby, the laser oscillation at higher transverse mode is suppressed further effectively, and a laser beam having a polarization plane controlled in a specific direction is obtained.

According to the thirteenth aspect of the present invention, in which there is provided a surface-emission laser diode according to any of the first through twelfth aspects, wherein said active layer comprises a group III-V compound semiconductor material, said group III element comprises at least one of Ga and In, and wherein said group V element comprises one or more of As, N, Sb and P, it becomes possible to obtain a surface-emission laser diode having an oscillation wavelength in the range of 1.1 μm to 1.6 μm on a GaAs substrate, by using the foregoing material for the active layer.

On a GaAs substrate, it is possible to provide a distributed Bragg reflector that uses an AlGaAs mixed crystal having excellent characteristics, and with this, it becomes possible to obtain a laser diode of excellent characteristics. Among these materials, GaInNAs in which nitrogen is added to GaInAs with an amount of several percent or less is particularly suitable for the active layer of the laser diode in view of it large conduction band discontinuity with regard to the barrier layer of GaAs, and the like. Because of this, the laser diode of the thirteenth aspect of the present invention has a superior temperature characteristic to the conventional laser diode of the same wavelength band and formed on an InP substrate.

Further, according to the first through twelfth aspects of the present invention, the laser diode maintains the single transverse mode oscillation up to high output power state, and a large coupling efficiency is realized with regard to an optical fibber, or the like. Thus, a surface-emission laser diode suitable for optical fiber communication is obtained.

Further, according to the fourteenth aspect of the present invention, in which the surface-emission laser diode of any of the first through thirteenth aspect of the present invention are arranged to form an array, it becomes possible to provide a surface-emission laser array capable of maintain the single fundamental mode laser oscillation up to high output power stated.

Thus, according to the fourteenth aspect of the present invention, it becomes possible to obtain a surface-emission laser array capable of maintaining the fundamental transverse mode laser oscillation up to the high output state and producing high quality laser beams. Thus, the surface emission laser array of the present invention is suitable for the optical source of multiple beam writing system for use in an electro-photographic system or for the optical source of long-range optical communication system.

According to the fifteenth aspect of the present invention, in which there is provided an optical interconnection system that uses any of the surface-emission laser diode of any of the first through thirteenth aspect of the present invention or the surface-emission laser array of the fourteenth aspect of the present invention as the optical source, it becomes possible to provide an optical interconnection system of high reliability.

Thus, with the surface-emission laser diode of the surface-emission laser array of the present invention, the fundamental transverse mode laser oscillation is maintained up to high output power state, and with this, large optical coupling is achieved with regard to an optical fiber. Further, because the laser oscillation of higher-order transverse mode is effectively suppressed, there occurs little change of optical injection into the optical fiber even in the case the output state of the device is changed and hence the optical coupling coefficient has been changed. Thus, it becomes possible to provide a reliable optical interconnection system.

According to the sixteenth aspect of the present invention, in which there is provided an optical communication system that uses the surface-emission laser diode according to any of the first through thirteenth aspects of the present invention or the surface-emission laser array according to the fourteenth aspect of the present invention, it becomes possible to provide a reliable optical communication system.

With the surface-emission laser diode or surface-emission laser array of the present invention, it should be noted that high output power is obtained while maintaining the fundamental transverse mode oscillation. Thus, high coupling efficiency is obtained with regard to an optical fiber. Further, because the laser oscillation of higher-order transverse mode is suppressed effectively, there occurs little change of optical coupling coefficient even when the operational state of the laser diode such as the optical output power is changed, and thus, there occurs little change in the injection of optical signals into the optical fiber. In addition, a larger output power is obtained as compared with the conventional art, while this enables long-distance communication. Thus, the present invention can provide a reliable communication system.

According to the seventeenth aspect of the present invention, in which there is provided an electro-photographic system using any of the surface-emission laser diode according to any of the first through thirteenth aspect of the present invention or the surface-emission laser array according to the fourteenth aspect of the present invention, it becomes possible to provide a low-cost and high-definition electro-photographic system.

Conventionally, it has been difficult to use a surface-emission laser diode for the optical source of the writing system of an electro-photographic system because of its small output power. On the other hand, the surface-emission laser diode or surface-emission laser array of the present invention can provide a high output power while maintaining the fundamental transverse mode. Thus, with the present invention, it becomes possible to use a surface-emission laser diode for the writing optical source of an electro-photographic system.

With the use of a surface-emission laser diode for the writing optical source of an electro-photographic system, an output optical beam having of circular cross-section is obtained, while shaping of optical beam is facilitated with the use of such an optical beam of the circular cross-section.

Further, because of high positional precision between the laser diodes in the array, it becomes possible to focus plural optical beams with excellent reproducibility while using a single lens. Thereby, the construction of the optical system is simplified, and it becomes possible to obtain a high-definition system with low cost. Because of large output power, the surface-emission laser diode of the present invention enables high-speed writing particularly in the case it is used in the form of an array.

Thus, with the present invention, it becomes possible to provide a low-cost and high-definition electro-photographic system.

According to an eighteenth aspect of the present invention, in which there is provided an optical disk system that uses the surface-emission laser diode according to any of the first through thirteenth aspect of the present invention or the surface-emission laser array according to the fourteenth aspect of the present invention as the reading/writing optical source, it becomes possible to provide an optical disk system of high reliability and capable of performing high-speed disk access (high-speed reading and writing).

Conventionally, it has been difficult to use a surface-emission laser diode for the optical source of an optical disk system because of its small output power. On the other hand, the surface-emission laser diode or surface-emission laser array of the present invention can provide a high output power while maintaining the fundamental transverse mode. Thus, with the present invention, it becomes possible to use a surface-emission laser diode for the optical source of an optical disk system. Further, it becomes possible to construct a reliable optical disk system.

Particularly, as a result of use of surface-emission laser array, it becomes possible to perform high-density reading and writing, while this enables to construct a high-speed optical disk system.

Thus, according to the present invention, it becomes possible to provide a highly reliable optical disk system capable of performing high-speed access (high-speed reading and writing).

According to the nineteenth through twenty second aspects of the present invention, in which there is provided a surface-emission laser diode constructed on a substrate having a substrate surface, comprising: an active layer parallel to said substrate surface; a pair of cavity spacer layers provided so as to sandwich said active layer; a pair of distributed Bragg reflectors provided across said active layer and said cavity spacer layers so as to sandwich said active layer and said cavity spacer layers therebetween; a high resistance region defining a current injection region for injecting a current into said active layer, laser oscillation being caused in a laser cavity region between said pair of distributed Bragg reflectors acting as cavity mirrors in a direction perpendicular to said substrate surface in correspondence to said current injection region, a refractive index structure provided in a plane parallel to said substrate surface, said refractive index structure comprising: a low refractive index core including said laser cavity region at a central part thereof; and a periodic structure provided around said low refractive index core, said periodic structure comprising a low refractive region surrounding said low refractive index core and a high refractive index region surrounding said low refractive index region, said low refractive index region and said high refractive index region being repeated alternately in said plane parallel to said substrate, wherein any of a width of said low refractive index core or a shape of said periodic structure is changed between a specific direction parallel to said substrate surface and other directions parallel to said substrate surface different from said specific direction, it becomes possible to control the polarization direction of the output laser beam stably in any desired direction, while causing the laser diode to oscillate in the single fundamental transverse mode up to high output power state. Further, such a surface-emission laser diode can be modulated at high speed.

Thus, with the surface-emission laser diode of the nineteenth through twenty second aspects of the present invention, the polarization direction of the output laser beam is aligned in an arbitrarily selected desired direction. Further, it becomes possible to maintain single fundamental transverse mode laser oscillation up to high output power state. This means that high output power is obtained while maintaining the single fundamental transverse mode oscillation.

Further, the surface-emission laser diode of the present invention is characterized by low device resistance, while this means that the laser diode of the present invention has excellent frequency characteristics. Further, heat generation is reduced with the laser diode of the present invention, while this means that the laser diode can provide high differential gain and high output power. Thus, it becomes possible to achieve a high relaxation oscillation frequency. Thereby, a surface-emission laser diode capable of high speed modulation is obtained.

Particularly, with the surface-emission laser diode of the twenty second aspect of the present invention, it becomes possible to produce a laser beam having a high polarization ratio and having a polarization direction in a specific direction while maintaining the single transverse mode oscillation up to high output power state.

According to the twenty third aspect of the present invention, in which there is provided a surface-emission laser diode constructed on a substrate having a substrate surface, comprising: an active layer parallel to said substrate surface; a pair of cavity spacer layers provided so as to sandwich said active layer; a pair of distributed Bragg reflectors provided across said active layer and said cavity spacer layers so as to sandwich said active layer and said cavity spacer layers therebetween; a high resistance region defining a current injection region for injecting a current into said active layer, laser oscillation being caused in a laser cavity region between said pair of distributed Bragg reflectors acting as cavity mirrors in a direction perpendicular to said substrate surface in correspondence to said current injection region, a refractive index structure provided in a plane parallel to said substrate surface, said refractive index structure comprising: a low refractive index core including said laser cavity region at a central part thereof; and a periodic structure provided around said low refractive index core, said periodic structure comprising a low refractive region surrounding said low refractive index core and a high refractive index region surrounding said low refractive index region, said low refractive index region and said high refractive index region being repeated alternately in said plane parallel to said substrate, wherein said periodic structure is provided partially in said plane parallel to said substrate surface in a specific direction, the polarization direction is controlled stably in a desired specific direction. Further, high output power operation is realized while maintaining single fundamental transverse mode laser oscillation. Further, it becomes possible modulate at high speed with the laser diode of the twenty third aspect of the present invention.

Thus, with the surface-emission laser diode of the twenty third aspect of the present invention, too, the polarization direction of the laser beam is aligned in a desired specific direction. Further, it becomes possible to obtain the single fundamental transverse mode oscillation up to high output power state. Further, because of the low device resistance, the surface-emission laser diode of the present invention has excellent electric characteristics, particularly the frequency characteristics. Because of low heat generation and high efficiency of heat radiation, it becomes possible with the surface-emission laser diode of the twenty aspect of the present invention to obtain high differential gain and high output power. Further, it becomes possible to obtain high relaxation oscillation frequency.

Thus, with the twenty third aspect of the present invention, it becomes possible to obtain a surface-emission laser diode capable of high speed modulation.

According to the twenty fourth aspect of the present invention, in which there is provided a surface-emission laser diode according to any of the nineteenth through twenty third aspects of the present invention, wherein said active layer is formed of a III-V semiconductor material, said active layer containing any or both of Ga and In as a group III element, said active layer containing any or all of As, N, Sb and P as a group V element, the polarization direction is controlled stably in a desired specific direction. Further, high output power operation is realized while maintaining single fundamental transverse mode laser oscillation. Further, it becomes possible modulate at high speed with the laser diode of the twenty third aspect of the present invention. Particularly, it becomes possible to provide a surface-emission laser diode of long wavelength band having improved temperature characteristics.

More specifically, with the twenty fourth aspect of the present invention, it becomes possible to construct a surface-emission laser diode having an oscillation wavelength between 1.1 μm and 1.6 μm on a GaAs substrate. With the use of the GaAs substrate, it becomes possible to provide excellent distributed Bragg reflector by using the AlGaAs mixed crystal, and the laser diode having such a construction shows superior characteristics.

Particularly, with the use of GaInNAs, in which small amount of nitrogen, typically several percent or less in concentration, is added to GaInAs, for the active layer of the laser diode, a large band discontinuity is secured with regard to the GaAs barrier layer in the conduction band, and it becomes possible to provide a device having excellent temperature characteristics over the device of the same wavelength band and constructed on a conventional InP substrate.

Further, similarly with the nineteenth through twenty third aspects of the present invention, it becomes possible to set the polarization direction stably in an arbitrary direction with the laser diode of the present invention. Further, with the twenty fourth aspect of the present invention, it becomes possible to provide a surface-emission laser diode capable of maintaining single fundamental transverse mode laser oscillation up to high output power state and capable of performing high speed modulation. Thus, the laser diode of the twenty fourth aspect of the present invention is particularly suitable for optical fiber communication.

According to the twenty fifth aspect of the present invention, in which there is provided a surface-emission laser array formed of a surface-emission laser diode according to any of the nineteenth through twenty fourth aspects of the present invention, it becomes possible to control the polarization direction in an arbitrarily chosen specific direction stably. Further, with the surface-emission laser array of the twenty fifth aspect of the present invention, it becomes possible to provide a monolithic surface-emission laser array providing high put power in the single fundamental transverse mode oscillation and capable of performing high speed modulation.

Thus, with the twenty fifth aspect of the present invention, it becomes possible to provide a surface-emission monolithic laser array having a polarization direction aligned in an arbitrarily chosen specific direction and is capable of oscillating in the fundamental transverse mode up to high output power while providing high quality beam and is further capable of high speed modulation.

According to the twenty sixth aspect of the present invention, in which there is provided an optical interconnection system that uses the surface-emission laser diode according to any of the nineteenth through twenty fourth aspects of the present invention or the surface-emission laser array according to the twenty fifth aspect of the present invention, it becomes possible to provide a reliable optical interconnection system capable of high speed transmission by using the surface emission laser diode or surface emission laser array in which the polarization direction is controlled stably in an arbitrarily chosen specific direction and high output power is obtained while maintaining the fundamental transverse mode (high output power is obtained in the single fundamental transverse mode oscillation) and is capable of performing high speed modulation, for the optical source.

According to the twenty seventh aspect of the present invention, in which there is provided an optical communication system that uses the surface-emission laser diode according to any of the nineteenth through twenty fourth aspects of the present invention or the surface-emission laser array according to the twenty fifth aspect of the present invention, it becomes possible to provide a reliable optical communication system suitable for optical fiber communication and capable of high speed transmission by using the surface emission laser diode or surface emission laser array in which the polarization direction is controlled stably in an arbitrarily chosen specific direction and high output power is obtained while maintaining the fundamental transverse mode (high output power is obtained in the single fundamental transverse mode oscillation) and is capable of performing high speed modulation, for the optical source.

According to the twenty eighth aspect of the present invention, in which there is provided an electrophotographic system that uses the surface-emission laser diode of any of the nineteenth through twenty fourth aspects of the present invention or the surface-emission laser array according to the twenty fifth aspect of the present invention, it becomes possible to provide a low cost electrophotographic system capable of high speed writing with high definition, by using the surface emission laser diode or surface emission laser array in which the polarization direction is controlled stably in an arbitrarily chosen specific direction and high output power is obtained while maintaining the fundamental transverse mode (high output power is obtained in the single fundamental transverse mode oscillation) and is capable of performing high speed modulation, for the optical source.

According to the twenty ninth aspect of the present invention, in which there is provided an optical disk system that uses a surface emission laser diode according to any of the nineteenth through twenty fourth aspects of the present invention or the surface-emission layer array according to the twenty ninth aspect of the present invention, it becomes possible to provide a reliable optical disk system capable of high speed access, by using the surface emission laser diode or surface emission laser array in which the polarization direction is controlled stably in an arbitrarily chosen specific direction and high output power is obtained while maintaining the fundamental transverse mode (high output power is obtained in the single fundamental transverse mode oscillation) and is capable of performing high speed modulation, for the optical source.

BRIEF DESCRIPTION OF THE DRAWINGS

FIGS. 11A and 11B are diagrams showing the surface-emission laser element of Example 6;

FIGS. 12A and 12B are diagrams showing the surface-emission laser element of Example 7;

FIGS. 13A and 13B are diagrams showing the surface-emission laser element of Example 8;

DETAILED DESCRIPTION OF THE INVENTION

Figure 1:
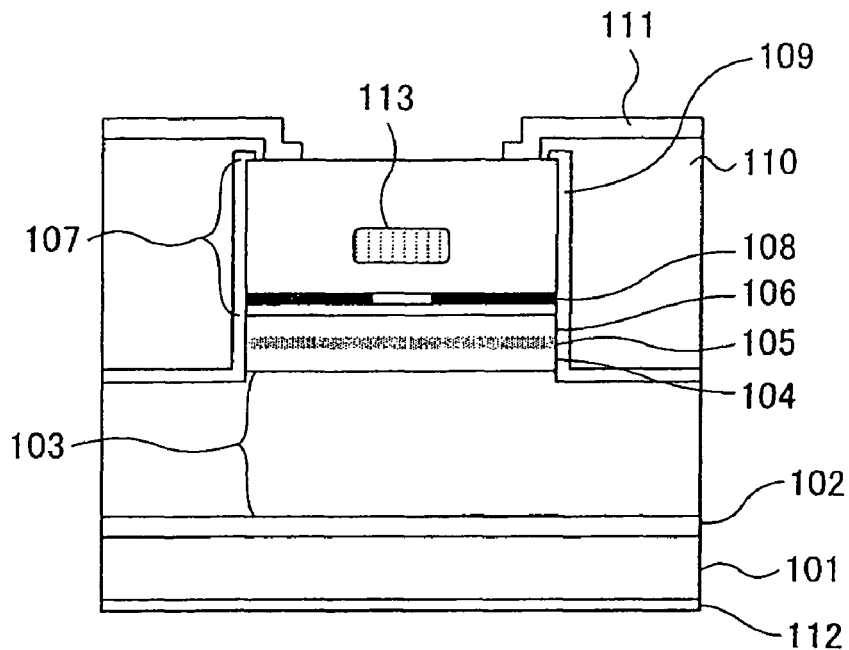
FIG. 1 is a diagram showing the surface-emission laser element of Example 1.

Hereinafter, the present invention will be explained for the best mode for implementing the invention.

(First Mode of Invention)

According to the first mode of the present invention, there is provided a surface-emission laser diode, comprising:

an active layer;

a pair of cavity spacer layers formed at both sides of said active layer;

a current confinement structure defining a current injection region into said active layer; and a pair of distributed Bragg reflectors opposing with each other across a structure formed of said active layer and said cavity spacer layers, said current confinement structure being formed by a selective oxidation process of a semiconductor layer, said pair of distributed Bragg reflectors being formed of semiconductor materials, wherein there is provided a region containing an oxide of Al and having a relatively low refractive index as compared with a surrounding region in any of said semiconductor distributed Bragg reflector or said cavity spacer layer in correspondence to a part spatially overlapping with said current injection region in a laser cavity direction.

In the prior art surface-emission laser diodes, it should be noted that the distributed Bragg reflector above the Al oxide layer has been formed by a dielectric material. Because a dielectric material is an insulator, it is not possible to feed electric current through the distributed Bragg reflector as long as the distributed Bragg reflector is formed by using a dielectric material.

Thus, with the surface-emission laser diode that uses a dielectric distributed Bragg reflector, it is inevitable to use a structure such as intra-cavity contact in which the current injection to the active region is made via a contact layer provided inside the distributed Bragg reflector or in the interior of the device as in the prior art surface-emission laser diode that has the antiguiding structure.

In the case of using such an intra-cavity contact structure, in which the current injection is made from the peripheral part of the device via a thin contact layer, there generally arises a problem that the device resistance is increased. Thus, with the laser diode having a dielectric distributed Bragg reflector, a restriction is imposed upon the current injection path, and there arises a problem that the device resistance is increased.

Contrary to this, the distributed Bragg reflector is constructed, with the first mode of the present invention, by a semiconductor material including the part that includes the low refractive index region formed of Al oxide as the antiguiding structure.

Thus, with the present invention, it becomes possible to carry out current injection from the contact layer provided at the uppermost part of the device structure in the direction toward the substrate, similarly to the case of conventional surface-emission laser diode of the selective oxidation type. Thereby, it becomes possible to achieve current injection, even in the case there exists an insulation region of Al oxide at the central part of the device, via the surrounding region of relatively large area, and the increase of resistance of the device is effectively prevented.

Thus, the present invention enables current injection via the distributed Bragg reflector, and with this, the effect of device resistance can be reduced as compared with the conventional antiguiding surface-emission laser diode. Thereby, a large degree of freedom of device is achieved.

With the distributed Bragg reflector, in which it is required to control the film thickness precisely, there is a demand for precise control of deposition rate at the time of formation of the distributed Bragg reflector. With regard to this aspect, it should be noted that use of two different deposition apparatuses at the time of forming the distributed Bragg reflector in correspondence to the use of different materials and different deposition processes not only complicates the manufacturing process but also increases the cost of the device.

Contrary to this, the first mode of the present invention can form the distributed Bragg reflector in a single crystal growth apparatus of a semiconductor material such as an MOCVD apparatus collectively, and with this, the fabrication process of the laser diode is simplified.

Thus, with the first mode of the present invention, it becomes possible to provide a selectively oxidized surface-emission laser diode having an antiguiding structure, in which the manufacturing cost is suppressed, the freedom of design is increased and the device resistance is reduced.

(Second Mode of Invention)

According to the second mode of the present invention, there is provided a surface-emission laser diode, comprising:

an active layer;

a pair of cavity spacer layers formed at both sides of said active layer;

a current confinement structure defining a current injection region into said active layer; and a pair of distributed Bragg reflectors opposing with each other across a structure formed of said active layer and said pair of cavity spacer layers, said current confinement structure comprising a high resistance region formed by an ion implantation process, said pair of distributed Bragg reflectors being formed of semiconductor materials, wherein there is provided a region containing an oxide of Al and having a relatively low refractive index than a surrounding region in any of said semiconductor distributed Bragg reflector or said cavity spacer layer in correspondence to a part spatially overlapping with said current injection region in a laser cavity direction.

As explained with regard to the first mode of the invention, the prior art antiguiding surface-emission laser diode uses a distributed Bragg reflector of a dielectric material for the upper distributed Bragg reflector provided above the low refractive index region of Al oxide forming the antiguiding structure, while such a structure prohibits injection of drive current from the top part of the distributed Bragg reflector formed of the dielectric material.

Contrary to this, the surface-emission laser diode of the second mode uses a semiconductor distributed Bragg reflector formed of a semiconductor material including the part in which the low refractive index region of Al oxide is formed. Thereby, it becomes possible to feed a drive current through the distributed Bragg reflector.

With regard to the conventional surface-emission laser diode of hydrogen ion implantation type, in which there is formed a region of high resistance by ion implantation process of hydrogen after formation of the device structure by using semiconductor materials, such a device does have the advantage that the device can be formed very simply without conducting an etching process in the crystal growth part. In the prior art antiguiding surface-emission laser diode that uses the dielectric mirror, it should be noted that there is a need of forming an electrode, or the like under the dielectric mirror for current injection. Thus, it has been difficult to use such a simple construction.

Further, with the prior art antiguiding surface-emission laser diode, it has been necessary to use the intra-cavity contact construction in order to allow current injection from the bottom part of the dielectric mirror, while such a construction raises the problem of increased device resistance as explained before. Further, from the construction of the prior art antiguiding surface-emission laser diode that uses the selective oxidation process, it is difficult to drive the construction of the hydrogen ion implantation type surface-emission laser diode having the antiguiding structure.

Thus, according to the second mode of the present invention, in which the distributed Bragg reflector or the cavity spacer layer including therein the Al oxide is formed of a semiconductor material, it becomes possible to inject current from the top part of the distributed Bragg reflector similarly to the case of the first mode invention. Thereby, it becomes possible to obtain a device having an antiguiding structure with a very simple construction, similarly to the case of the conventional hydrogen-ion injected surface-emission laser diode. Further, because it is possible to inject drive current from the top part of the device, the laser diode of the present mode can avoid the problem of increase of device resistance, similarly to the first mode of the present invention.

Thus, with the present embodiment, it becomes possible to provide a hydrogen ion implantation type surface-emission laser diode having an antiguiding structure wherein the degree of freedom of design is increased and the device resistance is decreased.

(Third Mode of Invention)

According to the third mode of the present invention, there is provided a surface-emission laser diode, comprising:
an active layer;
a current confinement structure defining a current injection region into said active layer; and
a pair of distributed Bragg reflectors opposing with each other across said active layer;
said current confinement structure being formed of a selective oxidation process of a semiconductor material,
said surface-emission laser diode comprising an AlGaAs mixed crystal layer,
a part of said AlGaAs mixed crystal layer having spatial overlapping with said current injection region in a laser cavity direction,
said part of said AlGaAs mixed crystal being formed by selective ion implantation of molecules containing oxygen and a thermal annealing process following said selective ion implantation process, said part of said AlGaAs mixed crystal having a relatively low refractive index as compared with a surrounding region wherein ion implantation of molecules containing oxygen is not made and located on an identical plane of said part, said plane being perpendicular to said laser cavity direction.

According to the construction of the third mode of the present invention, the refractive index of the AlGaAs layer is decreased as compared with the surrounding region in the part in which the ion implantation of the molecules containing oxygen has been made as a result of oxidation caused by the thermal annealing process, and with this, there is formed an antiguiding structure in a part of the cavity interior.

Thus, with the present mode of the invention, it becomes possible to form the antiguiding structure at any desired part inside the device structure by using the selective oxidation process conducted by way of ion implantation of molecules containing oxygen followed by thermal annealing process, in place of conventional selective oxidation conducted in a high temperature ambient containing water vapor.

Because it is not necessary to expose the surface of the AlGaAs layer to the high-temperature water vapor ambient in the present mode of the invention, contrary to the prior art, there occurs no formation of oxide layer on the device surface, and it becomes possible to resume the crystal growth of the semiconductor layers. Thereby, the degree of freedom of design is increased, and a device structure superior in suppressing the higher-order transverse mode laser oscillation can be obtained.

Particularly, as a result of formation of the antiguiding structure at the central part of the cavity structure with limited extent, it becomes possible to decrease the spatial overlapping of the higher-order mode distribution with the gain region (current injection region) of the active layer, and thus, it becomes possible to suppress the laser oscillation in the higher-order transverse mode.

Figure 3A:
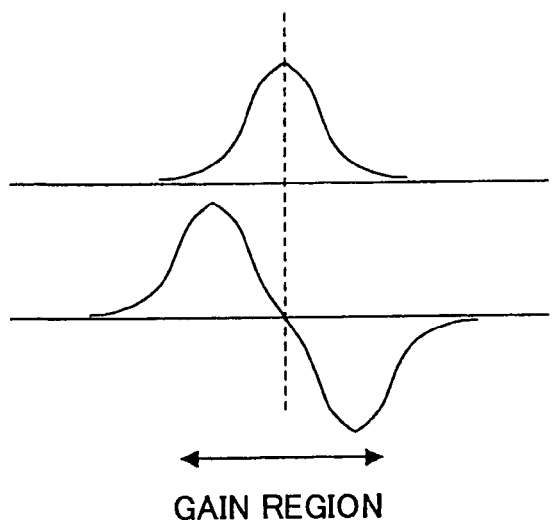
FIGS. 3A and 3B are diagrams showing the mode distribution for the case in which there is no antiguiding structure and in which there is provided an antiguiding structure.
Figure 3B:
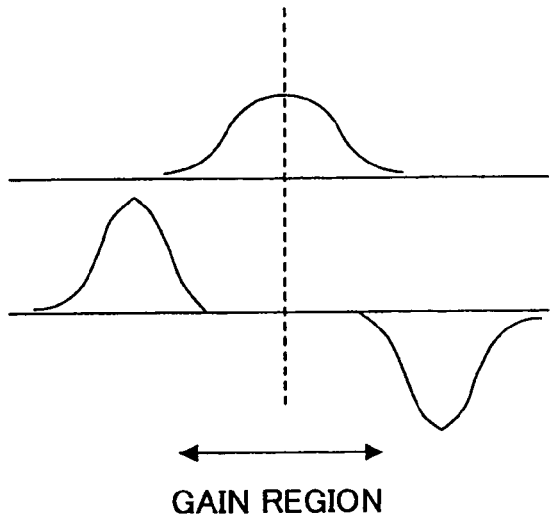

FIGS. 3A and 3B explain the foregoing situation.

Referring to the drawings, FIG. 3A shows the mode distribution for the case there is no antiguiding structure, while FIG. 3B shows the mode distribution in the case the antiguiding structure is provided at the central part of the device with a limited extent. Thereby, it should be noted that the upper graphs of FIGS. 3A and 3B represent the distribution of the fundamental transverse mode, while the lower graphs of FIGS. 3A and 3B represent the distribution of the first-order transverse mode. Further, it should be noted that FIGS. 3A and 3B includes the representation of the gain region formed in correspondence to the current injection.

In the case of the fundamental transverse mode having a large mode distribution at the mesa central part, it is difficult to modify the mode distribution profile toward the peripheral part of the mesa structure. On the other hand, in the case of the higher-order transverse mode, which has the electric field strength of zero at the mesa center and a large mode distribution at the peripheral part, it becomes possible to decrease the mode distribution (electric field distribution) at the mesa central part by modifying the mode distribution toward the peripheral direction of the mesa structure by providing the antiguiding structure.

Thus, with the present invention, the gain for the higher-order transverse mode is suppressed, and the laser diode can perform the fundamental transverse mode operation up to the high output power state.

Further, with regard to the fundamental transverse mode, which is not so much influenced by the antiguiding structure as in the case of the higher transverse mode, there nevertheless is caused a broadening of the distribution profile with the formation of the antiguiding structure as shown in FIG. 3B, and thus, the electric field strength distribution becomes more broad about the center of the mode. Thereby, the peak electric field strength in the gain region is decreased, and occurrence of spatial hole-burning can be reduced. Further, because the higher-order transverse mode is spatially separated from the gain region by the antiguiding structure with sufficient distance, it becomes possible to user a larger diameter for the current confinement structure as compared with the conventional case. Thereby, the device resistance is reduced further and more higher output power operation becomes possible.

(Fourth Mode of Invention)

According to the fourth mode of the present invention, there is provided a surface-emission laser diode, comprising:
an active layer;
a current confinement structure defining a current injection region into said active layer; and
a pair of distributed Bragg reflectors opposing with each other across said active layer, said current confinement structure comprising a high resistance region formed by an ion implantation process, said surface-emission laser diode comprising an AlGaAs mixed crystal layer, a part of said AlGaAs mixed crystal layer having a spatial overlapping with said current injection region in a laser cavity direction, said part of said AlGaAs mixed crystal spatially overlapping with said current injection region being processed by an ion implantation process of molecules containing oxygen and a thermal annealing process following said ion implantation process and having a relatively low refractive index as compared with a surrounding region not injected with molecules containing oxygen and located on an identical plane of said part, said plane being perpendicular to said laser cavity direction.

With the fourth mode, too, the AlGaAs mixed crystal is oxidized in correspondence to the region where the ion implantation of the molecules containing oxygen has been made as a result of the thermal annealing process, and the refractive index is decreased as compared with the surrounding region. Thereby, the antiguiding structure is formed inside the cavity structure.

Thus, by forming the antiguiding structure as a result of selective oxidation conducted by ion implantation of molecules containing oxygen followed by thermal annealing process, in place of the conventional selective oxidation process conducted in the high-temperature ambient containing water vapor, it becomes possible with the fourth mode of the present invention to form the antiguiding structure at any desired part of the device structure.

Further, in view of no need of exposing the surface of the AlGaAs layer to the high-temperature water vapor ambient for the propose of oxidation with the present mode of the invention, there is caused no formation of oxide film at the device surface, while this allows regrowth of semiconductor layers on such a device surface. Thereby, the degree of freedom of design is increased with the fourth mode of the present invention, and a device structure capable of effectively suppressing laser oscillation in the higher-order transverse mode is realized.

With the hydrogen ion implantation type surface-emission laser diode that lacks the built-in waveguide structure, it is easy to expand the higher-transverse mode toward the peripheral direction of the mesa structure by providing the antiguiding structure as explained with reference to FIG. 3B, and with this, it becomes possible to decrease the amplitude of the higher-order transverse mode (electric field strength) at the central part of the mesa structure.

As a result, spatial overlapping of the higher-order transverse mode with the gain region (current injection region) in the active layer is reduced, and laser oscillation at the higher-order transverse mode is effectively suppressed. In a surface-emission laser diode having the hydrogen ion implantation current confinement structure that lacks the built-in waveguide structure, it is known that the transverse mode is unstable with regard to the change of the driving condition, while the use of the antiguiding structure as in the case of the present mode of the invention effectively suppresses the occurrence of laser oscillation a the higher-order transverse mode.

Further, with regard to the fundamental transverse mode, it should be noted that the peak of the mode is suppressed as represented in FIG. 3B and the distribution of the electric field is broadened at the mode central part. As a result of such decrease of the peak electric field strength in the gain region, it becomes possible with the present mode of the invention to reduce the occurrence of spatial hole-burning.

(Fifth Mode of Invention)

In the fifth mode of the present invention, there is provided a surface-emission laser diode according to any of the first through fourth modes, wherein there is provided any of a GaAs layer or a GaInP mixed crystal layer adjacent with said AlGaAs mixed crystal layer constituting said region of relatively low refractive index with respect to said surrounding region not injected with said molecules containing oxygen and located on said identical plane of said part where said ion implantation of said molecules has been made.

It should be noted that there occurs no substantial oxidation in the semiconductor layer of GaInP or GaAs even when oxygen ion implantation has been made. Thus, in the case the distribution profile of the oxygen ions in the AlGaAs layer is broad, it becomes possible to prevent the unwanted formation of oxide layer outside the desired region, by providing a GaInP layer or a GaAs layer or a semiconductor structure formed of any of these adjacent to the AlGaAs layer to be selectively oxidized as set forth in the fifth mode of the present invention. Thereby, adjustment of resonance condition is achieved easily.

(Sixth Mode of Invention)

According to the sixth mode of the present invention, there is provided a surface emission laser diode according to any of the first through fifth modes of the present invention, wherein said AlGaAs mixed crystal layer, constituting said region of relatively low refractive index with respect to said surrounding region not made with ion implantation of molecules containing oxygen and located on said identical plane perpendicular to said laser cavity in the optical cavity. Thus, particularly large absorption loss is caused in the higher-order transverse mode in such a part, and laser oscillation at the higher-order transverse mode is suppressed effectively.

(Seventh Mode of Invention)

According to the seventh mode of the present invention, there is provided a surface-emission laser diode according to any of said first through sixth modes of the present invention, wherein said region of relatively low refractive index is provided in plural numbers.

By providing the anti-guiding structure having a relatively low refractive index as compared with the surrounding region with plural numbers as set forth in the seventh mode of the present invention, the antiguiding action is adjusted easily, and the degree of freedom of design is increased.

Further, by providing the antiguiding structure in plural numbers, a large antiguiding action is obtained, and the efficiency of suppressing the higher-order transverse mode laser oscillation is increased.

(Eighth Mode of Invention)

According to the eighth mode of the present invention, there is provided a surface-emission laser diode according to any of the first through seventh modes of the present invention, wherein said region of relatively low refractive index is provided inside an n-type distributed Bragg reflector constituting one of said pair of distributed Bragg reflectors.

According to the construction of the eighth mode of the present invention, it becomes possible to suppress the higher-order transverse mode laser oscillation without increasing the device resistance, by providing the antiguiding structure of low refractive index region having a refractive index lower than the surrounding region in the n-type distributed Bragg reflector.

(Ninth Mode of Invention)

According to the ninth mode of the present invention, there is provided a surface-emission laser diode according to any of the first through eighth modes of the present invention, wherein there is further provided a region of relatively high refractive index around said region of relatively low refractive index provided in spatial overlapping with said laser cavity region in said laser cavity direction, and wherein there is further provided a cladding region of low refractive index with respect to said high refractive region such that said cladding region is located around said region of high refractive index.

With the antiguiding surface-emitting laser diode of the prior art in which the low refractive index region is provided in the region where the laser oscillation takes place, there inevitably arises a tendency, due to the nature of the waveguide structure, that optical loss (diffraction loss) occurs as a result of mode leakage in the direction perpendicular to the direction of laser oscillation. Thereby, there has been caused problems such as increase of threshold current, decrease of output, or the like.

In order to overcome this problem, the Non-Patent Reference 5 proposes a structure of surface-emission laser diode called S-ARROW.

With this conventional art, a region having a different effective refractive index is formed in the direction parallel to the substrate surface with adjustment of the film thickness by an etching process, such that there is formed a region of high refractive index surrounding the region of low refractive index, the laser oscillation region being located at the center of the low refractive index region. Further, there is provided another low refractive index region outside the high refractive index region so as to surround the high refractive index region.

In this way, by providing a high refractive index region and another low refractive index region consecutively around the low refractive index region including the laser oscillation region at the central part thereof, there is formed an antiguiding structure by the low refractive index region that includes the laser oscillation region and the high refractive index region surrounding the low refractive index region. Further, the low refractive index region provided around the high refractive index region functions similarly to a cladding layer and confines the transverse mode optical radiation. Thus, with such a construction, the leakage loss in the direction parallel to the substrate caused by diffraction can be suppressed.

Because the optical radiation is tend to be confined in the high refractive index region, there tends to occur a remarkable concentration of higher-order transverse mode in such a high refractive index region provided between the cladding layer and the low refractive index region including the laser oscillation region at the central part thereof, and it becomes possible to reduce the coupling between the gain region and the higher-order mode optical radiation. Thereby, laser oscillation with higher-order transverse mode is effectively suppressed.

Further, the use of the construction of the ninth mode of the present invention with the surface-emission laser diode of any of the first through eighth modes of the present invention, in which the antiguiding structure is formed by forming a low refractive index region of Al oxide in spatial overlapping with the laser cavity region, enables to realize a large refractive index difference as compared with the prior art, in view of the fact that the oxide of Al has a small refractive index of about one-half of the refractive index of the semiconductor material and large antiguiding is easily attained. Thus, the coupling between the higher-order transverse mode and the gain region is suppressed further, and with this, the laser oscillation with the higher-order transverse mode can be suppressed further.

Further, in the case the cladding region is formed of a low refractive index region that contains an oxide of Al, a large optical confinement of the transverse mode is achieved. Thereby, optical loss caused by mode leakage is reduced significantly.

Further, in the case the selective oxidation caused by ion implantation of molecules or ions containing oxygen and subsequent thermal annealing process is used for the formation of the antiguiding structure as in the case of the first through sixth modes of the present invention, it becomes possible to fabricate the device without conducting processes such as etching or regrowth, and the fabrication process of the laser diode is significantly simplified.

With the case of a surface-emission laser diode of the hydrogen ion implantation type, a particularly large effect can be attained as will be explained below.

In the case of the surface-emission laser diode of the hydrogen ion implantation type, there is provided no confinement structure for the transverse mode. Thus, there arises a problem in that the loss caused by mode leakage becomes very large in the case an antiguiding structure is provided. With the surface-emission laser diode of the ninth mode of the invention, it becomes possible to decrease the loss by mode leakage significantly, y providing a low refractive index cladding of Al oxide outside the laser oscillation region.

With regard to the cladding region for confinement of the transverse mode, it is also possible to use a periodic structure in which a low refractive index region and a high refractive index region are repeated alternately. By choosing the width of the respective regions, with such a periodic structure of refractive index, to be equal to an odd number multiple of ¼ wavelength in the plane perpendicular to the laser cavity direction of the fundamental transverse optical radiation, it becomes possible to form an optical confinement structure (cavity) similar to the distributed Bragg reflector provided in the laser cavity direction. Thereby, by adjusting the width of the reflection wavelength band by appropriately setting the repetition period, it becomes possible to realize a very high optical confinement effect selectively with regard to the fundamental transverse mod optical radiation.

Thus, with the ninth mode of the present invention, mode leakage in the direction perpendicular to the laser cavity direction is reduced, and the laser oscillation with higher-transverse mode is suppressed further effectively, and it becomes possible to obtain a single fundamental transverse mode laser oscillation up to further high output power.

(Tenth Mode of Invention)

According to a tenth mode of the present invention, there is provided anisotropy in the width of the high refractive index region surrounded by the cladding region in the surface-emission laser diode of the ninth mode of the present invention.

With the tenth mode of the present invention, in which there is provided an anisotropy in the width of the region surrounded by the cladding region in the direction perpendicular to the laser cavity direction, the polarization direction of the laser beam emitted from the laser diode is controlled in a specific direction, and the single fundamental transverse mode laser oscillation can be maintained up to further higher optical output.

By providing such a high refractive index region and low refractive index region around the low refractive index region that includes the laser oscillation region at the central part thereof, the low refractive index region outside the high refractive index region functions as a cladding layer that confines the transverse mode. With this, the optical loss caused by mode leakage can be reduced. Further, there occurs a concentration of higher-order transverse mode in the high refractive index region provided between the cladding layer and the low refractive index region that includes the laser oscillation region at the central part thereof, and coupling between the gain region and the higher-order transverse mode is reduced. With this, it becomes possible to suppress the laser oscillation with higher-transverse mode.

Further, by providing anisotropic shape such as rectangular or elliptical shape to the width of the region surrounded by the low refractive index cladding layer as in the case of the tenth mode of the invention, there occurs anisotropy in the lateral optical confinement, and it becomes possible to change the transverse mode distribution profile between directions of different anisotropy. Thereby, by adjusting the width of the region surrounded by the low refractive index cladding and also the effective refractive index of the cladding region, the high refractive index region and the low refractive index core, it becomes possible to realize a large coupling for a fundamental transverse mode distribution with the gain region in a specific direction. Thereby, it becomes possible to cause laser oscillation in the fundamental transverse mode with a specific polarization direction.

Incidentally, it should be noted that higher-order transverse mode generally has very small electric field amplitude and is thus susceptible to the influence of the antiguiding structure. Thus, coupling with the gain regions is inherently small, and laser oscillation with such higher-order transverse mode can be effectively and sufficiently suppressed by providing such an antiguiding structure.

From above, it becomes possible with the tenth mode of the present invention to provide a surface-emission laser diode capable of controlling the polarization direction and capable of maintaining the single fundamental transverse mode operation up to high output power.

(Eleventh Mode of Invention)

According to the eleventh mode of the present invention, there is provided a surface-emission laser diode according to the ninth mode of the present invention in which the foregoing cladding region is provided with a pair so as to oppose with each other across the laser cavity region in a specific direction perpendicular to the laser cavity direction.

With the eleventh mode of the surface-emission laser diode, the low refractive index region of Al oxide outside the region that includes the laser oscillating region at the central part thereof is now provided so as to form a pair opposing with each other across the foregoing laser cavity region in only one specific direction. With this, the polarization direction is controlled to a specific direction and the laser diode maintains the single fundamental transverse mode operation up to high output power.

As explained before, there is a tendency that there occurs optical loss as a result of mode leakage in the lateral direction with the laser diode having such an antiguiding structure. In order to reduce the mode leakage loss, it is effective to provide a low refractive index cladding as in the case of the surface-emission laser diode of the ninth mode of the invention.

Thus, by providing the low refractive index cladding layer only in a specific direction so as to sandwich the laser oscillation region laterally, it becomes possible to reduce the mode leakage loss in the direction in which the low refractive index cladding regions are provided, and it becomes possible to achieve laser oscillation selectively with the fundamental transverse mode that has an electric field component (polarization) in this direction.

In addition, the surface-emission laser diode of the hydrogen ion implantation type lacks the built-in structure, and such a laser diode is especially susceptive to mode leakage.

Thereby, there appears a large difference in the oscillation gain in the direction in which the low refractive index cladding layer is provided and in the direction in which no such low refractive cladding regions are provided. With this, it becomes possible to attain a large polarization ratio with the laser diode of such a construction.

Thus, according to the eleventh mode of the present invention, it becomes possible to control the polarization direction of the laser beam produced with the surface-emission laser diode in a specific direction while maintaining the single fundamental transverse mode laser oscillation for the laser diode up to high output power.

(Twelfth Mode of Invention)

According to the twelfth mode of the present invention, there is provided a surface-emission laser diode as set forth in any of the first through eleventh mode of the invention, wherein the region of relatively low refractive index, provided in spatial overlapping with the laser cavity region, has an anisotropic shape.

By forming the low refractive index core region of Al oxide formed in spatial overlapping with the laser oscillation region to have an anisotropic form such as rectangular form or elliptical form, there appears anisotropy in the lateral optical confinement similarly to the case of the tenth mode of the present invention, and it becomes possible to change the transverse mode distribution between the anisotropic directions. Thereby, it becomes possible to cause selective laser oscillation of the fundamental transverse mode with polarization in a specific direction, by adjusting the width and effective refractive index of the low refractive index core appropriately such that there appears a large coupling between the mode and the gain region in a specific direction.

Here, it should be noted that the higher-order transverse mode is characterized by small electric amplitude in the laser oscillation region, and because of this, higher-order transverse mode is susceptible to the influence of the antiguiding structure. Because of the inherently small coupling with the gain region, it becomes possible with such a surface-emission laser diode to suppress the higher-order transverse mode laser oscillation effectively by providing such an antiguiding structure.

Thus, with the twelfth mode of the invention, a surface-emission laser diode is obtained such that the polarization direction is controlled in a specific direction and the single fundamental transverse mode operation is maintained up to high output state.

(Thirteenth Mode of Invention)

According to the thirteenth mode of the present invention, there is provided a surface-emission laser diode according to any of the first through twelfth mode of the invention, wherein the active layer is formed of III-V elements and wherein the group III element constituting the active layer includes any or all of Ga and In, the group V element constituting the active layer includes any or all of As, N, Sb and P.

According to the thirteenth mode of the invention, it becomes possible to obtain a device having excellent temperature characteristics and suitable for the optical source of an optical communication system.

(Fourteenth Mode of Invention)

According to a fourteenth mode of the present invention, there is provided a surface-emission laser array, in which a number of the surface-emission laser diodes of any of the first through thirteenth aspect of the present invention are arranged to form an array.

The surface-emission laser array of the fourteenth mode of the present invention is capable of oscillating with the single fundamental transverse mode up to high output power.

(Fifteenth Mode of Invention)

According to the fifteenth mode of the present invention, there is provided an optical interconnection system that uses any of the surface-emission laser diode of any of the first through thirteenth modes of the present invention or the surface-emission laser array of the fourteenth mode of the present invention as an optical source.

With the use of surface emission laser diode of the first through thirteenth modes of the present invention or with the user of the surface-emission laser array of the fourteenth mode of the present invention, a laser oscillation of single fundamental transverse mode is achieved up to high output power state. Thereby, a large optical coupling is achieved with regard to an optical fiber. Further, in view of the excellent stability of transverse mode with change of operational state of the device, it becomes possible to provide a highly reliable optical interconnection system by using any of the foregoing as the optical source.

(Sixteenth Mode of Invention)

According to the sixteenth mode of the present invention, there is provided an optical communication system that uses the surface-emission laser diode of any of the thirst through thirteenth modes of the present invention or the surface-emission laser array according to a fourteenth mode of the present invention as the communication optical source.

With the surface-emission laser diode of the first through thirteenth modes of the present invention or with the surface-emission laser array according to the fourteenth mode of the present invention, single fundamental laser oscillation is obtained up to high output state, and large coupling coefficient is attained with regard to an optical fiber. Further, because of the stabilized transverse mode with regard to the change of operational state of the laser diode, it becomes possible to provide a highly reliable optical communication system by using such a surface-emission laser diode or surface-emission laser array for the communication optical source. Further, because of the large output power in the fundamental transverse mode, the communication system that uses the laser diode or laser array of the present invention is capable of performing long-distance communication.

(Seventeenth Mode of Invention)

According to the seventeenth mode of the present invention, there is provided an electro-photographic system that uses any of the surface-emission laser diode of any of the first through thirteenth aspects of the present invention and the surface-emission laser array according to the fourteenth aspects of the present invention, as the writing optical source.

The surface-emission laser diode of the first through thirteenth modes or the surface-emission laser array according to the fourteenth mode of the present invention, it becomes possible to maintain the single fundamental transverse mode laser oscillation up to high output power. Further, an output beam having a circular cross section is obtained. In addition, with the case of using the laser diodes in the form of array, a high positional relationship is guaranteed between the output laser beams. Thereby, it is possible to focus a large number of laser beams with high reproducibility while using a single lens.

Thereby, the optical system is simplified and the electro-photographic system can be constructed with low cost. Further, because large output power is obtained in the fundamental transverse mode, it becomes possible to write images direction, is provided at a location corresponding to an anti-node of a standing wave of laser oscillation occurring in said cavity structure, said AlGaAs mixed crystal layer being doped to a higher concentration level as compared with other AlGaAs mixed crystal layers constituting said surface-emission laser diode.

By using the construction of the sixth mode of the present invention, the region where ion implantation of the molecules containing oxygen has been made and thermal annealing process is made subsequently forms an AlOx layer as a result of the oxidation. Thereby, such a region becomes transparent to the fundamental transverse mode optical radiation, and optical loss of the fundamental transverse mode is eliminated.

On the other hand, the region not made with the ion implantation of the molecules containing oxygen absorbs the higher-order transverse mode optical radiation having a large mode amplitude in such a region because of the high concentration doping made thereto. Thereby, laser oscillation at the higher-order transverse mode is effectively suppressed. Particularly, it should be noted that there occurs a large mode distribution (electric field intensity) in correspondence to the anti-node with high-speed, particularly by using a laser diode array. Thereby, it becomes possible to realize a high-speed electro-photographic system.

(Eighteenth Mode of Invention)

According to the eighteenth mode of the present invention, there is provided an optical disk system that uses the surface-emission laser diode of any of the first through thirteenth modes of the present invention or the surface-emission laser array of the fourteenth mode of the present invention as the read/out optical source.

With the use of the surface-emission laser diode of any of the first through thirteenth modes of the present invention or the surface-emission laser array of the fourteenth mode, it becomes possible to obtain high output power while maintaining the single fundamental mode laser oscillation. Further, it becomes possible to obtain an output laser beam having a circular cross section. Thereby, it becomes possible to construct a highly reliable optical disk system. Particularly, by using the laser diode in the form of array, it becomes possible to construct a high-speed optical disk system capable of reading and/or writing with high density.

EXAMPLE 1

FIG. 1 shows a surface-emission laser diode according to Example 1 of the present invention, wherein the laser diode of FIG. 1 is a surface-emission laser diode having an active layer formed of a multiple quantum well structure of GaAs/$Al_{0.15}Ga_{0.85}As$ and operating in the 0.85 μm band.

Hereinafter, the fabrication process of the surface-emission laser diode will be explained according to the fabrication process thereof.

Referring to FIG. 1, the surface-emission laser diode is based on the layered structure formed by an organic metal chemical vapor deposition (MOCVD) process, wherein the layered structure is formed by using trimethyl aluminum (TMA), trimethyl gallium (TMG) and trimethyl indium (TMI) for the source of the group III elements and by using an arsine ($AsH_3$) gas for the group V source. Further, $CBr_4$ is used for the p-type dopant and $H_2Se$ is used for the n-type dopant.

More specifically, the device of FIG. 1 is constructed on an n-GaAs substrate 101 and includes an n-GaAs buffer layer 102 formed on the substrate 101, and an n-$Al_{0.9}Ga_{0.1}As$/$Al_{0.15}Ga_{0.85}As$ lower semiconductor distributed Bragg reflector 103 is formed on the buffer layer 102, wherein the lower distributed Bragg reflector 103 includes therein repetition of an n-$Al_{0.9}Ga_{0.1}As$/$Al_{0.15}Ga_{0.85}As$ pair repeated for 36 times.

Further, a cavity spacer layer 104 of undoped $Al_{0.15}Ga_{0.85}As$ is formed on the lower distributed Bragg reflector 103, and a multiple quantum well active layer 105 of $GaAs/Al_{0.15}Ga_{0.85}As$ is formed further on the cavity spacer layer 104.

Further, another cavity spacer layer 106 of undoped $Al_{0.15}Ga_{0.85}As$ is formed on the active layer 105, and a p-$Al_{0.9}Ga_{0.1}As/Al_{0.15}Ga_{0.85}As$ upper semiconductor distributed Bragg reflector 107 is formed on the cavity spacer layer 106, wherein the upper semiconductor distributed Bragg reflector 107 includes therein repetition of a p-$Al_{0.9}Ga_{0.1}As/Al_{0.15}Ga_{0.85}As$ pair repeated for 20 times. Further, the uppermost $Al_{0.15}Ga_{0.85}As$ layer of the upper distributed Bragg reflector 107 is doped with a p-type dopant (carbon) with high concentration level at the surface part thereof to form a contact layer (not shown).

Further, there is provided a p-type AlAs selectively oxidizing layer 108 inside the P—$Al_{0.9}Ga_{0.1}As/Al_{0.15}Ga_{0.85}As$ layer for current confinement. Here, the p-AlAs selectively oxidizing layer 108 includes an oxidized region (shown in black; the same designation is used also in other Examples) formed by selective oxidation from the etching edge surface in a high temperature ambient containing water vapor and a non-oxidized region.

It should be noted that the surface-emission laser diode includes a square-shaped mesa structure formed by the steps of: forming, after the crystal growth process of the layered structure, a square resist pattern having a size of 30 μm for each edge, on the layered structure formed by the crystal growth process by a known photolithographic process, and removing the layered structure starting from the top surface of the P—$Al_{0.9}Ga_{0.1}As/Al_{0.15}Ga_{0.85}As$ upper distributed Bragg reflector to a mid position of the n-$Al_{0.9}Ga_{0.1}As/Al_{0.15}Ga_{0.85}As$ lower distributed Bragg reflector 103.

Next, there is formed a resist opening of a square shape in alignment with the central part of the mesa structure, and ion implantation of oxygen molecules is made into the central part of the mesa structure while using the resist pattern as a mask. Thereby, the oxygen ions are injected into an oxygen ion implantation region 113.

Next, the resist is removed, and a selective oxidation is made for the p-AlAs selective oxidizing layer 108 in a high temperature ambient containing water vapor in the direction parallel to the substrate, starting from the etching edge surface to the central part of the mesa structure. Thereby, there is formed a current confinement structure as a result of such a selective oxidation process.

At the same time to the selective oxidation processing conducted in the high temperature ambient containing water vapor, there is achieved an annealing process in the oxygen ion implantation region 113, and oxidation of the $Al_{0.9}Ga_{0.1}As$ mixed crystal proceeds simultaneously in the region 113. Thereby, there is formed a selective oxidation region of relatively low refractive index at the central part of the mesa structure in correspondence to the region 113, wherein the selective oxidation region has a refractive index lower than the refractive index of the surrounding region. In the illustrated example, the region 113 of oxygen ion implantation has an edge length of 15 μm, while the current confinement region has an edge length of 10 μm.

Next, an $SiO_2$ layer 109 is formed on the entire wafer surface by a CVD process. After formation of the $SiO_2$ layer 109, there is conducted a spin coating process of an insulating resin layer 110, and the insulating resin layer is removed from the mesa region.

Next, the $SiO_2$ layer 109 is removed in correspondence to the part where the insulation resin layer has been removed, and a square resist pattern is formed in correspondence to an optical beam exit region to be formed on the mesa structure, with an edge length of 10 μm. Further, a p-type electrode material is deposited by an evaporation deposition process, and the electrode material thus deposited is removed in correspondence to the foregoing beam exit part by a liftoff process. With this, a p-side electrode 111 is formed.

Next, the rear surface of the n-GaAs substrate 101 is polished, and an n-side electrode 112 is formed on the rear surface of the substrate by an evaporation deposition process. Further, ohmic contact is achieved for each of the electrodes 111 and 112 by conducting an annealing process.

Figure 2:
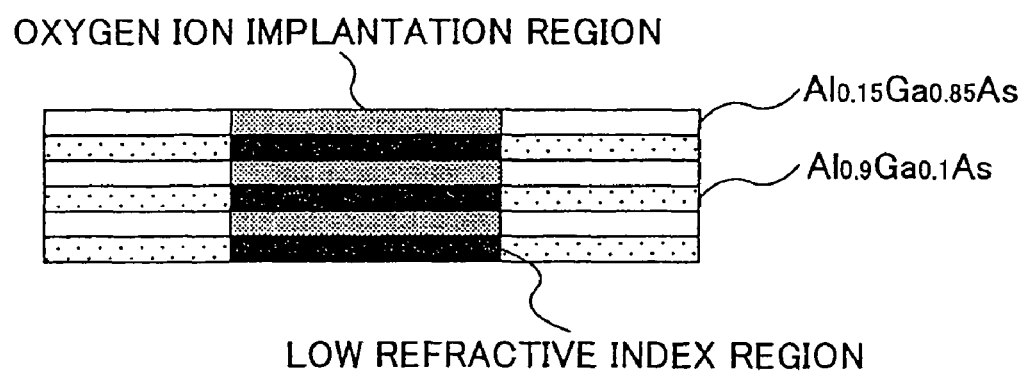
FIG. 2 is a diagram showing a part of the region of FIG. 1 in which oxygen ion implantation is made in detail.

FIG. 2 is a diagram showing a part of the region 113 in which the oxygen ion implantation has been conducted in FIG. 1.

It should be noted that the $Al_{0.9}Ga_{0.1}As$ mixed crystal located in the region where the oxygen ion implantation has been made undergoes oxidation with the thermal annealing process conducted after the oxygen ion implantation process by causing reaction with the Al atoms, and as a result, there is formed a region of relatively low refractive index (shown in black) wherein such a region has a relatively low refractive index as compared with the surrounding mixed crystal of $Al_{0.9}Ga_{0.1}As$. Thereby, there is formed an antiguiding structure in the cavity structure. Here, it should be noted that an AlGaAs mixed crystal shows an oxidation rate that increases with the Al content. ON the other hand, there occurs little oxidation in the GaAs layer in the present device.

It should be noted that, with regard to the oxidation structure constituting the antiguiding structure at the mesa central part, all what is required is that it has a relatively low refractive index as compared with the surrounding region. Thus, it is not necessary that the AlGaAs mixed crystal is completely oxidized. In other words, it is possible with the device of the present example to adjust the dose of oxygen ion implantation such that there is obtained a refractive index profile in conformity with the design.

Here, it should be noted that the AlGaAs mixed crystal, which is subjected to the oxygen ion implantation after formation thereof, is formed to have a thickness in anticipation of the refractive index and film thickness after the ion implantation and thermal annealing process already at the time of the crystal growth process, such that the phase condition of multiple reflection of the distributed Bragg reflector is met.

Thus, the region where there occurs a decrease of the refractive index after the ion implantation and thermal annealing process, constitutes the low refractive index layer of the distributed Bragg reflector after the oxygen ion implantation and thermal annealing process. Thus, it should be noted that the p-$Al_{0.9}Ga_{0.1}As$ layer to which the ion implantation is to be made has a thickness different from the p-$Al_{0.9}Ga_{0.1}As$ layers above and below. More specifically, such a layer is formed to have an increased thickness as compared with other p-$Al_{0.9}Ga_{0.1}As$ layers in view of the change of the refractive index to be caused therein. Including the oxygen ion implantation region, the thickness of the layers constituting the distributed Bragg reflector is chosen so as to satisfy the phase condition of multiple reflection of the Bragg reflector. In other words, the thickness of the layers constituting the distributed Bragg reflector is chosen such that there occurs a phase change of $\pi/2$ in each of the layers for the laser oscillation beam.

By setting the thickness of the AlGaAs mixed crystal in the ion implantation region such that the Bragg condition is satisfied with the refractive index after the oxidation processing, there is achieved a high reflectance at the mesa central part (where the oxygen ion implantation has been made) at the resonant wavelength, while there occurs a decrease of reflectance in the region offset from the mesa central part near the mesa peripheral part where no oxygen ion implantation has been made, because of offset from the phase condition. Because the higher-order transverse mode has large mode amplitude in such a region where the reflectivity is decreased, there occurs an increase of mirror loss with such a region, and the effect of suppressing the laser oscillation in higher-order transverse mode is even more enhanced.

With the surface-emission laser diode of FIG. 1, the higher-order transverse mode is displaced toward the peripheral part of the mesa structure due to the existence of the antiguiding structure of low refractive index region formed by the oxygen ion implantation into the AlGaAs mixed crystal and subsequent annealing process as represented in FIG. 3B, and overlapping of the higher-order transverse mode distribution with the gain region, which is determined by the current injection diameter and shown in FIG. 3B schematically, is reduced. Further, in view of the decrease of reflectivity of the distributed Bragg reflector at the peripheral part of the mesa structure, the laser oscillation with the higher-order transverse mode is effectively suppressed. The laser diode could maintain the single fundamental transverse mode up to higher output power as compared with a conventional device.

EXAMPLE 2

Figure 4:
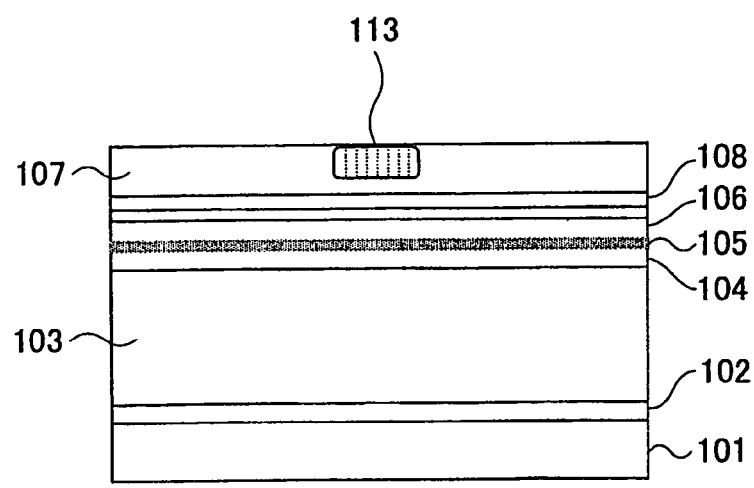
FIG. 4 is a diagram explaining the surface-emission laser element of Example 2.
Figure 5:
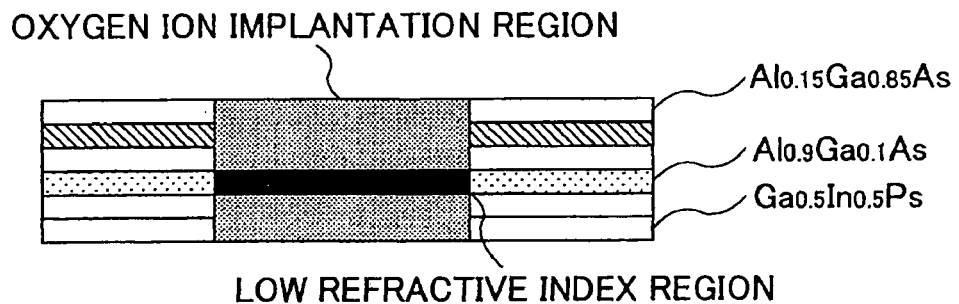
FIG. 5 is a diagram explaining the surface-emission laser element of Example 2.

FIGS. 4 and 5 are diagrams for explaining the surface-emission laser diode according to Example 2 of the present invention.

Referring to FIG. 4, the laser diode of Example 2 is formed similarly to the laser diode of FIG. 1 up to an intermediate part of the p-type distributed Bragg reflector by a crystal growth process.

With Example 2, the crystal growth is made up to the foregoing intermediate part of the p-type distributed Bragg reflector, wherein the crystal growth is interrupted in this state and ion implantation of the molecules containing oxygen is conducted to the region that forms the central part of the mesa structure. After the ion implantation process, thermal annealing process is conducted for recovering the crystal defects caused by ion implantation, and the remaining part of the device is formed by conducting a regrowth process.

As a result of the thermal annealing process conducted for recovering the crystal defect and as a result of the heating at the time of the regrowth process of forming the remaining part of the device, the region 113 where the oxygen ion implantation has been made is selectively oxidized, and an antiguiding structure characterized by a low refractive index as compared with the surrounding region is formed in correspondence to the region 113.

As a result of such a fabrication process, it becomes possible to make a shallow oxygen ion implantation, and it becomes possible to achieve a very steep ion implantation profile with excellent controllability. Thereby, it becomes possible to confine the region of modified refractive index formed as a result of the thermal annealing process with high precision in the growth direction, and the adjustment of phase condition of multiple reflection in the distributed Bragg reflector is facilitated substantially.

Further, as shown in FIG. 5, it is possible to adjust the phase condition more precisely by providing a distributed Bragg reflector of $Ga_{0.5}In_{0.5}P/Al_{0.15}Ga_{0.85}As$ before and after the distributed Bragg reflector of $Al_{0.9}Ga_{0.1}As/Al_{0.15}Ga_{0.85}As$.

More specifically, FIG. 5 shows the example in which a distributed Bragg reflector of $Ga_{0.5}In_{0.5}P/Al_{0.15}Ga_{0.85}As$ is provided adjacent to the distributed Bragg reflector formed of one pair $Al_{0.9}Ga_{0.1}As/Al_{0.15}Ga_{0.85}As$.

Here, it should be noted that $Ga_{0.5}In_{0.5}P$ can be grown in lattice matching with a GaAs substrate and that it does not contain Al as a constituent element. Thus, there occurs little oxidation in the $Ga_{0.5}In_{0.5}P$ layer even in the case there has been conducted oxygen ion implantation.

Thus, by using such a $Ga_{0.5}In_{0.5}P$ layer, it becomes possible to carry out oxidation of a specific AlGaAs layer even in the case there exists a range in the depth distribution of the injected oxygen atoms. Further, it becomes possible to adjust the reflection wavelength of the distributed Bragg reflector at the mesa central part (reflection wavelength for the fundamental transverse mode) more precisely and with excellent controllability, by selectively oxidizing a specific AlGaAs layer.

Further, by interrupting the growth of the upper distributed Bragg reflector with Example 2 as shown in FIG. 4 and conducting the oxygen ion implantation in advance to the growth of the remaining part of the distributed Bragg reflector, it becomes possible to obtain a steep ion implantation profile for the oxygen atoms. Further, by providing the $Ga_{0.5}In_{0.5}P/Al_{0.15}Ga_{0.85}As$ distributed Bragg reflector as shown in FIG. 5, the region of selective oxidation by ion implantation process is controlled more precisely. Because of the steep ion implantation profile, the number of layers of the $Ga_{0.5}In_{0.5}P/Al_{0.15}Ga_{0.85}As$ distributed Bragg reflector provided for preventing unwanted oxidation can be reduced, and the adversary effect on the reflectivity of the distributed Bragg reflector can be held minimum.

With the surface-emission laser diode of Example 2 thus fabricated, the distribution of higher-order transverse mode is shifted to the peripheral part of the mesa structure as shown in FIG. 3B as a result of existence of the antiguiding structure formed by selective oxidation conducted by the oxygen ion implantation into the AlGaAs mixed crystal and subsequent thermal annealing process, similarly to the device of Example 1.

Thereby, overlapping of the higher-order transverse mode with the gain region, represented in FIG. 3B schematically and determined by the current injection diameter, is reduced. Further, because of the decrease of the reflectivity of the distributed Bragg reflector at the peripheral part of the mesa structure, laser oscillation with the higher-order transverse mode is effectively suppressed and it becomes possible to maintain the single fundamental transverse mode laser oscillation up to the state of high output power. Further, because it is possible to control the reflection condition of the distributed Bragg reflector with excellent controllability, it becomes possible to obtain the laser diode with excellent characteristics such as the oscillation threshold characteristics.

EXAMPLE 3

Figure 6:
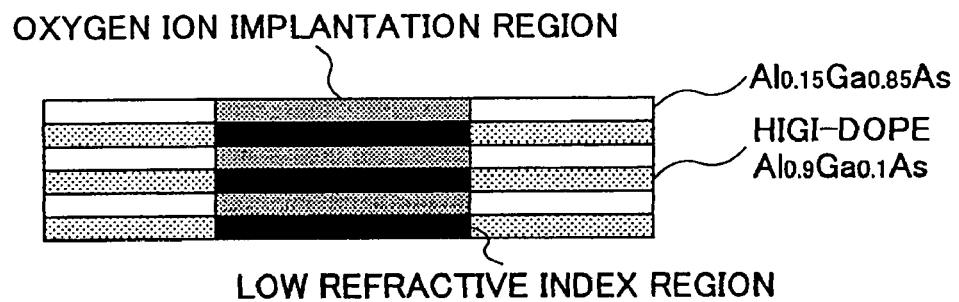
FIG. 6 is a diagram explaining the surface-emission laser element of Example 3.

FIG. 6 explains the surface-emission laser diode of Example 3.

Referring to FIG. 6, it will be noted that the construction of the region surrounding the antiguiding structure 113 in the surface-emission laser diode of FIG. 1 is changed in the case of the device of Example 3.

In more detail, in the example of FIG. 6, the $Al_{0.9}Ga_{0.1}As$ mixed crystal layer provided for forming the low refractive index layer after the selective oxidation process conducted by ion implantation of the molecules containing oxygen and subsequent thermal annealing process, is grown with increased doping concentration level as compared with the $Al_{0.9}Ga_{0.1}As$ layers used for other regions. The process of device fabrication itself is identical with the case of the device of Example 1.

It should be noted that a semiconductor material doped to high concentration level shows distinctive optical absorption caused by free carrier absorption. In the case of a p-type semiconductor, in particular, there appears intra-valence band absorption in addition to the foregoing free carrier absorption, and because of this, such a semiconductor material shows the nature of increased optical absorption for the long-wavelength band optical radiation.

Thus, with the device of Example 3, in which the $Al_{0.9}Ga_{0.1}As$ layer that constitutes the low refractive index region after being applied with the selective oxidation process conducted by the ion implantation process and subsequent thermal annealing process, is formed with high concentration doping at the time of the crystal growth process thereof, it becomes possible to decrease the serial resistance of the p-type distributed Bragg reflector and further increase the absorption loss at the antiguiding structure part due to the free carrier absorption and intra-valence band absorption.

On the other hand, in the part of such a p-type $Al_{0.9}Ga_{0.1}As$ layer where the oxygen ion implantation has been made, there occurs formation of insulation material of AlOx, which is transparent to the oscillation wavelength.

Thus, the absorption loss is vanished with regard to the fundamental transverse mode having a large mode amplitude at the central part of the mesa structure (ion injection region), and there appears absorption only to the higher-order transverse mode having a large mode amplitude in the region offset from the mesa central region and close to the periphery of the mesa structure. Thus, with Example 3, it becomes possible to suppress the laser oscillation at higher-order transverse mode as a result of such increase of the absorption loss.

Figure 7:
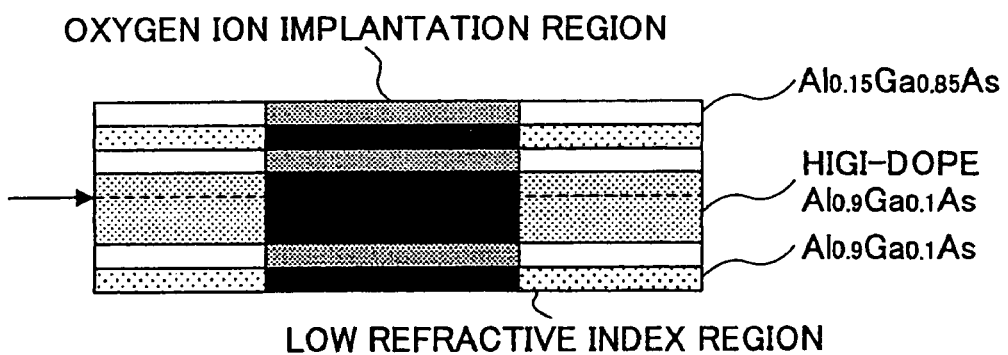
FIG. 7 is a diagram showing a different construction of the oxygen ion implantation region of the surface-emission laser element of Example 1.

Further, with the laser diode of Example 3, it is possible to enhance the absorption of the higher-order transverse mode by using the construction of FIG. 7.

FIG. 7 shows another example of the oxygen ion injection region 113 of the surface-emission laser diode of Example 1.

Referring to FIG. 7, there is provided an $Al_{0.9}Ga_{0.1}As$ layer doped to the p-type with high concentration level similarly with the example of FIG. 6, except that there is provided an $Al_{0.9}Ga_{0.1}As$ layer with the thickness of $3/4\lambda$.

In a standing wave formed in a distributed Bragg reflector, the node and anti-node of electric field are repeated alternately in the thickness direction with separation of $\lambda/4$ (each $\pi/2$ in terms of phase). In an $n\lambda$ cavity, the interface crossing from an $Al_{0.9}Ga_{0.1}As$ layer to an $Al_{0.15}Ga_{0.85}As$ as viewed from the cavity becomes a node of the electric field. Further, the interface crossing from $Al_{0.15}Ga_{0.85}As$ to $Al_{0.9}Ga_{0.1}As$ as viewed from the cavity forms an anti-node of the electric field.

Thus, with the construction of FIG. 7 that includes the $Al_{0.9}Ga_{0.1}As$ layer with the thickness of $3/4\lambda$, there inevitably occurs a situation that the $Al_{0.9}Ga_{0.1}As$ includes the anti-node of the standing wave. In FIG. 7, it should be noted that the anti-node of the standing wave is formed at a location indicated by an arrow.

In such a location corresponding to the anti-node of the standing wave, the electric field strength of the optical radiation takes a large value, while there occurs strong absorption at this location because of the use of the $Al_{0.9}Ga_{0.1}As$ layer doped with high concentration level. Thus, it becomes possible to increase the absorption loss of the higher-order transverse mode further as explained above, and the laser oscillation in higher-order transverse mode is suppressed more effectively.

By doping the AlGaAs layer that constitutes the antiguiding structure after conversion to low refractive index region by conducting selective oxidation including the steps of ion implantation of the molecules containing oxygen and subsequent thermal annealing process, such that the AlGaAs layer has high doping concentration as compared with other AlGaAs layers at the time of the crystal growth thereof, it becomes possible to form an absorption region of the higher-order transverse optical radiation around the low refractive index region. Thus, with the laser diode of Example 3, it becomes possible to maintain the single fundamental transverse mode laser oscillation up to high output power state.

EXAMPLE 4

Figure 8:
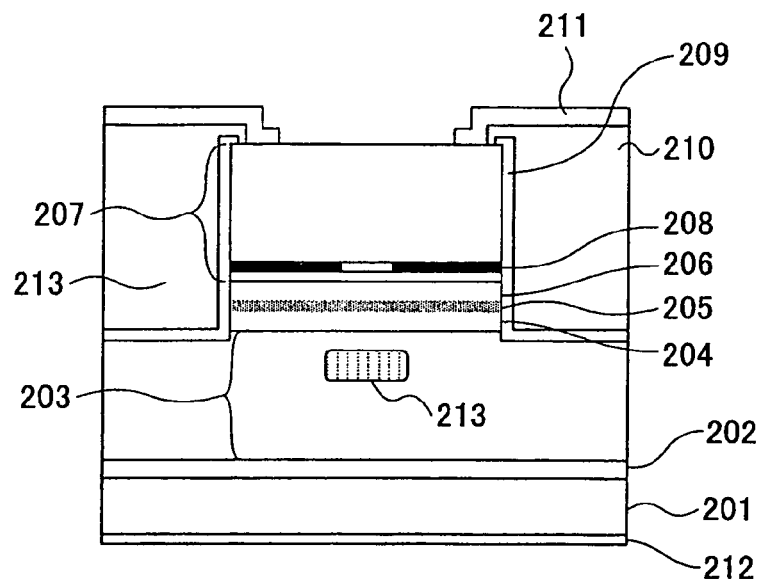
FIG. 8 is a diagram showing the surface-emission laser element of Example 4.

FIG. 8 is a diagram showing the surface-emission laser diode of Example 4, wherein the surface-emission laser diode of FIG. 8 is a device that uses a GaInNAs/GaAs multiple quantum well structure for the active layer and operates in the 1.3 μm band.

Hereinafter, the laser diode of FIG. 8 will be explained according to the fabrication process thereof.

Referring to FIG. 8, the surface-emission laser diode includes a semiconductor layered structure formed of an MOCVD process similarly to the device of Example 1, wherein the growth of the layered structure is conducted by using trimethyl aluminum (TMA), trimethyl gallium (TMG) and trimethyl indium (TMI) for the source of the group III element and arsine ($AsH_3$) gas for the source of the group V element. Further, $CBr_4$ is used for the p-type dopant while H2Se is used for the n-type dopant. Further, dimethyl hydrazine (DMHy) is used for the nitrogen source of the active layer.

More in detail, the device of FIG. 8 is formed on an n-GaAs substrate 201 and includes an n-GaAs buffer layer 202 formed on the n-GaAs substrate 201, wherein a lower semiconductor distributed Bragg reflector 203 including therein 36 repetitions of an n-$Al_{0.9}Ga_{0.1}As$/GaAs pair is formed on the n-GaAs buffer layer 202.

Further, a cavity spacer layer 204 of non-doped GaAs, a multiple quantum well active layer 205 of GaInNAs/GaAs structure, and a cavity spacer layer of undoped GaAs are formed on the lower semiconductor distributed Bragg reflector 203 consecutively, and an upper semiconductor distributed Bragg reflector 207 of p-$Al_{0.9}Ga_{0.1}As$/GaAs structure including 20 repetitions of the p-$Al_{0.9}Ga_{0.1}As$/GaAs pair is formed on the undoped GaAs cavity spacer layer 206. Further, there is formed a contact layer (not shown) in the GaAs layer at the uppermost layer of the upper distributed Bragg reflector 207 by increasing the doping concentration of the p-type dopant (carbon) at the surface part of the contact layer. Further, there is provided a p-AlAs selectively oxidizing layer 208 inside the foregoing p-$Al_{0.9}Ga_{0.1}As$/GaAs upper semiconductor distributed Bragg reflector.

With the device of FIG. 8, it should be noted that the growth of the n-type distributed Bragg reflector 203 is interrupted during the crystal growth process thereof, wherein there is conducted an oxygen ion implantation process to the mesa central part similarly to the device of Example 2. Further, a recovering annealing process is conducted, and crystal growth of the remaining part of the device structure is conducted thereafter.

At the time of the thermal annealing process for recovering the crystal defects and the crystal growth process for growing the remaining part of the device structure, the region 213 injected with oxygen undergoes selective oxidation, and as a result, there is formed an antiguiding structure of low refractive index in correspondence to the region 213.

Thereafter, the processes such as mesa formation, selective oxidation of the p-AlAs selective oxidizing layer 208, which is conducted in the high temperature water vapor ambient, planarization by filling the trenches at both sides of the mesa structure by a resin, and formation of electrodes are conducted similarly to the process of Example 1, and with this the surface-emission laser diode of FIG. 8 is obtained.

It will be noted that the surface-emission laser diode of Example 4 is distinct over the device of Examples 1-3 in the point that the antiguiding structure 213 of low refractive index layer formed by the ion implantation process and subsequent thermal annealing process, is now provided inside the n-type distributed Bragg reflector. Here, the layers surrounding the antiguiding structure can be formed similarly to any of Examples 1-3, except that the conductivity type thereof is changed from p-type to n-type.

By forming the antiguiding structure inside the n-type distributed Bragg reflector as in the case of the device of Example 4, it becomes possible to suppress the higher-order transverse mode efficiently similarly to Examples 1-3, and at the same time, it becomes possible to reduce the device resistance significantly.

In the case an antiguiding structure is provided in a p-type semiconductor layer so as to overlap spatially with the current injection region, the holes avoid the antiguiding structure as it flows through the device structure and are injected into the active layer after being confined by the current confinement structure to the central part of the mesa structure. Thereby, there arises a problem that the current path of the holes is elongated and that the current path is narrowed. Further, because the carrier mobility is smaller in a p-type semiconductor material as in an n-type semiconductor material by the order of one, this also contributes to the increase of device resistance.

In the case of Example 4 in which the antiguiding structure is formed in the n-type distributed Bragg reflector, there occurs little increase of resistance in view of the fact that there is provided no current confinement structure between the antiguiding structure and the active layer and in view of the inherently large mobility of electrons, even in the case there exists an insulation or high resistance region at the central part of the mesa structure. Thus, it becomes possible to suppress the device resistance substantially equal to the case of conventional devices having no antiguiding structure. Because the antiguiding structure performs similarly against the transverse mode in any of the cases in which it is provided in the p-type distributed Bragg reflector and in which it is provided in the n-type distributed Bragg reflector, and thus, it is possible to obtain an effect similar to Examples 1 and 2 in the device of Example 4.

With the device of Example 4, it is possible to operate in single fundamental mode up to high output state similarly to the device of Examples 1-3, while the device of Example 4 can reduce the device resistance further. With reduced device resistance, it becomes possible to achieve operation with higher output power.

EXAMPLE 5

Figure 9:
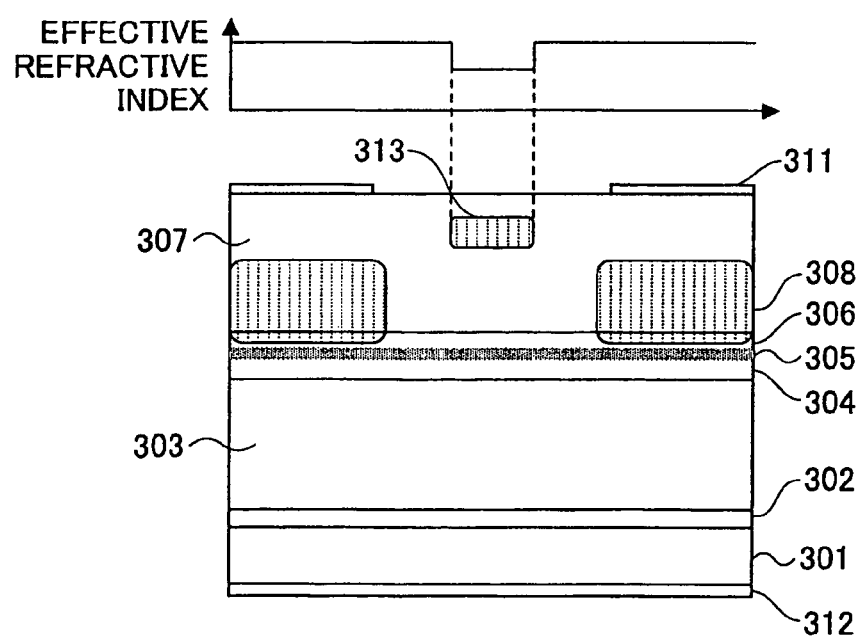
FIG. 9 is a diagram showing the surface-emission laser element of Example 5.

FIG. 9 shows the surface-emission laser diode according to Example 5 of the present invention, wherein the device of FIG. 9 is a surface-emission laser diode having a GaInNAs/GaAs multiple quantum well structure for the active layer and operable in the 1.3 μm band.

Hereinafter, the structure thereof will be explained together with the fabrication process.

Referring to FIG. 9, the surface-emission laser diode uses a layered structure formed similarly to the device of Example 4.

More specifically, the device of FIG. 9 is constructed on an n-GaAs substrate 301 carrying thereon an n-GaAs buffer layer 302, wherein there is provided a lower semiconductor Bragg reflector 303 including therein 36 repetitions of an n-$Al_{0.9}Ga_{0.1}As$/GaAs pair.

On the lower semiconductor distributed Bragg reflector 302, there is provided a non-doped GaAs cavity spacer layer 304, and an active layer 305 of GaInNAs/GaAs multiple quantum well structure is formed on the cavity spacer layer 304.

Further, an undoped GaAs cavity spacer layer 306 is formed on the active layer 305, and an upper distributed Bragg reflector 307 including therein 20 repetitions of a p-$Al_{0.9}Ga_{0.1}As$/GaAs pair is formed on the upper cavity layer 306. Further, a contact layer (not shown) is formed by the uppermost GaAs layer of the upper distributed Bragg reflector 307, wherein the contact layer is doped with a p-type dopant (carbon) with high concentration level at the surface part thereof.

After formation of the layered structure by the foregoing crystal growth process, there is formed a square resist opening having an edge length of 3 μm by a known photolithographic process with the surface-emission laser diode of FIG. 9, and oxygen ion implantation is conducted thereto from the surface of the p-$Al_{0.9}Ga_{0.1}As$/GaAs upper semiconductor distributed Bragg reflector 307. After thermal annealing process causing selective oxidation in the oxygen ion injection part, there is formed an antiguiding structure formed of a low refractive index region 313 in the p-type distributed Bragg reflector 307.

FIG. 9 also shows the effective refractive index profile in the direction parallel to the substrate surface. As can be seen in FIG. 9, the part provided with the low refractive index region has a relatively smaller effective refractive index.

Thereafter, a resist pattern having a size of 10 μm is formed in alignment with region where the oxygen ion implantation has been made, and hydrogen ion implantation is conducted into the laser structure while using the resist pattern as a mask, such that the hydrogen ions are distributed with a peak depth deeper than the peak depth of the oxygen ions. With this, the resistance of the device structure is increased in correspondence to the part where the hydrogen ion implantation has been made. Here, it should be noted that the desired high resistance region can be formed also by conducting oxygen ion implantation process in place of the hydrogen ion implantation process.

Next, a p-side electrode 311 is formed on the device surface and an n-side electrode 312 is formed on the rear surface of the substrate 301 after polishing such a rear surface. Further, there are formed ohmic contact with such p-side electrode 311 and the n-side electrode 312 by conducting a thermal annealing process.

Here, it should be noted that there occurs little refractive index change at the part where the hydrogen ion implantation has been made with such a surface-emission laser diode that uses a current confinement structure formed by the hydrogen ion implantation process. This means that such a laser diode lacks a built-in optical confinement structure (guiding structure), and because of this, the effect of the antiguiding structure over the mode distribution is increased as compared with the surface-emission laser diode that uses oxidation confinement.

Thus, with the laser diode of Example 5, it becomes possible to displace the higher-order transverse mode to the region outside the gain region with excellent efficiency, and laser oscillation with higher-order transverse mode can be suppressed with further high efficiency.

In the device of Example 5, it should be noted that the region of oxygen ion implantation is provided close to the device surface for avoiding excessive effect to the fundamental transverse mode. Further, the width of the oxygen ion implantation region is set to about 3 μm for the same purpose.

Further, in order to increase the resistance of the p-type Bragg reflector 307, the laser diode of Example 5 avoids overlapping of the oxygen ion injection region and the hydrogen ion injection region by increasing the acceleration voltage at the time of the hydrogen ion implantation process. With the device of Example 5, it becomes possible to obtain a single fundamental transverse mode operation up to very high output state.

Figure 10:
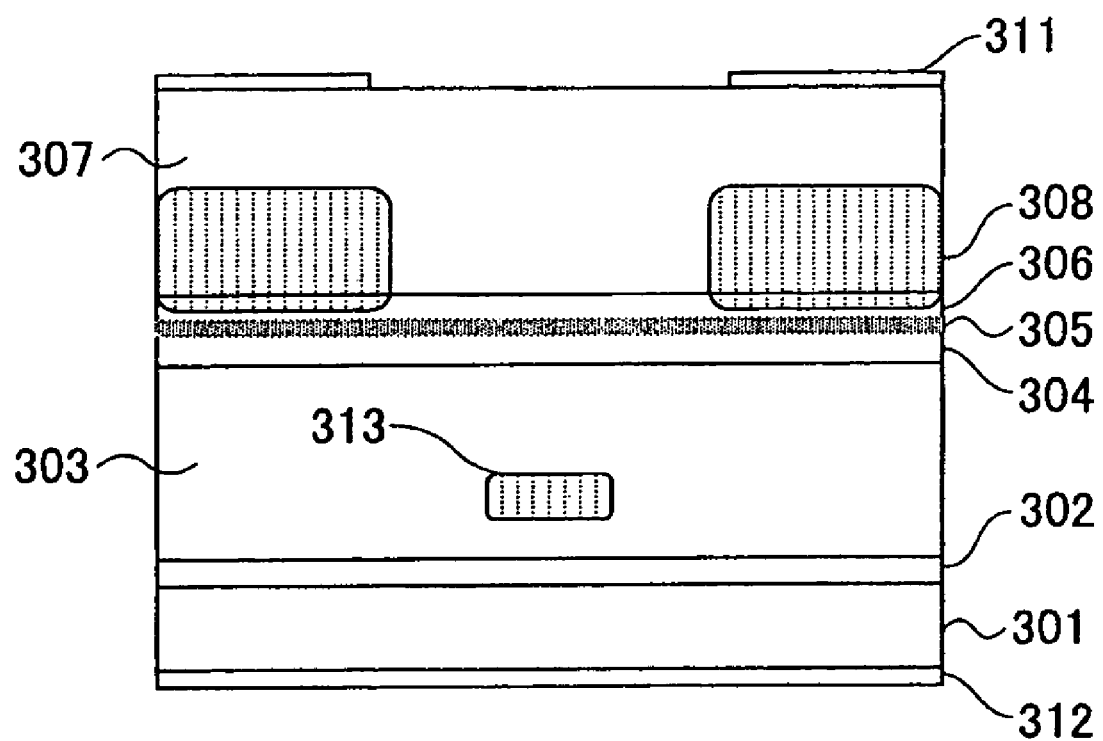
FIG. 10 is a diagram showing an example in which the antiguiding structure is provided inside an n-type distributed Bragg reflector in the surface-emission laser element of FIG. 9 similarly to the case of Example 4.

FIG. 10 shows an example in which the antiguiding structure 313 is formed inside the n-type distributed Bragg reflector similarly to the device of Example 4.

Thus, in the example of FIG. 10, the crystal growth process for forming the n-type distributed Bragg reflector 303 is interrupted and the region 313 of oxygen ion implantation is subjected to selective oxidation by conducting ion implantation of molecules containing oxygen, followed by thermal annealing process. Thereafter, the remaining part of device is formed by resuming the crystal growth process.

With the device of FIG. 10, in which the antiguiding structure is provided inside the n-type distributed Bragg reflector, it becomes possible to reduce the device resistance similarly to the device of Example 4, in addition to the very large effect of suppressing the higher-order transverse mode laser oscillation similarly to the device of FIG. 9.

In fact, the device of Example 5 can perform the single fundamental transverse mode operation up to very high output state, while maintaining sufficiently low device resistance. Because of the reduced device resistance, the surface-emission laser diode 5 of Example 5 can provide further higher output operation.

EXAMPLE 6

FIGS. 11A and 11B are diagrams showing the surface-emission laser diode of Example 6, wherein it should be noted that FIG. 11B shows a plan view of the laser diode of FIG. 11A. The surface-emission laser diode of FIGS. 11A and 11B is a laser diode having an active layer of GaInNAs/GaAs multiple quantum well structure and operating in the 1.3 μm wavelength band.

Hereinafter, the device structure will be explained together with the fabrication process thereof.

The surface-emission laser diode of FIGS. 11A and 11B is formed by conducting a crystal growth process similar to the one used with Example 4.

More specifically, the device of FIGS. 11A and 11B is constructed on an n-GaAs substrate 301 carrying thereon a n-GaAs buffer layer 302, wherein the n-GaAs buffer layer 302 carries thereon a lower semiconductor distributed Bragg reflector 303 including therein 36 repetitions of an n-$Al_{0.9}Ga_{0.1}As$/GaAs pair. Further, an undoped GaAs cavity spacer layer 304 is formed on the lower semiconductor distributed Bragg reflector 303, and an active layer 305 of GaInNAs/GaAs multiple quantum well structure is formed on the GaAs cavity spacer layer 304.

On the active layer 305, there is provided another cavity spacer layer 306 of undoped GaAs, and an upper distributed Bragg reflector 307 including therein 20 repetitions of a p-$Al_{0.9}Ga_{0.1}As$/GaAs pair is formed further on the cavity spacer layer 306.

Further, there is provided a contact layer (not shown) in correspondence to the GaAs layer at the uppermost part of the upper distributed Bragg reflector 307 such that there is provided a high concentration doping of p-type dopant (carbon) at the surface part of such a GaAs layer.

After the crystal growth process, there is formed a square resist pattern having a resist opening in correspondence to the low refractive index regions 1 and 2 of FIG. 11B by using a known photolithographic process, and oxygen ion implantation is conducted through the surface of the P—$Al_{0.9}Ga_{0.1}As$/GaAs upper semiconductor distributed Bragg reflector while using the resist pattern as a mask.

Next, a thermal annealing process is conducted and there is achieved a selective oxidation process in correspondence to where the ion implantation of oxygen has been made. Thereby, the low refractive index region 1 serving for the antiguiding structure is formed at the central part of the device and the low refractive index region 2 (cladding region) is formed at the peripheral part of the device for confining the transverse mode.

Here, it should be noted that the opening d1 of the resist pattern corresponding to the low refractive index region 1 is set to have a size of 5 μm, while the opening d2 of the resist pattern corresponding to the low refractive index region 2 is set to have a size of 30 μm.

FIG. 11A also shows the effective refractive index profile in the direction parallel to the substrate surface.

Referring to FIG. 11A, it can be seen that the effective refractive index is reduced relatively in correspondence to the part where the low refractive index region is provided. Further, Further, it can be seen that there is formed a high refractive index region at both sides of the low refractive index core at the central part of the device. Further, it can be seen that there is formed a cladding region of low refractive index region at further outer side of the high refractive index region.

After this, there is formed a square resist pattern in alignment with the oxygen ion implantation part, and ion implantation of hydrogen is conducted into the device structure while using the resist pattern as a mask, such that the hydrogen distribution peak is located at a level deeper than the oxygen distribution peak in the oxygen distribution part. With this, the resistance of the layered structure is increased in correspondence to the hydrogen ion injection part. In the present example, the resist pattern is formed to have the edge size d3 of 8 μm.

It should be noted that the foregoing high resistance region can be formed also by ion implantation of oxygen.

Next, a p-side electrode 311 is formed on the device surface and an n-side electrode 312 is formed on the rear surface of the substrate 301 after polishing of the rear surface. Further, by conducting an annealing process, the p-side electrode 311 and the n-side electrode 312 form an ohmic contact.

With the surface-emission laser diode that uses the current confinement structure formed by hydrogen ion implantation process, there is little refractive index change in the part where the hydrogen ion implantation has been made, while this means that such a laser diode does not have a built-in optical confinement structure (waveguide structure). In such a laser diode, the antiguiding structure provides a larger effect as compared with the case of forming such an antiguiding structure in a surface-emission laser diode having oxidized current confinement structure.

Thus, the use of the antiguiding structure in such a surface-emission layer diode of hydrogen ion implantation type enhances the effect of displacing the higher-order mode distribution to the peripheral part of the device structure.

On the other hand, there is a tendency with such a structure that there occurs extensive lateral mode leakage, while such lateral mode leakage increases the optical loss. The surface-emission laser diode of the present example successfully eliminates the problem of optical loss caused by mode leakage, by providing the cladding structure at the peripheral part of the device in the form of outer low refractive index region.

Further, it should be noted that the effective refractive index in the low refractive index regions 1 and 2 can be adjusted by adjusting the thickness and depth of the Al oxidation region.

It should be noted that the oxygen ion implantation into the low refractive index regions 1 and 2 can be conducted separately in two different steps, by using different acceleration voltages and different ion currents.

Further, it is possible to use different values for various sizes of the surface-emission laser diode of the present embodiment. By choosing the sizes appropriately and by optimizing the ion implantation condition such that there occur increase of coupling between the fundamental transverse mode and the gain region and such that coupling between the higher-order transverse mode and the gain region is decreased, the effect of the present invention can be increased further.

From the foregoing, the laser diode of Example 6 can perform the single fundamental transverse mode operation up to higher output states.

EXAMPLE 7

FIGS. 12A and 12B are diagrams showing the surface-emission laser diode of Example 7, wherein it should be noted that FIG. 12B shows a plan view of the laser diode of FIG. 12A. The surface-emission laser diode of FIGS. 12A and 12B is a laser diode having an active layer of GaInAs/GaAs multiple quantum well structure and operating in the 0.98 μm wavelength band.

Hereinafter, the device structure will be explained together with the fabrication process thereof. The laser diode of FIGS. 12A and 12B are grown with similar methods and similar means to the case of Example 4.

More specifically, the device of FIGS. 12A and 12B is constructed on an n-GaAs substrate 401 carrying thereon a n-GaAs buffer layer 402, wherein the n-GaAs buffer layer 402 carries thereon a lower semiconductor distributed Bragg reflector 403 including therein 36 repetitions of an n-$Al_{0.9}Ga_{0.1}As$/GaAs pair. Further, an undoped GaAs cavity spacer layer 404 is formed on the lower semiconductor distributed Bragg reflector 403, and an active layer 405 of GaInAs/GaAs multiple quantum well structure is formed on the GaAs cavity spacer layer 404.

On the active layer 405, there is provided another cavity spacer layer 406 of undoped GaAs, and an upper distributed Bragg reflector 407 including therein 20 repetitions of a p-$Al_{0.9}Ga_{0.1}As$/GaAs pair is formed further on the cavity spacer layer 406.

Further, there is provided a contact layer (not shown) in correspondence to the GaAs layer at the uppermost part of the upper distributed Bragg reflector 407 such that there is provided a high concentration doping of p-type dopant (carbon) at the surface part of such a GaAs layer.

After the crystal growth process, there are formed a square resist pattern having a resist opening in correspondence to the low refractive index region 1 of FIG. 12B and a rectangular resist pattern having a resist opening in correspondence to the low refractive index region 2 of FIG. 12B by using a known photolithographic process. Further, oxygen ion implantation is conducted through the surface of the P—$Al_{0.9}Ga_{0.1}As$/GaAs upper semiconductor distributed Bragg reflector while using the resist pattern as a mask.

Next, a thermal annealing process is conducted and there is achieved a selective oxidation process in correspondence to where the ion implantation of oxygen has been made. Thereby, the low refractive index region 1 serving for the antiguiding structure is formed at the central part of the device and the low refractive index region 2 (cladding region) is formed at the peripheral part of the device for confining the transverse mode.

Here, it should be noted that the opening d1 of the resist pattern corresponding to the low refractive index region 1 is set to have a size of 5 μm, while the opening d2 of the resist pattern corresponding to the low refractive index region 2 (cladding region) is set to have a size of 40 μm in a first direction. The opening d2 is thereby formed to have a size d4 of 20 μm in the second direction.

FIG. 12A also shows the effective refractive index profile in the direction parallel to the substrate surface.

Referring to FIG. 12A, it can be seen that the effective refractive index is reduced relatively in correspondence to the part where the low refractive index region is provided. Further, Further, it can be seen that there is formed a high refractive index region at both sides of the low refractive index core at the central part of the device. Further, it can be seen that there is formed a cladding region of low refractive index region at further outer side of the high refractive index region.

After this, there is formed a square resist pattern in alignment with the oxygen ion implantation part, and ion implantation of hydrogen is conducted into the device structure while using the resist pattern as a mask, such that the hydrogen distribution peak is located at a level deeper than the oxygen distribution peak in the oxygen distribution part. With this, the resistance of the layered structure is increased in correspondence to the hydrogen ion injection part. In the present example, the resist pattern is formed to have the edge size d3 of 8 μm.

It should be noted that the foregoing high resistance region can be formed also by ion implantation of oxygen.

Next, a p-side electrode 311 is formed on the device surface and an n-side electrode 312 is formed on the rear surface of the substrate 301 after polishing of the rear surface. Further, by conducting an annealing process, the p-side electrode 311 and the n-side electrode 312 form an ohmic contact. With this, the surface-emission laser diode of FIGS. 12A and 12B is obtained.

With the surface-emission laser diode of the present example, the region that includes the laser cavity region and sandwiched by the low refractive index regions 2 (cladding regions) in the direction perpendicular to the laser cavity direction is formed to have different widths in the first direction and second direction. With this, the mode distribution is changed in the first direction and in the second direction.

Thereby, by setting the fundamental transverse mode distribution so as to have a large coupling with the gain region in only one direction, it becomes possible to cause laser oscillation such that the laser beam has a polarization direction in a specific direction.

Thereby, the higher-order transverse mode has very small electric field amplitude in the laser oscillation region and is affected heavily by the antiguiding structure. By providing such a guiding structure, there is achieved only small optical coupling with the gain region for such higher-transverse mode, and laser oscillating in higher-transverse mode is effectively suppressed.

Further, it should be noted that the dimensions of various parts noted before can be changed according to the needs. Further, the effective refractive index in the low refractive index regions 1 and 2 can be adjusted by adjusting the thickness and depth of the Al oxidation region.

By optimizing the sizes of various parts and the difference of effective refractive index such that the coupling between the fundamental transverse mode and the gain region becomes large in a specific direction corresponding to the polarization direction and such that the coupling is decreased in other directions, the effect of the device of the present example can be increased further.

It should be noted that the oxygen ion implantation into the low refractive index regions 1 and 2 can be conducted separately in two different steps, by using different acceleration voltages and different ion currents.

Thus, with the surface-emission laser diode of the present embodiment, it becomes possible to set the polarization direction arbitrarily by controlling the resist pattern at the time of the photolithographic process.

Thus, with the surface-emission laser diode of the present embodiment, a high output power was obtained in a single fundamental transverse mode laser oscillation, with polarization direction in the first direction.

EXAMPLE 8

FIGS. 13A and 13B are diagrams showing the surface-emission laser diode of Example 8, wherein it should be noted that FIG. 13B shows a plan view of the laser diode of FIG. 13A. The surface-emission laser diode of FIGS. 13A and 13B is a laser diode having an active layer of GaInAs/GaAs multiple quantum well structure and operating in the 0.98 μm wavelength band.

Hereinafter, the device structure will be explained together with the fabrication process thereof. The laser diode of FIGS. 13A and 13B are grown with similar methods and similar means to the case of Example 4.

More specifically, the device of FIGS. 13A and 13B is constructed on an n-GaAs substrate 401 carrying thereon a n-GaAs buffer layer 402, wherein the n-GaAs buffer layer 402 carries thereon a lower semiconductor distributed Bragg reflector 403 including therein 36 repetitions of an n-$Al_{0.9}Ga_{0.1}As$/GaAs pair. Further, an undoped GaAs cavity spacer layer 404 is formed on the lower semiconductor distributed Bragg reflector 403, and an active layer 405 of GaInAs/GaAs multiple quantum well structure is formed on the GaAs cavity spacer layer 404.

On the active layer 405, there is provided another cavity spacer layer 406 of undoped GaAs, and an upper distributed Bragg reflector 407 including therein 20 repetitions of a p-$Al_{0.9}Ga_{0.1}As$/GaAs pair is formed further on the cavity spacer layer 406.

Further, there is provided a contact layer (not shown) in correspondence to the GaAs layer at the uppermost part of the upper distributed Bragg reflector 407 such that there is provided a high concentration doping of p-type dopant (carbon) at the surface part of such a GaAs layer.

After the crystal growth process, there are formed a square resist pattern having a resist opening in correspondence to the low refractive index region 1 of FIG. 13B and a resist pattern having a resist opening in correspondence to the low refractive index region 2 of FIG. 13B by using a known photolithographic process. Further, oxygen ion implantation is conducted through the surface of the P—$Al_{0.9}Ga_{0.1}As$/GaAs upper semiconductor distributed Bragg reflector while using the resist pattern as a mask.

Next, a thermal annealing process is conducted and there is achieved a selective oxidation process in correspondence to where the ion implantation of oxygen has been made. Thereby, the low refractive index region 1 serving for the antiguiding structure is formed at the central part of the device and the low refractive index region 2 (cladding region) is formed at the peripheral part of the device for confining the transverse mode.

Here, it should be noted that the opening d1 of the resist pattern corresponding to the low refractive index region 1 is set to have a size of 5 μm. Further, the low refractive index region 2 (cladding region) is formed in pair in only one direction (first direction) so as to sandwich the laser cavity region laterally. Thereby, the region laterally sandwiched by the low refractive index cladding regions has a width d2 set to have a size of 30 μm.

FIG. 13A also shows the effective refractive index profile in the direction parallel to the substrate surface.

Referring to FIG. 13A, it can be seen that the effective refractive index is reduced relatively in correspondence to the part where the low refractive index region is provided. Further, Further, it can be seen that there is formed a high refractive index region at both sides of the low refractive index core at the central part of the device. Further, it can be seen that there is formed a cladding region of low refractive index region at further outer side of the high refractive index region.

FIG. 13B shows the effective refractive index in the second direction. In this direction, there is provided no cladding region, and only the core part at the central part of the device forms the low refractive index region.

After this, there is formed a square resist pattern in alignment with the oxygen ion implantation part, and ion implantation of hydrogen is conducted into the device structure while using the resist pattern as a mask, such that the hydrogen distribution peak is located at a level deeper than the oxygen distribution peak in the oxygen distribution part. With this, the resistance of the layered structure is increased in correspondence to the hydrogen ion injection part. In the present example, the resist pattern is formed to have the edge size d3 of 8 μm.

It should be noted that the foregoing high resistance region can be formed also by ion implantation of oxygen.

Next, a p-side electrode 311 is formed on the device surface and an n-side electrode 312 is formed on the rear surface of the substrate 301 after polishing of the rear surface. Further, by conducting an annealing process, the p-side electrode 311 and the n-side electrode 312 form an ohmic contact. With this, the surface-emission laser diode of FIGS. 13A and 13B is obtained.

With the surface-emission laser diode of the present example, the low refractive index regions 2 (cladding regions) is provided in pair so as to oppose with each other across the laser oscillating region in only one direction.

As explained before, the loss by mode leakage is decreased in the first direction in which the low refractive index cladding region is provided.

On the other hand, in the second direction in which no such low refractive index cladding layer is provided, there occurs a loss as a result of mode leakage.

Further, in the second direction, the mode distribution is spread in the direction perpendicular to the mode cavity direction, and the coupling with the gain region is decreased as compared with the first direction. With regard to the higher-order transverse mode, the coupling with the gain region is reduced significantly in both of the first and second directions as a result of existence of the antiguiding structure.

Thus, with the laser diode of the present example, it is possible to cause laser oscillation selectively in the first direction in which the fundamental transverse mode has a large electric field amplitude and a large coupling is secured with regard to the gain region. Further, with the surface-emission laser diode of the present embodiment, the direction of polarization can be controlled arbitrarily by controlling the resist pattern at the time of the photolithographic process.

According to the device of the present example, it becomes possible to obtain a single fundamental mode laser oscillation such that the laser beam has a polarization direction in one direction.

EXAMPLE 9

Figure 14A:
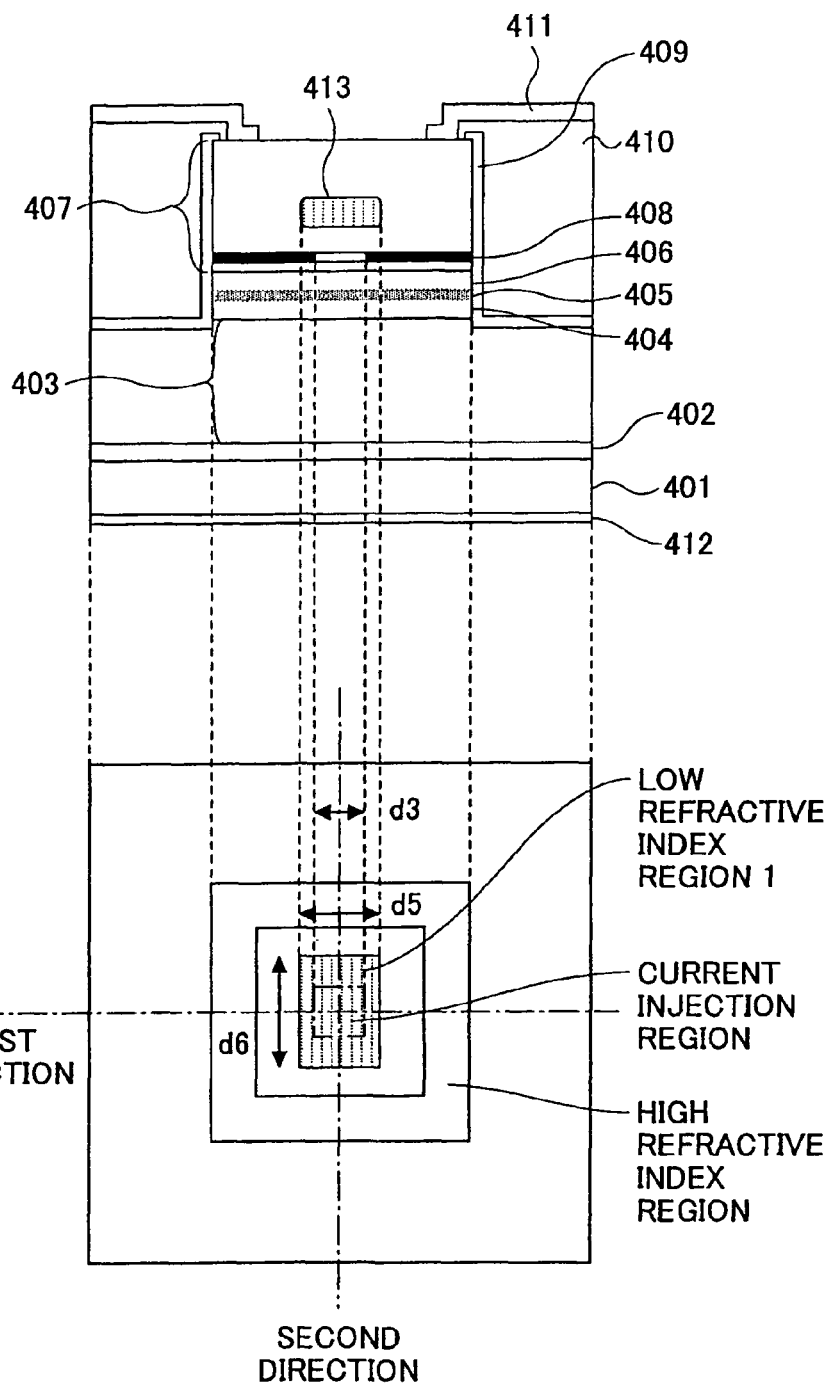
FIGS. 14A and 14B are diagrams showing the surface-emission laser element of Example 9.
Figure 14B:
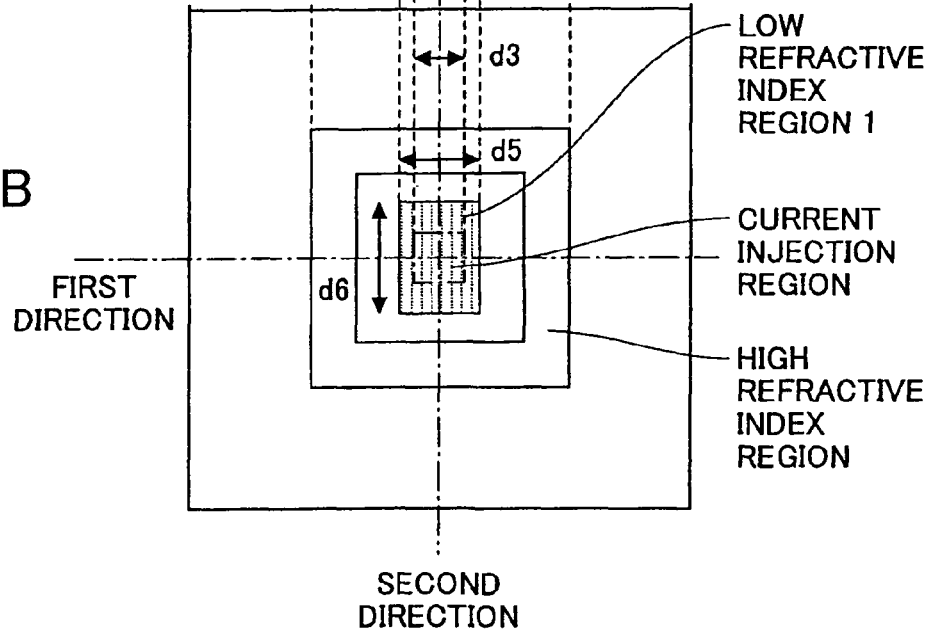

FIGS. 14A and 14B are diagrams showing the surface-emission laser diode of Example 9, wherein it should be noted that FIG. 14B shows a plan view of the laser diode of FIG. 14A. The surface-emission laser diode of FIGS. 14A and 14B is a laser diode having an active layer of GaInAs/GaAs multiple quantum well structure and operating in the 0.98 μm wavelength band.

Hereinafter, the device structure will be explained together with the fabrication process thereof. The laser diode of FIGS. 14A and 14B are grown with similar methods and similar means to the case of Example 1.

More specifically, the device of FIGS. 14A and 14B is constructed on an n-GaAs substrate 401 carrying thereon a n-GaAs buffer layer 402, wherein the n-GaAs buffer layer 402 carries thereon a lower semiconductor distributed Bragg reflector 403 including therein 36 repetitions of an n-$Al_{0.9}Ga_{0.1}As$/GaAs pair. Further, an undoped GaAs cavity spacer layer 404 is formed on the lower semiconductor distributed Bragg reflector 403, and an active layer 405 of GaInAs/GaAs multiple quantum well structure is formed on the GaAs cavity spacer layer 404.

On the active layer 405, there is provided another cavity spacer layer 406 of undoped GaAs, and an upper distributed Bragg reflector 407 including therein 20 repetitions of a p-$Al_{0.9}Ga_{0.1}As$/GaAs pair is formed further on the cavity spacer layer 406.

Further, there is provided a contact layer (not shown) in correspondence to the GaAs layer at the uppermost part of the upper distributed Bragg reflector 407 such that there is provided a high concentration doping of p-type dopant (carbon) at the surface part of such a GaAs layer.

Within the P—$Al_{0.9}Ga_{0.1}As/Al_{0.15}Ga_{0.85}As$ upper semiconductor distributed Bragg reflector 407, there is provided a selectively oxidizing layer 408 of p-AlAs for current confinement, wherein the p-AlAs selectively oxidizing layer 408 is formed with an oxidized region (shown in black) as a result of selective oxidation conducted in the high temperature waver vapor ambient starting from the mesa sidewall surface formed by etching.

After the crystal growth process, there is formed a square resist pattern having a resist opening having a size of 30 μm in the surface-emission laser diode of FIGS. 14A and 14B, wherein there is formed a square mesa in the layered structure by conducting an etching starting from the top surface of the p-$Al_{0.9}Ga_{0.1}As/Al_{0.15}Ga_{0.85}As$ upper semiconductor distributed Bragg reflector 407 down to a mid position of the n-$Al_{0.9}Ga_{0.1}As/Al_{0.15}Ga_{0.85}As$ lower semiconductor distributed Bragg reflector 403 by using a known dry etching process.

Next, there is formed a rectangular resist opening pattern in alignment with the central part of the mesa structure in correspondence to the low refractive index region 1 of FIG. 14B, and ion implantation of oxygen molecules is conducted into the central part of the mesa structure. Here, the resist pattern has an edge length d6 (longer edge length) of 20 μm in the first direction and an edge length d5 (shorter edge length) of 15 μm in the second direction.

After removing the resist pattern, the p-AlAs selective oxidizing layer 414 in the layered structure is subjected to the selective oxidation process conducted in a high temperature water vapor ambient such that the selective oxidation process proceeds in the direction parallel to the substrate starting from the mesa sidewall surface toward the central part of the mesa structure, and as a result, there is formed a selectively oxidized current confinement structure.

At the same time with the thermal annealing process associated with the selective oxidation process conducted in the high temperature water vapor ambient, there also proceeds oxidation of the $Al_{0.9}Ga_{0.1}As$ mixed crystal in the region 413 where the oxygen ions have been introduced, and as a result, there is formed a selective oxidation region of relatively low refractive index in the central part of the mesa structure as a result of the oxygen ion implantation process. Here, it should be noted that the current confinement region (non-selectively oxidized region) may have the edge length d3 of 10 μm.

Next, an $SiO_2$ layer 409 and an insulation resin layer 410 are formed consecutively on the entire wafer surface, and a p-side electrode 411 is formed on the insulation resin layer 410 in contact with the top surface of the mesa structure. Further, the rear surface of the n-GaAs substrate 401 is polished and an n-side electrode 412 is provided thereon. Further, ohmic contact is achieved for each of the electrodes 411 and 412 by conducting a thermal annealing process.

With the anisotropic shape of the low refractive index region 1 in the surface-emission laser diode of the present embodiment, it becomes possible to change the oscillation mode distribution in the direction along the longer edge and in the direction along the shorter edge.

Thus, by setting the fundamental transverse mode distribution to achieve a large coupling with the gain region in a specific direction, it becomes possible to cause laser oscillation of the fundamental transverse mode such that the laser beam has a polarization direction in such a specific direction.

Here, it should be noted that the dimensions of various parts noted above can be changed variously. Further, the effective refractive indeed in the low refractive index core can be adjusted in terms of the thickness and depth of the Al oxide region. By adjusting the size of the mesa and the low refractive index core, and by adjusting the effective refractive index appropriately such that there occurs a large coupling between the fundamental transverse mode and the gain region in the direction of the desired polarization direction and such that coupling between the fundamental transverse mode and the gain region is small in other directions, the effect of the present invention can be enhanced further.

With regard to the higher-order transverse mode, the electric field amplitude is small in the laser oscillation region, and thus, the higher-order transverse mode is strongly affected by the antiguiding structure. Thus, coupling with the gain region is inherently weak in such a higher-order transverse mode, and laser oscillation in higher-order transverse mode can be suppressed effectively by providing the antiguiding structure.

Further, with the surface-emission laser diode of the present embodiment, the polarization direction can be set in an arbitrary direction by controlling the resist pattern at the time of the photolithographic process.

Further, while the present example has been explained for the case in which the low refractive index region 1 of the surface-emission layer diode has a rectangular shape, it is also possible to use an elliptical shape for the low refractive index region 1. In any of these cases, similar effect can be achieved. Further, it is possible to user the structure of the hydrogen ion implantation type laser diode explained with reference to Examples 6-8 in place of the structure of the selectively oxidized laser diode.

With the surface-emission laser diode of the present embodiment, a single fundamental transverse mode laser oscillation has been achieved in the first polarization direction up to a high output state.

While explanation has been made for various examples above with regard to the case of using an MOCVD process for the crystal growth process, it is also possible with the present invention to use a molecular beam crystal growth (MBE) process or other crystal growth processes. Further, it is possible to use a semi-insulating substrate or a p-type substrate in place of the n-type substrate. Further, the laser oscillation wavelength is not limited to the foregoing 0.85 µm band or 1.3 µm band, and the laser diode can oscillate with the wavelength of 0.65 µm band, 0.98 µm band, 1.5 µm band, or the like.

According to the oscillation wavelength, it is possible to use other materials for the laser diode. For example, it is possible to use an AlGaInP mixed crystal for the 0.65 µm band. For the 0.98 µm band, it is possible to use an InGaAs mixed crystal. Further, a GaInNAs(Sb) mixed crystal can be used for the 1.5 µm band. Thereby, materials transparent in such a wavelength band are used for the distributed Bragg reflector with such a combination so as to maximize the refractive index difference therebetween.

Further, the device structure may be different from the structure explained with reference to the foregoing examples. Further, the devices explained with the foregoing examples may be tuned to oscillate with other oscillation wavelengths. By choosing the materials and construction of the distributed Bragg reflector appropriately according to the desired oscillation wavelength, any of the devices explained above can be tuned to the desired oscillation wavelength.

In order to reduce the device resistance further, it is effective to provide a heterospike buffering layer between the Al(Ga)As/GaAs heterointerface with a composition intermediate therebetween. Further, such a heterospike buffering layer may be provided to the interface of the selective oxidizing layer.

With regard to the heterospike buffering layer, it is possible to use a single layer having a composition intermediate of the two layers constituting the heterointerface or combination of plural layers of different compositions. Further, it is also possible to change the composition continuously.

EXAMPLE 10

Figure 15:
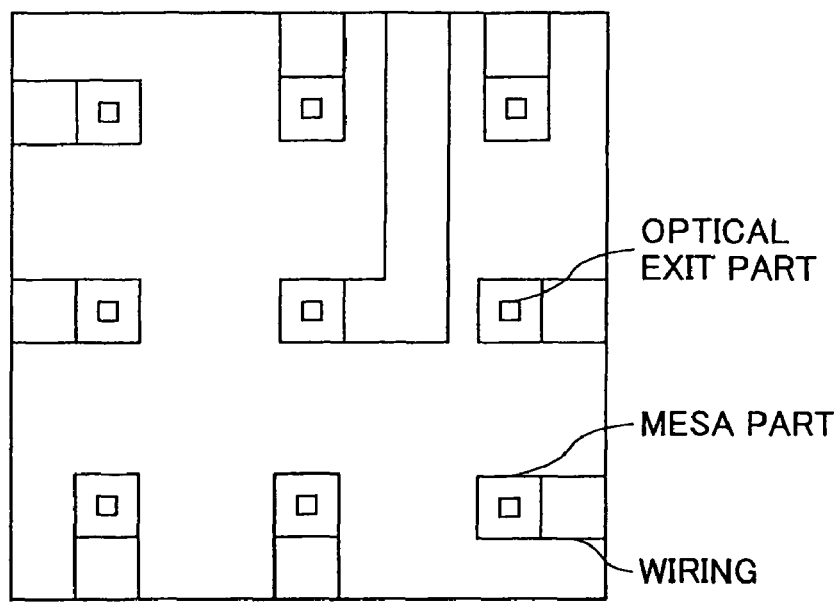
FIG. 15 is a diagram showing the surface-emission laser array of Example 10.

FIG. 15 shows a surface-emission laser array according to Example 10 of the present invention. More specifically, FIG. 15 shows the construction of a monolithic laser array in which the surface-emission laser diodes of the present invention are arranged two-dimensionally in the 4×4 formation in a top plan view.

In FIG. 15, there is provided wirings on the upper electrodes individually so as to drive the laser diodes independently. The surface-emission laser diode array of FIG. 15 is formed by the process and method similar to the one used in any of the examples explained before.

Because the higher-order transverse mode laser oscillation is effectively suppressed in each of the devices constituting the surface-emission laser array of FIG. 15 by the antiguiding structure of low refractive index layer formed in the cavity structure by oxygen ion implantation and subsequent thermal annealing process as shown in Examples 1 through 4, the surface-emission laser array of FIG. 15 can provide high output power while maintaining the single fundamental transverse mode laser oscillation.

Particularly, with the surface-emission laser array in which the antiguiding structure is provided inside the n-type distributed Bragg reflector, the device resistance is decreased and a very high output operation is possible. Thereby, it becomes possible to obtain a surface-emission laser array operating in the single fundamental transverse mode with high output power and with reduced heat generation.

Thus, a surface-emission laser array operating in the single fundamental transverse mode with high output power has been obtained.

EXAMPLE 11

Figure 16:
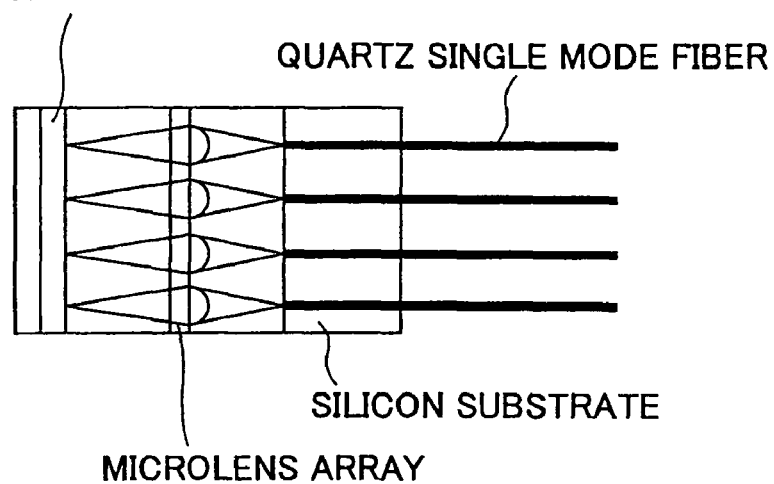
FIG. 16 is a diagram showing an example of the surface-emission laser module.
Figure 17:
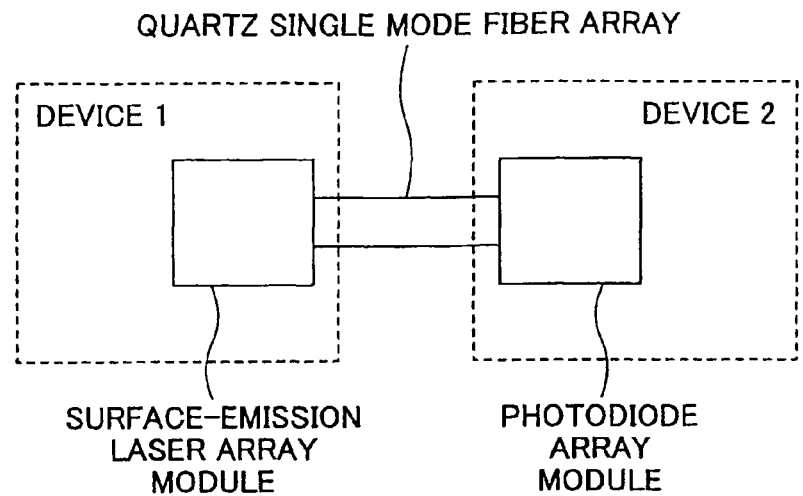
FIG. 17 is a diagram showing an example of the parallel optical interconnection system connecting between devices.

FIG. 16 is a diagram showing an example of a surface-emission laser module, while FIG. 17 is a diagram showing an example of a parallel optical interconnection system (Example 11) that connects different devices.

The laser array module of FIG. 16 is constructed by mounting a one-dimensional monolithic surface-emission laser array of the present invention, a microlens array and a fiber array on a silicon substrate.

Here, the surface-emission laser array is provided in the direction toward the fibers and are coupled with the silica single mode fibers mounted on V-shaped grooves formed on the silicon substrate via the microlens array. The surface-emission laser array has an oscillation wavelength of 1.3 µm band and achieves high speed transmission over the silica single mode fibers.

With the interconnection system of FIG. 17, a device 1 and a device 2 are connected by an optical fiber array. Thereby, the device 1 at the transmission side includes a one-dimensional laser array module that uses the surface-emission laser diode or the surface-emission laser array of the present invention and a driving circuit thereof. Further, the device 2 at the reception side includes a photodiode array module and a signal detection circuit.

With the optical interconnection system of Example 11, a stable fundamental transverse mode laser oscillation is obtained with regard to the environmental temperature change or change of driving condition as a result of use of the surface-emission laser array of the present invention. Because there occurs little change of coupling efficiency with the optical fibers, it becomes possible with the present invention to construct a highly reliable interconnection system.

While Example 11 has been explained with regard to the parallel optical interconnection system, it is also possible to construct a serial transmission system by using a single device. Further, it is also possible to apply the system of Example 11 to inter board connection, inter chip connection and intra chip connection.

EXAMPLE 12

Figure 18:
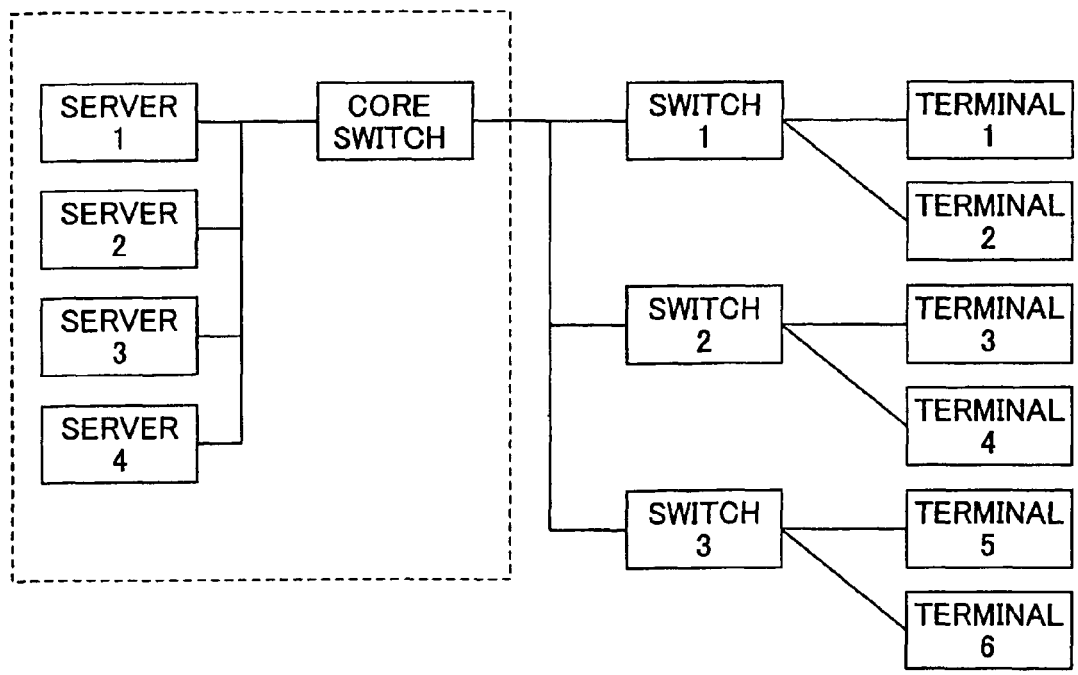
FIG. 18 is a diagram showing an optical telecommunication system of Example 12.

FIG. 18 shows an optical communicating system according to Example 12 for the case the optical communication system is used as an optical LAN.

With the optical LAN system of FIG. 18, the surface-emission laser diode of surface-emission laser array of the present invention is used for the optical source of optical transmission between a server and a core switch, between a core switch and individual switches, and between individual switches and individual terminals. Thereby, connection between the devices is achieved by using a silica single mode fiber or a multimode fiber.

By using the surface-emission laser diode or surface-emission laser array of the present invention for the optical source, in which the surface-emission laser diode or surface-emission laser array of the present invention is used for the optical source, stable fundamental transverse mode laser oscillation is achieved in spite of environmental temperature change or change of drive condition, and it became possible to construct a highly reliable system because of little change of coupling efficiency with optical fibers.

EXAMPLE 13

Figure 19:
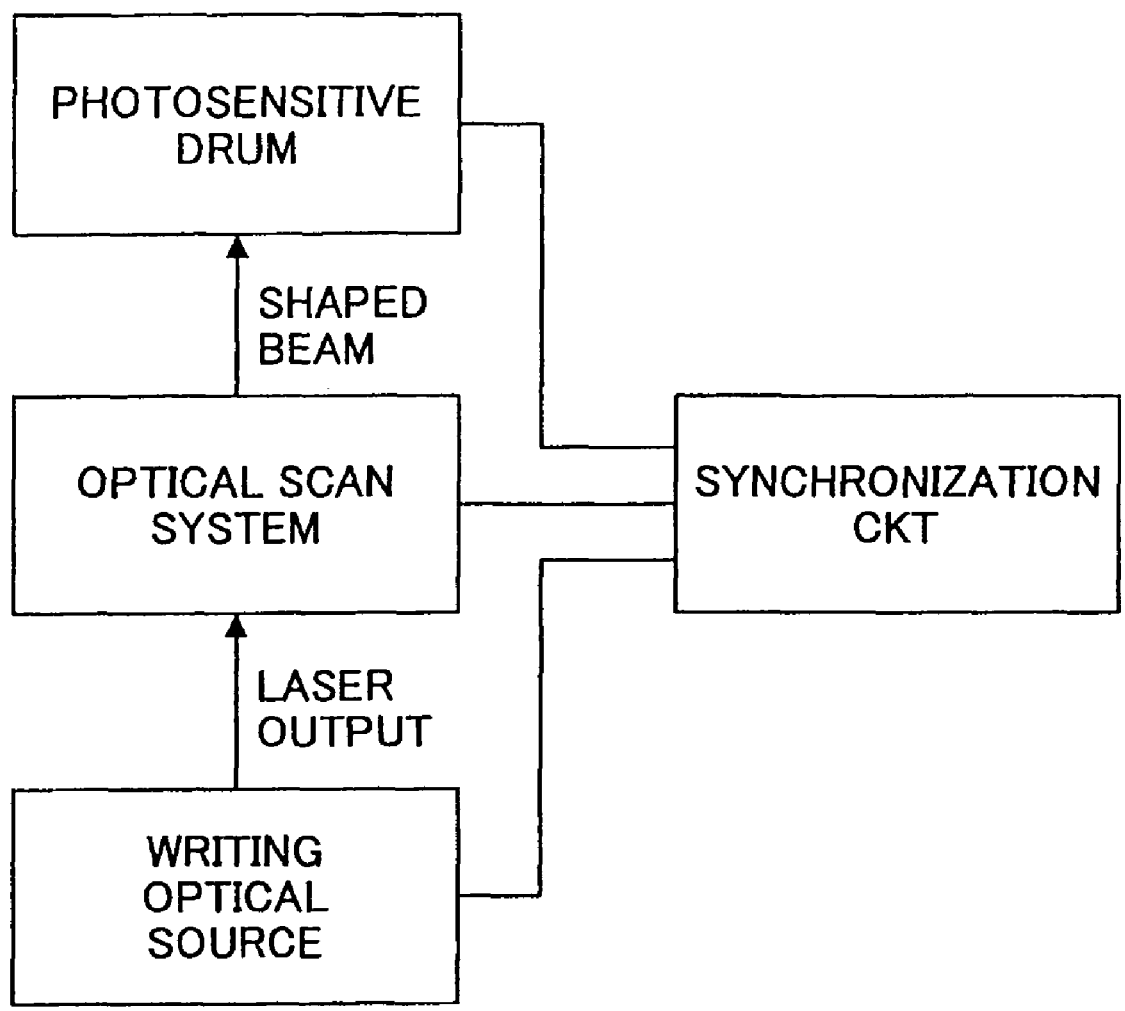
FIG. 19 is a diagram showing an electro-graphic system of Example 13.

FIG. 19 is a diagram showing an electro-photographic system according to Example 13 of the present invention.

The electrophotographic system of FIG. 19 comprises a photosensitive drum, scanning and converging optical system (optical scanning system), a writing optical source and a synchronization control part, wherein the surface-emission laser diode or the surface-emission laser array of the present invention is used for the wiring optical source.

The electrophotographic system of FIG. 19 is controlled by a synchronization control circuit, and the optical beam from the optical source is focused upon the photosensitive drum by the scanning and converging optical system that includes a polygonal mirror. Thereby, there is formed an electrostatic latent image on the photosensitive drum.

Conventionally, it has been difficult with the surface-emission laser diode to operate with high output power because of extensive heat generation, while in the case of the surface-emission laser diode of the present invention, operation with higher output power becomes possible as compared with the conventional device. Thus, the surface-emission laser diode of the present invention is suitable for the writing optical source of the electrophotographic system.

Further, because the laser oscillation is in the single fundamental transverse mode, a single-peak far field image is obtained, and focusing of the optical beam is achieved easily. With this, a high definition image is obtained with the present invention.

Further, with the red surface-emission laser diode that uses the AlGaInP material for the active layer, laser oscillation at about 650 nm is possible, while this oscillation wavelength is shorter than the case of using an AlGaAs material. Thereby, the tolerance of design in the optical system is increased. Thus, such a red surface-emission laser diode is suitable for the writing optical source of high definition electrophotographic systems.

It should be noted that such a surface-emission laser diode can be constructed by using the material of AlGaInP system for the active layer and by using the material of AlGaAs or AlGaInP system for the distributed Bragg reflector.

Further, it is possible to achieve crystal growth in lattice matching with the GaAs substrate with the use of such a material, and thus, it is possible to use such an AlAs material for the selective oxidation layer.

On the other hand, with the use of AlGaInP material, there arises a problem that the laser diode becomes extremely susceptible to temperature change, and associated with this, problems such as saturation of output power or failure of laser oscillation are caused with temperature increase associated with device heat generation.

With the surface-emission laser diode fabricated with the present invention, the higher-order transverse mode distribution is shifter toward the mesa sidewall surface as a result of use of the antiguiding structure, while such a shift decreases the degree of coupling of the higher-order transverse mode distribution with the gain region. Thereby, laser oscillation with higher-order transverse mode is effectively suppressed, while this enables use of larger diameter for the current confinement region.

Thus, with the present invention, it becomes possible to decrease the diameter of the current confinement region, which has been a problem with a red surface-emission laser diode, and it becomes possible to realize a device of low resistance.

Thus, with the present invention, it becomes possible to realize a red surface-emission laser diode of reduced heat generation and capable of oscillating in the single fundamental transverse mode with higher output power as compared with the conventional device, while such a laser diode is quite suitable for the writing optical source of electrophotographic system.

Further, as a result of use of the surface-emission laser array of Example 10, it becomes possible to increase the writing speed as compared with the conventional device. Thereby, it becomes possible with the present invention to obtain a high speed and high definition electrophotographic system.

EXAMPLE 14

Figure 20:
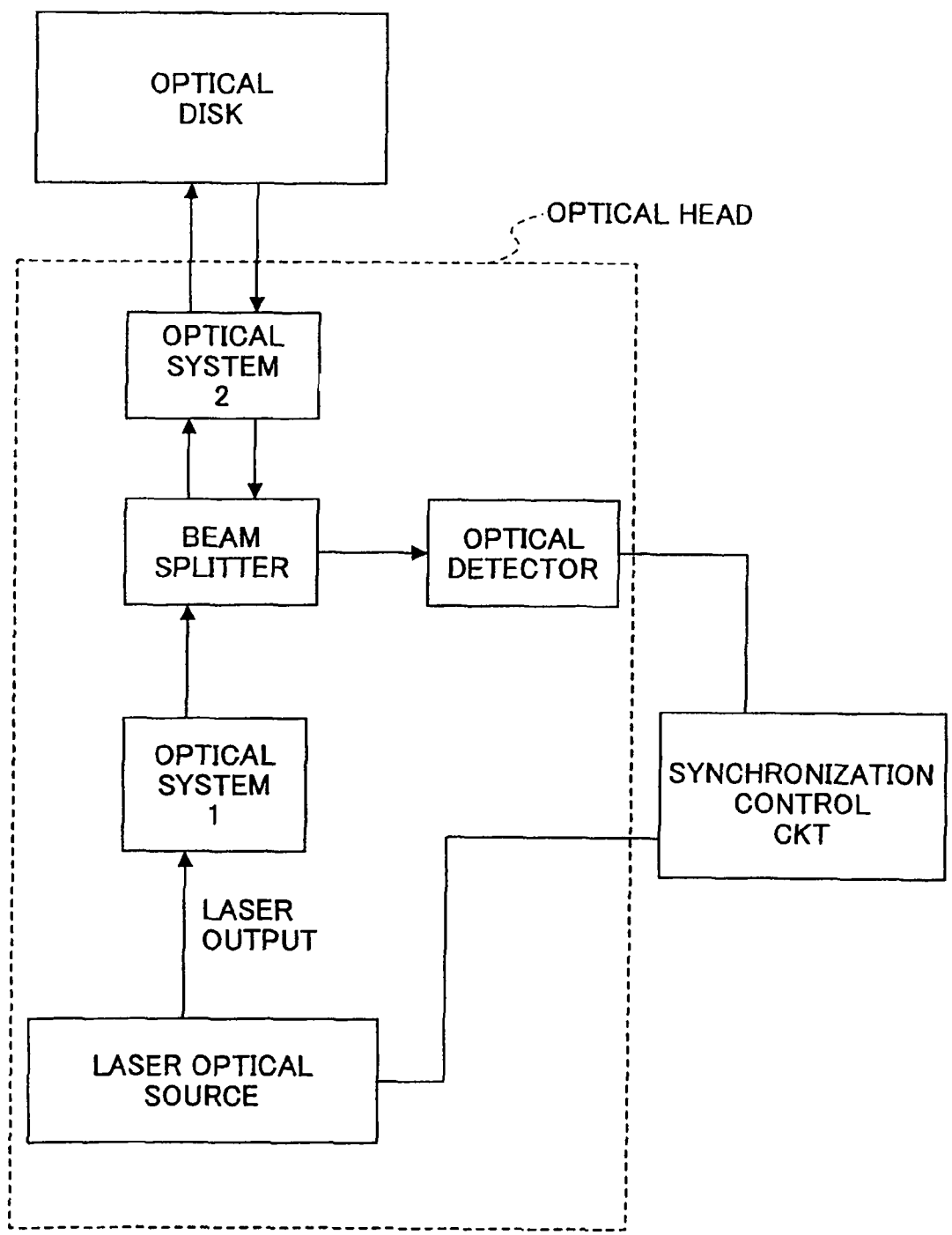
FIG. 20 is a diagram showing the optical disk system of Example 14.

FIG. 20 is a diagram showing an optical disk system according to Example 14 of the present invention.

The optical disk system of FIG. 20 is formed of an optical disk, an optical system 1, an optical system 2, a beam splitter, an optical detector, a laser optical source, and a synchronization part (synchronization control circuit), wherein the surface-emission laser diode or surface-emission laser array of the present invention is used for the laser optical source.

Here, it should be noted that the optical system 1, optical system 2, beam splitter, optical detector and the laser optical source constitute an optical head, wherein the optical head is driven by an actuator and achieves access to an arbitrary track on the disk. Here, the optical system 1 is constructed by a diffraction grating and a beam expansion lens, while the optical system 2 is constructed of a ¼ wavelength plate and a beam converging lens.

With the optical disk system of FIG. 20, the laser beam from the laser source is focused upon the disk surface by the optical source 1 and the optical source 2 under control of the synchronization circuit, and the disk surface is irradiated with the laser beam.

On the disk surface, there is formed a track by information pits arranged in the form of a regular array, and the laser beam reflected from such a disk surface is directed to the optical detector in the reading operation by the beam splitter after passing through the optical system 2 again. In the optical detector, the information signal and also the tracking signal formed by the information pits are detected, and servo control of the optical head is achieved based on the detected signals with regard to the distance between the disk and the head and with regard to the head and the track.

With the surface-emission laser diode of the present invention, a larger output power is possible as compared with the conventional device while maintaining the single fundamental transverse mode operation, and because of this, a single peak beam spot is obtained stably. Thereby, the optical system necessary for beam shaping is simplified, and the cost of the optical disk system is reduced.

Because it becomes possible to obtain a single peak beam spot with reliability, the optical disk system constructed by using the surface-emission laser diode of the present invention provides excellent reliability. Further, it becomes possible to achieve high speed reading as a result of use of the surface-emission laser array of Example 10.

Thus, with the present invention, it becomes possible to obtain a high speed and highly reliable optical disk system.

Hereinafter, further best modes for implementing the present invention will be explained.

In the present invention, anisotropy is provided for confinement of transverse mode in a surface-emission laser diode having an antiguiding structure for controlling the polarization direction thereof.

(Nineteenth Mode of Invention)

According to the nineteenth mode of the present invention, there is provided a surface-emission laser diode constructed on a substrate having a substrate surface, comprising:

an active layer parallel to said substrate surface;

a pair of cavity spacer layers provided so as to sandwich said active layer;

a pair of distributed Bragg reflectors provided across said active layer and said cavity spacer layers so as to sandwich said active layer and said cavity spacer layers therebetween;

a high resistance region defining a current injection region for injecting a current into said active layer, laser oscillation being caused in a laser cavity region between said pair of distributed Bragg reflectors acting as cavity mirrors in a direction perpendicular to said substrate surface in correspondence to said current injection region, a refractive index structure provided in a plane parallel to said substrate surface, said refractive index structure comprising: a low refractive index core including said laser cavity region at a central part thereof; and a periodic structure provided around said low refractive index core, said periodic structure comprising a low refractive region surrounding said low refractive index core and a high refractive index region surrounding said low refractive index region, said low refractive index region and said high refractive index region being repeated alternately in said plane parallel to said substrate, wherein any of a width of said low refractive index core or a shape of said periodic structure is changed between a specific direction parallel to said substrate surface and other directions parallel to said substrate surface different from said specific direction.

Thus, with the present invention, any of the width of the low refractive index core or the shape of the periodic structure is changed in a specific direction and in other directions within the plane parallel to the substrate surface. Thereby, there is caused anisotropy in the width of the low refractive index core or the shape of the periodic structure between the foregoing specific direction and directions other than the specific direction.

Here, the low refractive index core may be the laser oscillation region corresponding to the current injection region.

Further, the width of the low refractive index core or the shape of the periodic structure may change in various, mutually different directions other than the foregoing specific direction.

In the description hereinafter, it should be noted that the representation "periodic structure of refractive index provided in the direction parallel to the substrate surface" or "periodic structure of refractive index" means the periodic structure in which the region of low effective refractive index and the region of high refractive index are repeated in the direction perpendicular to the laser cavity direction.

According to the nineteenth mode of the present invention, in which there is provided a surface-emission laser diode constructed on a substrate having a substrate surface, comprising: an active layer parallel to said substrate surface; a pair of cavity spacer layers provided so as to sandwich said active layer; a pair of distributed Bragg reflectors provided across said active layer and said cavity spacer layers so as to sandwich said active layer and said cavity spacer layers therebetween; a high resistance region defining a current injection region for injecting a current into said active layer, laser oscillation being caused in a laser cavity region between said pair of distributed Bragg reflectors acting as cavity mirrors in a direction perpendicular to said substrate surface in correspondence to said current injection region, a refractive index structure provided in a plane parallel to said substrate surface, said refractive index structure comprising: a low refractive index core including said laser cavity region at a central part thereof; and a periodic structure provided around said low refractive index core, said periodic structure comprising a low refractive region surrounding said low refractive index core and a high refractive index region surrounding said low refractive index region, said low refractive index region and said high refractive index region being repeated alternately in said plane parallel to said substrate, wherein any of a width of said low refractive index core or a shape of said periodic structure is changed between a specific direction parallel to said substrate surface and other directions parallel to said substrate surface different from said specific direction, there is caused anisotropy in the width of the low refractive index core or in the shape of the periodic structure between a specific direction and directions different from the foregoing specific direction, while this induces anisotropy in the strength of transverse mode confinement caused by the periodic structure of the refractive index provided within the plane parallel to the substrate. Thereby, it becomes possible to cause selective oscillation of the fundamental transverse mode, such that the fundamental transverse mode has a polarization plane in specific direction.

Non-Patent Reference 6 noted before describes about confinement of the transverse mode by antiguiding structure (ARROW structure) and a periodic structure of the refractive index provided perpendicularly to the laser cavity direction.

Here, the antiguiding structure means a structure forming a waveguide structure of transverse mode provided in the region where there occurs laser resonance in the plane parallel to the substrate surface, such that there occurs a relative decrease of effective refractive index as compared with the surrounding region (high refractive index cladding). Further, Non-Patent Reference 6 discloses an example of the periodic structure provided in the high refractive index cladding layer such that the region of low effective refractive index and the region of high effective refractive index are repeated within the plane parallel to the substrate surface for reducing the diffraction loss of the transverse mode.

As described in Non-Patent Reference 6, the wavelength $\lambda 1$ in the direction parallel to the substrate surface in the high refractive index cladding can be approximated, in the antiguiding structure formed by a single low refractive index core and single high refractive index cladding, as $$\lambda_1 = \frac{\lambda_0}{\left\{n_1^2 - n_0^2 + \frac{(m+1)^2 \lambda_0^2}{4d^2}\right\}^{\frac{1}{2}}} \quad (1)$$

wherein the low refractive index core has the refractive index $n_0$, the high refractive cladding has the refractive index $n_1$, the optical beam has the wavelength $\lambda_0$ in vacuum, and the low refractive index core has the width d. Here, it should be noted that the wavelength in the direction parallel to the substrate surface represents the wavelength corresponding to the propagation coefficient (wavenumber) of the optical wave in the direction parallel to the substrate surface and means the wavelength of the optical wave propagating in an arbitrary direction as it is projected on the substrate surface.

Further, m in Equation (1) represents the order of the transverse mode.

Thus, the wavelength $\lambda_1$ in the direction parallel to the substrate surface is determined by the refractive index $n_0$ of the low refractive index core, the refractive index $n_1$ of the high refractive index cladding and the width d of the low refractive index core.

In the case the refractive indices $n_0$ and $n_1$ of the low refractive index core and the high refractive index cladding are constant, the wavelength $\lambda_1$ depends on the width d of the low refractive index core as can be seen in Equation (1).

Thus, in the case the high refractive index cladding has a uniform refractive index, there occurs a change in the wavelength $\lambda_2$ in the direction parallel to the substrate surface according to the width d of the low refractive index core. As described in Non-Patent Reference 2, the wavelength $\lambda_1$ for the zero-th order, first order and second order takes the values of 1.70 µm, 1.66 µm and 1.62 µm in the case of $n_0$=3.3, $n_1$=3.35, $\lambda_0$=0.98 µm and d=8 µm.

Particularly, by choosing the width of the regions constituting the periodic structure provided in the direction parallel to the substrate surface to be equal to an odd number multiple of ¼ of the lateral wavelength (wavelength in the direction parallel to the substrate surface) of the transverse mode in respective regions, it becomes possible to provide a cavity structure similarly to the cavity structure provided in the laser cavity direction. In this case, in which the cavity part thus formed has a relatively low refractive index, there is formed a half wavelength resonator in which the electric field strength of the standing wave becomes zero at the interface between the cavity part and the periodic structure of the refractive index.

With such a construction, the fundamental transverse mode is confined in the low refractive index region by the periodic structure of the refractive index, and mode leakage in the direction parallel to the substrate surface is suppressed. Thereby, mode loss can be reduced.

Here, it should be noted that, by choosing the number of repetitions in the periodic structure of the refractive index to be small, the width of the reflection band (stop band) is decreased. Thereby, in view of the fact that fact that the higher order transverse modes have a relatively large wavelength separation of about 40 nm with respect to the fundamental transverse mode, the resonance wavelengths for the higher-order transverse modes are made outside of the stop band with certainty, and it becomes possible to confine selectively the fundamental transverse mode in the direction parallel to the substrate surface.

It should be noted that such a region of different refractive index in the direction perpendicular to the laser cavity direction (direction parallel to the substrate) can be formed by changing the resonant wavelength in the vertical direction to the laser cavity direction within the plane perpendicular to the laser cavity direction.

More specifically, it is known that there exists an equivalent relationship $$\frac{\Delta n}{n} = \frac{\Delta \lambda}{\lambda} \qquad (2)$$

between the effective refractive index change $\Delta n$ and the resonant wavelength change $\Delta \lambda$ in the direction parallel to the substrate surface, and thus, it becomes possible to increase the effective refractive index relatively by increasing the resonant wavelength relatively to other regions and it becomes possible to decrease the effective refractive index by decreasing the resonant wavelength with respect to other regions.

In order to cause a large change in the resonant wavelength, it is effective to change the thickness of the layer in the vicinity of the laser cavity region such as the cavity spacer layer. In the device of Non-Patent Reference 2, there is formed a region of relatively low effective refractive index with regard to the surrounding region by decreasing the thickness of a specific semiconductor layer in the foregoing specific region relatively to the surrounding region by etching.

Thus, with the foregoing conventional art, it becomes possible to decrease the mode leakage in the direction parallel to the substrate surface by providing a periodic region of refractive index formed of a region of low effective refractive index and a region of high effective refractive index around the low refractive index core. Further, it becomes possible to confine the fundamental transverse mode selectively, and it becomes possible to obtain a high output power operation in the single fundamental transverse mode.

Next, the construction and operation of the surface-emission laser diode according to the nineteenth mode of the present invention will be described.

In the surface-emission laser diode of the present invention, the conventional surface emission laser diode having an antiguiding structure and provided with a low refractive index core and a periodic structure of refractive index surrounding the low refractive index in the direction parallel to the substrate surface is improved by providing anisotropy in the width of the low refractive index core or in the shape of the periodic structure in the direction parallel to the substrate surface. Thereby, the degree of transverse mode confinement is changed in the anisotropic directions, and thus, it becomes possible to control the polarization direction of the laser beam in a specific direction, while maintaining the single fundamental transverse mode operation up to high output power state.

Thus, the wavelength in the lateral direction in the antiguiding structure is determined by the difference of refractive index between the low refractive index region and the high refractive index region or the width of the low refractive index core, while the reflectivity of the reflection wavelength band (stop band) formed by the periodic structure is determined based on the width of the low refractive index region and the high refractive index region and also by the repetition period of the periodic structure.

Thus, by providing anisotropy in the width or shape of the periodic structure in the direction parallel to the substrate surface, it becomes possible to set the degree of mode confinement in the direction parallel to the substrate surface to different values. By setting the degree of transverse mode confinement to have different values, it becomes possible to change the loss caused by mode leakage in the direction parallel to the substrate. Further, it becomes possible to change the coupling between the mode distribution and the gain region corresponding to the current injection region.

Thus, by choosing the foregoing periodic structure such that there occurs a large mode leakage loss in a particular direction, or by choosing the periodic structure such that the coupling between the mode distribution and the gain region is decreased in a particular direction, it becomes possible to suppress the laser oscillating in the mode that has an electric field amplitude (polarization) in such a direction.

Thus, with the nineteenth mode of the present invention, it becomes possible to obtain high output power operation in single fundamental transverse mode by using the periodic structure formed of the high refractive index region and the low refractive index region. Further, it becomes possible to control the polarization direction in a specific direction by providing anisotropy in the width of the low refractive index core or in the construction of the periodic structure in the direction parallel to the substrate surface.

In the surface-emission laser diode of the present mode, it is preferable to use a high resistance region formed by hydrogen ion implantation for the current confinement structure. With the use of the high resistance region formed by hydrogen ion implantation, there occurs little refractive index change and designing of the periodic structure of refractive index can be made easily.

Further, with the use of the high resistance region formed by hydrogen ion implantation for the current confinement structure, there is no need of selective oxidation processing, and thus, there is no need of forming a mesa structure with the laser diode of such a type. Because of the absence of the mesa structure, the laser diode shows excellent performance of heat radiation in the lateral direction.

Further, because the surface-emission laser diode of the present mode achieves the current confinement and transverse mode control by different structures, there is no need of narrowing the current confinement diameter for the single fundamental transverse mode control contrary to the case of the conventional selective oxidation type surface-emission laser diode, and a device of low resistance can be obtained easily.

Further, because the device does not include a selectively oxidized current confinement layer in the layered structure constituting the device, there occurs no problem of parasitic capacitance.

Further, as compared with the conventional surface-emission laser diode of the hydrogen ion implantation type, the laser diode of the present mode is improved with regard to the problem of unstable transverse mode. Further, because of the low device resistance and small parasitic capacitance, the surface emission laser diode of the present mode shows excellent electric characteristics, particularly the frequency characteristics. Further, because of the small heat generation and high efficiency of heat radiation, large differential gain and high output power are achieved with the surface emission laser diode of the present mode. Thereby, it becomes possible to obtain a high relaxation oscillation frequency.

Thus, with the present mode of the invention, it becomes possible to obtain a surface-emission laser diode capable of high speed modulation.

(Twentieth Mode of Invention)

According to the twentieth mode of the present invention, there is provided a surface-emission laser diode according to the nineteenth aspect of the present invention, wherein said low refractive index core has a width different between two directions parallel to said substrate surface and crossing perpendicularly with each other.

With the twentieth aspect of the present invention, in which there is provided a surface-emission laser diode according to the nineteenth aspect of the present invention (antiguiding surface-emission laser diode using a low refractive index core for the laser cavity region), wherein said low refractive index core has a width different between two directions parallel to said substrate surface and crossing perpendicularly with each other, there is induced anisotropy in the degree of confinement of the transverse mode caused by the periodic structure of refractive index provided within the plane parallel to the substrate, it becomes possible to obtain an operation, in which the fundamental transverse mode having a polarization in a specific direction is selectively oscillated.

Hereinafter, more detailed description will be made.

As noted before, the wavelength $\lambda_1$ in the high refractive index cladding layer in the direction parallel to the substrate surface is determined by the width d of the low refractive index core according to Equation (1) in the case the refractive indices $n_0$ and $n_1$ of the low refractive index core and the high refractive index core are constant.

Thus, in the case the width of the low refractive index core is changed in two, mutually perpendicular directions as in the twentieth mode of the present invention, the wavelength in the direction parallel to the substrate surface takes different values in the respective directions.

Thus, in the case there is provided the same periodic structure within the plane parallel to the substrate surface in the two, mutually perpendicular directions as the periodic structure of refractive index, there appears a difference in the degree of transverse mode confinement between the two directions perpendicular with each other because of the fact that the wavelength parallel to the substrate surface is different between these two directions.

Thus, when the width and period of the periodic structure is chosen such that the confinement of the fundamental transverse mode by the periodic structure of the refractive index is made most efficiently in one of the two, mutually perpendicular directions (referred to hereinafter as "first direction"), then there inevitably arises the situation that the degree of confinement of the fundamental transverse mode is weakened in the other direction (referred to hereinafter as "second direction"), because of the difference of wavelength of the fundamental transverse mode in the direction parallel to the substrate surface in the second direction as compared with the wavelength in the first direction, and there is caused a large mode leakage in the direction parallel to the substrate surface.

Thus, there appears a large loss in the second direction parallel to the substrate surface, and it becomes possible to cause laser oscillation selectively such that the laser beam has a polarization in the first direction.

Thus, in the case there is provided a periodic structure of different refractive indices such that a maximum efficiency of confinement is achieved for the fundamental transverse mode having the wavelength parallel to the substrate surface and directed in a specific direction (first direction), it becomes possible to cause selective oscillation of the fundamental transverse mode having the polarization in the first direction by changing the width of the low refractive index core in the direction (second direction) perpendicular to the foregoing first direction.

Further, by confining the fundamental transverse mode selectively, the periodic structure formed of the high refractive index region and the low refractive index region maintains the single fundamental transverse mode up to high output power state of the laser diode.

With regard to the current confinement structure of the surface-emission laser diode of the present mode of the invention, it is preferable to use the high resistance region formed by hydrogen ion implantation process similarly to the case of the nineteenth mode of the invention. With this, the operation similar to the one explained with reference to the nineteenth mode of the invention is attained, and it becomes possible to provide a device of low device resistance, small capacitance and superior electric characteristics including the frequency characteristics.

Because of small heat generation and high efficiency of heat radiation, it becomes possible to obtain a high differential gain and high output power. Thereby, it becomes possible to realize a high relaxation oscillation frequency. Thus, a surface-emission laser diode capable of high speed modulation is obtained.

(Twenty First Mode of Invention)

According to the nineteenth aspect of the present invention, there is provided a surface-emission laser diode according to the nineteenth aspect of the present invention, wherein said periodic structure is different between two directions parallel to said substrate surface and crossing perpendicularly with each other.

As explained with reference to the nineteenth and twentieth mode of the present invention, it is possible with the periodic structure provided around the low refractive index core to achieve effective confinement of the fundamental transverse mode by choosing the width of the low refractive index region and the high refractive index region constituting the periodic structure to be an odd integer multiple of ¼ of the lateral wavelength of the fundamental transverse mode (wavelength in the direction parallel to the substrate surface) in each of the low refractive index region and the high refractive index region. In this say, the efficiency of confinement of the transverse mode is determined by the construction of the regions constituting the periodic structure such as the width thereof.

Further, as explained before, the wavelength $\lambda_1$ in the direction parallel to the substrate surface in the high refractive index cladding layer is determined by the width d of the low refractive index core according to Equation (1) in the case the refractive index $n_0$ of the low refractive index core and the refractive index $n_1$ of the high refractive index cladding are constant.

Thus, in the case the low refractive index core has an anisotropic shape such as a square form, the wavelength $\lambda_1$ in the direction parallel to the substrate surface becomes identical in the two, mutually perpendicular directions.

Thus, with the twenty first mode of the present invention, in which there is provided anisotropy in the construction of the periodic structure, it becomes possible to change the degree of confinement of the transverse mode according to the directions different in terms of the anisotropy.

For example, in the case the width of the high refractive index region and the width of the low refractive index region are set to an odd integer multiple of ¼ the wavelength of the fundamental transverse mode in the direction parallel to the substrate surface so as to satisfy the phase condition of Bragg reflection such that the confinement of the fundamental transverse mode by the periodic structure of the refractive index is achieved in one of the mutually perpendicular two directions (referred to hereinafter as first direction) with highest efficiency in this first direction, and at the same time the width of the low refractive index region and the width of the high refractive index region are set to other values in the second direction perpendicular to the first direction, the Bragg reflection condition is not satisfied in the second direction. Thereby, the efficiency of transverse mode is weakened in the second direction as compared with the first direction.

Thus, laser oscillation with the mode having the electric field amplitude (polarization) in the second direction is suppressed as a result of the loss caused by mode leakage. Thus, laser oscillation occurs selectively only in the fundamental transverse mode having the polarization in the first direction.

Thus, with the twenty first mode of the present invention, it becomes possible to control the polarization direction of the output laser beam in a particular direction by providing anisotropy in the periodic structure of refractive index provided around the low refractive index core. Further, the surface-emission laser diode performs operation up to high output power state while maintaining the single fundamental transverse mode oscillation.

With regard to the method of providing anisotropy to the periodic structure, it is also possible to change the refractive index or repetition pitch of the low refractive index region and the high refractive index region, in addition to the approach of changing the width of the low refractive index region and the width of the high refractive index region.

With regard to the current confinement structure of the surface-emission laser diode of the present mode of the invention, it is preferable to use the high resistance region formed by hydrogen ion implantation process similarly to the case of the nineteenth mode of the invention. With this, the operation similar to the one explained with reference to the nineteenth mode of the invention is attained, and it becomes possible to provide a device of low device resistance, small capacitance and superior electric characteristics including the frequency characteristics.

Because of small heat generation and high efficiency of heat radiation, it becomes possible to obtain a high differential gain and high output power. Thereby, it becomes possible to realize a high relaxation oscillation frequency. Thus, a surface-emission laser diode capable of high speed modulation is obtained.

(Twenty Second Mode of Invention)

According to the twenty second mode of the present invention, there is provided a surface-emission layer diode according to any of the twentieth or twenty first aspects of the present invention, wherein a reflection wavelength band of said periodic structure is set, in one of said two directions crossing perpendicularly with each other, to be longer than a wavelength of a fundamental transverse mode in said same direction and projected upon said substrate surface.

In order to obtain a high polarization ratio in the surface-emission laser diode of the twentieth or twenty first aspect of the present invention up to high output power state, it is necessary to suppress the laser oscillation with the mode having the polarization direction in the foregoing second direction.

For this purpose, it is effective to set the reflection band (stop band) of the periodic structure in the second direction to be relatively longer than the lateral wavelength (wavelength projected upon the substrate surface) of the fundamental transverse mode in the second direction.

As can be seen from Equation (1), the lateral wavelength of the higher-order transverse mode is always shorter than the lateral wavelength of the fundamental transverse mode. Thus, it becomes possible to realize low reflectivity and large mode leakage to all the modes by setting the stop band of the periodic structure of refractive index at the longer wavelength side with respect to the lateral wavelength of the fundamental transverse mode.

With this, laser oscillation with the mode having polarization in the second direction is effectively suppressed and high polarization ratio is achieved. The wavelength of the fundamental transverse mode projected upon the substrate surface can be evaluated from the structure of the surface-emission laser diode by using Equation (1).

Thus, with the twenty second mode of the invention, it becomes possible to suppress the laser oscillation in the mode having electric field amplitude in the second direction more efficiently, and it becomes possible to obtain a single fundamental transverse mode oscillation having a large polarization ratio up to high output power state.

(Twenty Third Mode of Invention)

According to the twenty third mode of the present invention, there is provided a surface-emission laser diode constructed on a substrate having a substrate surface, comprising:

an active layer parallel to said substrate surface;
a pair of cavity spacer layers provided so as to sandwich said active layer;
a pair of distributed Bragg reflectors provided across said active layer and said cavity spacer layers so as to sandwich said active layer and said cavity spacer layers therebetween;
a high resistance region defining a current injection region for injecting a current into said active layer,
laser oscillation being caused in a laser cavity region between said pair of distributed Bragg reflectors acting as cavity mirrors in a direction perpendicular to said substrate surface in correspondence to said current injection region,
a refractive index structure provided in a plane parallel to said substrate surface, said refractive index structure comprising: a low refractive index core including said laser cavity region at a central part thereof; and a periodic structure provided around said low refractive index core, said periodic structure comprising a low refractive region surrounding said low refractive index core and a high refractive index region surrounding said low refractive index region, said low refractive index region and said high refractive index region being repeated alternately in said plane parallel to said substrate,
wherein said periodic structure is provided partially in said plane parallel to said substrate surface in a specific direction.

Here, the low refractive index core may be the laser oscillation region corresponding to the current injection region.

With the twenty third mode of the present invention, in which there is provided a surface-emission laser diode constructed on a substrate having a substrate surface, comprising: an active layer parallel to said substrate surface; a pair of cavity spacer layers provided so as to sandwich said active layer; a pair of distributed Bragg reflectors provided across said active layer and said cavity spacer layers so as to sandwich said active layer and said cavity spacer layers therebetween; a high resistance region defining a current injection region for injecting a current into said active layer, laser oscillation being caused in a laser cavity region between said pair of distributed Bragg reflectors acting as cavity mirrors in a direction perpendicular to said substrate surface in correspondence to said current injection region, a refractive index structure provided in a plane parallel to said substrate surface, said refractive index structure comprising: a low refractive index core including said laser cavity region at a central part thereof; and a periodic structure provided around said low refractive index core, said periodic structure comprising a low refractive region surrounding said low refractive index core and a high refractive index region surrounding said low refractive index region, said low refractive index region and said high refractive index region being repeated alternately in said plane parallel to said substrate, wherein said periodic structure is provided partially in said plane parallel to said substrate surface in a specific direction, it becomes possible to confine the fundamental transverse mode selectively and effectively in the direction (hereinafter the direction in which control of polarization direction is made will be referred to as first direction similarly to nineteenth mode of the invention) in which the periodic structure of the low refractive index region and the high refractive index region is provided, and it becomes possible to obtain the single fundamental transverse mode laser oscillation up to high output power state.

With regard to the second direction (hereinafter, the direction in which the laser oscillating is suppressed will be referred to as second direction, similarly to the nineteenth mode of invention), in which no periodic structure is provided, there exists complete antiguiding action, and in view of the absence of confinement structure of the transverse mode, there appears a large loss caused by mode leakage in the direction parallel to the substrate surface. Thereby, laser oscillation is effectively suppressed.

Thus, it becomes possible to obtain a single fundamental transverse mode laser oscillation with polarization in the first direction.

Because the periodic structure of the high refractive index region and the low refractive index region provided in the first direction confines only the fundamental transverse mode selectively, there appears a large loss with regard to the higher-order transverse mode similarly to the case of confinement in the second direction.

Thus, it becomes possible to obtain a single fundamental transverse mode laser oscillation up to high output power state with polarization aligned in the first direction.

With regard to the current confinement structure of the surface-emission laser diode of the twenty third mode of the invention, it is preferable to use the high resistance region formed by hydrogen ion implantation process similarly to the case of the nineteenth mode through twenty second of the invention. With this, the operation similar to the one explained with reference to the nineteenth mode of the invention is attained, and it becomes possible to provide a device of low device resistance, small capacitance and superior electric characteristics including the frequency characteristics.

Because of small heat generation and high efficiency of heat radiation, it becomes possible to obtain a high differential gain and high output power. Thereby, it becomes possible to realize a high relaxation oscillation frequency. Thus, a surface-emission laser diode capable of high speed modulation is obtained.

(Twenty Fourth Mode of Invention)

According to the twenty fourth mode of the present invention, there is provided a surface-emission laser diode according to any of the nineteenth through twenty third modes of the invention, wherein the active layer is formed of a group III-V compound semiconductor material, the group III element constituting the active layer contains at least one of Ga and In, and wherein the group V element constituting the active layer includes one or all of As, N, Sb and P.

Thus, the surface-emission laser diode of the twenty fourth aspect of the present invention contains one or all of Ga and In as the group III element constituting the active layer and one or all of As, N, Sb and P as the group V element.

By using the foregoing material for the active layer, it becomes possible to obtain a surface-emission laser diode having an oscillation wavelength in the range of 1.1 μm to 1.6 μm on a GaAs substrate.

On a GaAs substrate, it is possible to provide a distributed Bragg reflector that uses an AlGaAs mixed crystal having excellent characteristics, and with this, it becomes possible to obtain a laser diode of excellent characteristics. Among these materials, GaInNAs in which nitrogen is added to GaInAs with an amount of several percent or less is particularly suitable for the active layer of the laser diode in view of it large conduction band discontinuity with regard to the barrier layer of GaAs, and the like. Because of this, the laser diode of the thirteenth aspect of the present invention has a superior temperature characteristic to the conventional laser diode of the same wavelength band and formed on an InP substrate.

Further, according to the nineteenth through twenty third modes of the present invention, the laser diode provides the laser beam with polarization aligned in a specific direction, and the influence of noise caused by the polarization-dependent reflectivity of the optical system is eliminated. Further, the laser diode maintains single transverse mode oscillation up to high output power state, and a large coupling efficiency is realized with regard to an optical fibber, or the like.

Thus, a surface-emission laser diode suitable for optical fiber communication is obtained.

(Twenty Fifth Mode of Invention)

According to the twenty fifth mode of the present invention, there is provided a surface-emission laser array formed of a surface-emission laser diode according to any of the nineteenth through twenty fourth modes of the present invention.

Thus, with the surface-emission laser array of the twenty fifth mode of the invention, a monolithic laser array is constructed by using the surface-emission laser diode according to any of the nineteenth through twenty fourth modes of the present invention.

According to the twenty fifth mode of the invention, it becomes possible to form a monolithic array in which the polarization direction is aligned in an arbitrarily set specific direction easily.

Further, according to the fourteenth aspect of the present invention, it becomes possible to obtain a surface-emission laser array capable of maintaining the fundamental transverse mode laser oscillation up to the high output state and producing high quality laser beams. Thus, the surface emission laser array of the present invention is suitable for the optical source of multiple beam writing system for use in an electro-photographic system or for the optical source of long-range optical communication system.

Further, with the surface-emission laser array of the present invention, the polarization direction of the individual elements can be set in an arbitrary direction by the resist patterning process at the time of the photolithographic process, and thus, it becomes possible to obtain a surface-emission laser array in which the polarization direction is set arbitrarily in the individual elements constituting the array.

(Twenty Sixth Mode of Invention)

According to the twenty sixth mode of the present invention, there is provided an optical interconnection system that uses the surface-emission laser diode according to any of the nineteenth through twenty fourth modes of the present invention or the surface-emission laser array according to the twenty fifth mode of the present invention.

Thus, in the optical interconnection system of the twenty sixth mode of the invention, the surface-emission laser diode according to any of the nineteenth through twenty fourth modes of the present invention or the surface-emission laser array according to the twenty fifth mode of the present invention is used for the optical source of the optical interconnection system.

With the surface-emission laser diode or surface-emission laser array of the present invention, the polarization is controlled in a specific direction, and thus, there occurs no problem of noise caused by the optical system due to the dependence of the optical system such as reflectivity on the polarization direction.

Further, because the fundamental transverse mode laser oscillation is maintained up to the high output state, large coupling with optical fiber is achieved.

Further, because laser oscillation in the higher-order transverse mode is suppressed, there occurs little change of optical coupling with the optical fiber even in the case the operational state of the laser diode such as optical output is changed, and thus, there occurs little change of optical injection into the optical fiber. Thus, the optical interconnection system using the surface-emission laser diode or surface-emission laser array of the present mode of the invention has high reliability.

(Twenty Seventh Mode of Invention)

According to the twenty seventh mode of the present invention, there is provided an optical communication system that uses the surface-emission laser diode according to any of the nineteenth through twenty fourth modes of the present invention or the surface-emission laser array according to the twenty fifth mode of the present invention.

Thus, in the optical communication system of the twenty seventh mode of the invention, the surface-emission laser diode according to any of the nineteenth through twenty fourth modes of the present invention or the surface-emission laser array according to the twenty fifth mode of the present invention is used for the optical source of the optical interconnection system.

With the surface-emission laser diode or surface-emission laser array of the present invention, the polarization is controlled in a specific direction, and thus, there occurs no problem of noise caused by the optical system due to the dependence of the optical system such as reflectivity on the polarization direction.

Further, because the fundamental transverse mode laser oscillation is maintained up to the high output state, large coupling with optical fiber is achieved.

Further, because laser oscillation in the higher-order transverse mode is suppressed, there occurs little change of optical coupling with the optical fiber even in the case the operational state of the laser diode such as optical output is changed, and thus, there occurs little change of optical injection into the optical fiber. Thus, the optical communication system using the surface-emission laser diode or surface-emission laser array of the present mode of the invention has high reliability.

(Twenty Eighth Mode of Invention)

According to the twenty eighth mode of the present invention, there is provided an electrophotographic system that uses any of the surface-emission laser diode according to the nineteenth through twenty fourth modes of the present invention or the surface-emission laser array according to the twenty fifth mode of the present invention.

Thus, the electrophotographic system of the twenty eighth mode of the present invention uses any of the surface-emission laser diode according to the nineteenth through twenty fourth modes of the present invention or the surface-emission laser array according to the twenty fifth mode of the present invention as a writing optical source.

With electrophotographic systems, the degree of tolerance in the designing of the optical system is limited and there has been a problem of large influence of the polarization direction on the optical system such as reflectivity. Thus, with the surface-emission laser diode not in which control of polarization direction is not made, it has been difficult to obtain a high definition electrophotographic system.

Contrary to this, the polarization direction is controlled in a specific direction with the surface-emission laser diode or surface-emission laser array of the present invention, and it becomes possible to construct a high definition photographic system.

Further, the output power was small with the conventional surface-emission laser diode, and it has been difficult to use such a surface-emission laser diode as the writing optical source of the electrophotographic system.

Contrary to this, laser oscillation of fundamental transverse mode is obtained with high output power with the surface-emission laser diode or surface-emission laser array of the present invention. Thus, it has become possible to user the surface-emission laser diode or surface-emission laser array as the writing optical source of an electrophotographic system with the present invention.

Further, by using the surface-emission laser diode as the writing optical source of an electrophotographic system, a round or circular output laser beam is obtained. This means that shaping of the laser beam is achieved easily.

Further, because of inherently high positional alignment between the laser diode elements in the array, it becomes possible to focus plural laser beams easily and with excellent reproducibility by using a single lens. Thereby, the construction of the optical system is simplified, and it becomes possible to obtain a high-definition system with low cost.

Because the surface-emission laser diode of the present invention has a large output power, it becomes possible to achieve high speed writing particularly in the case a laser array is used.

Thus, with the present invention, it becomes possible to provide a high-definition electrophotographic system.
(Twenty Ninth Mode of Invention)

According to the twenty ninth mode of the present invention, there is provided an optical disk system that uses any of the surface-emission laser diode according to the nineteenth through twenty fourth modes of the present invention or the surface-emission laser array according to the twenty fifth mode of the present invention.

Thus, the optical disk system of the twenty ninth mode of the present invention uses any of the surface-emission laser diode according to the nineteenth through twenty fourth modes of the present invention or the surface-emission laser array according to the twenty fifth mode of the present invention as a read/write optical source.

Among various optical disk systems, a magneto-optical disk requires a laser source having linear polarization for reading signals. Because the surface-emission laser diode of the present invention provides linear polarization in which the polarization direction is aligned in a specific direction, it becomes possible to use a surface-emission laser diode for the reading optical source of the magneto-optical disk, in which the use of surface-emission laser diode has hitherto been difficult.

Further, because of small output power in the single fundamental transverse mode laser oscillation, it has been difficult to use a conventional surface-emission laser diode for the optical source of an optical disk system.

With the surface-emission laser diode or surface-emission laser array of the present invention, stable fundamental transverse mode laser oscillation is obtained up to high output power state. Thus, it becomes possible to use a surface-emission laser diode or surface-emission laser array as the writing optical source of an optical disk system with the present invention, and it becomes possible to construct a reliable optical disk system. By using a surface-emission laser array, it becomes possible to achieve high-density reading and writing becomes possible, and it becomes possible to construct a high-speed optical disk system.

Thus, with the present invention, it becomes possible to provide a highly reliable optical system capable of high-speed access.

EXAMPLE 15

Figure 21A:
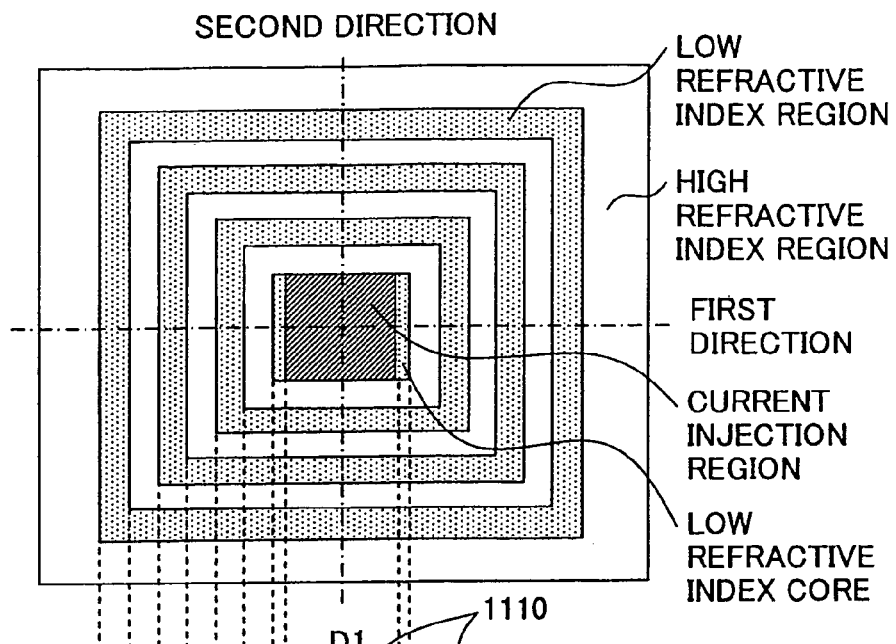
FIGS. 21A-21C are diagrams showing the surface-emission laser diode of Example 15.
Figure 21B:
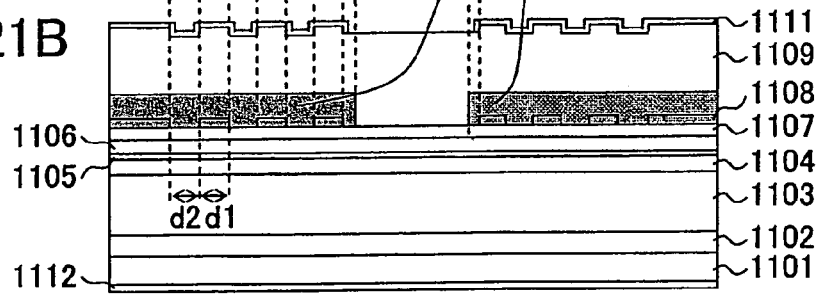
Figure 21C:
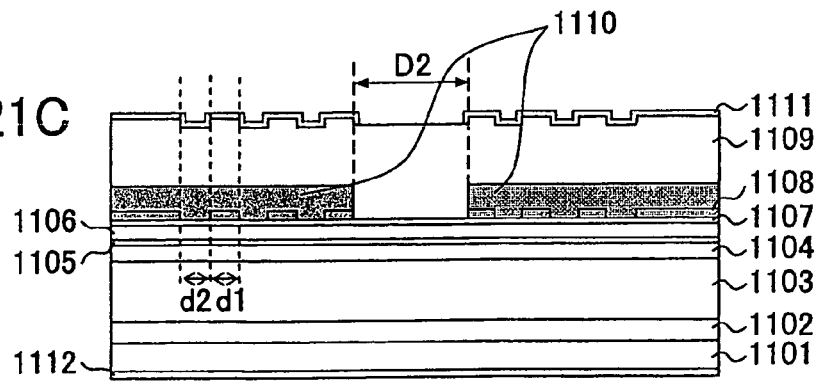

FIGS. 21A-21C show a surface-emission laser diode according to Example 15 of the present invention, wherein FIG. 21A shows a top plan view of the laser diode, while FIGS. 21B and 21C respectively show the laser diode in a cross-section taken in a first direction and a second direction represented in FIG. 21A.

The laser diode of Example 15 is a surface-emission laser diode having an active layer of InGaAs and operating in the 0.98 μm band.

The surface-emission laser diode of Example 15 is formed conducting a crystal growth process by using an organic metal chemical vapor deposition (MOCVD) process, wherein trimethyl aluminum (TMA), trimethyl gallium (TMG) and trimethyl indium (TMI) are used for the source of the group III elements while an arsine ($AsH_3$) gas is used for the group V source. Further, $CBr_4$ is used for the source of C (carbon) used for the p-type dopant and $H_2Se$ is used for source of Se used as the n-type dopant.

Hereinafter, the fabrication process thereof will be explained according to the fabrication process.

More specifically, the device of Example 15 is constructed on an n-GaAs substrate 1101 and includes an n-GaAs buffer layer 1102 formed on the substrate 1101, and an n-AlAs/GaAs lower semiconductor distributed Bragg reflector 1103 is formed on the buffer layer 1102, wherein the lower distributed Bragg reflector 1103 includes therein repetition of an n-AlAs/GaAs pair repeated for 36 times.

Further, a cavity spacer layer 1104 of undoped GaAs is formed on the lower distributed Bragg reflector 1103, and a multiple quantum well active layer 1105 of InGaAs/GaAs is formed further on the cavity spacer layer 1104.

Further, another cavity spacer layer 1106 of undoped GaAs is formed on the active layer 1105, and a p-$Ga_{0.5}In_{0.5}P$ layer 1107 and a p-GaAs layer 1108 are grown consecutively.

Here, the semiconductor layers constituting the semiconductor distributed Bragg reflector 1103 are formed with the thickness such that there is caused a phase difference of $\pi/2$ of laser oscillation light in each of the semiconductor layers (thickness corresponding to ¼ the oscillation wavelength in the respective semiconductor layers).

Further, the p-GaInP layer 1107 is formed as a part of an upper distributed Bragg reflector and is grown with the thickness such that there occurs a phase difference of laser oscillation light of $\pi/2$ in the GaInP layer (¼ thickness of the oscillation wavelength in the GaInP layer). Further, the thickness of the p-GaAs layer 1108 is set to 50 nm. Thereby, it should be noted that the upper distributed Bragg reflector is formed by the layers 1107, 1108 and 1109.

It should be noted that the InGaAs/GaAs quantum well active layer 1105 and the GaAs cavity spacer layers 1104 and 1106 above and below the active layer 1105 are formed with respective thicknesses such that there is caused a total phase difference of $2\pi$ in the laser oscillation light wave in these semiconductor layers. Thereby, there is formed a one-wavelength cavity by these layers. In order to achieve high stimulation emission probability, the InGaAs/GaAs quantum well active layer 1105 is formed in correspondence to the anti-node of the standing wave of laser oscillation light wave formed at the mid part of the cavity spacer layers 1104 and 1106.

Thus, in the case the refractive index of the cavity spacer layers 1104 and 1106 is larger than the refractive index of the semiconductor layers 1103 and 1107 constituting a part of the semiconductor distributed Bragg reflector as in the case of Example 15, it becomes possible to form the cavity structure (1λ cavity structure) such that the active layer provided at the mid part of the cavity spacer layers 1104 and 1106 is located in correspondence to the node of the standing wave by setting the phase difference caused in the laser oscillation light wave by the cavity spacer layers 1104 and 1106 and the active layer 1105 to be equal to an integer multiple of $2\pi$. In this case, the boundary between the semiconductor distributed Bragg reflector and the cavity spacer layer 1104 or 1106 is formed at the location corresponding to the anti-node of the laser oscillation light wave.

Next, a resist pattern is formed on the device surface in correspondence to the high refractive index region shown in FIG. 21A, and the p-GaAs layer 1108 corresponding to the low refractive index region of FIG. 21A is removed by a wet etching process while using a sulfuric acid etchant. Here, it should be noted that the wet etching of the p-GaAs layer 1108 is conducted selectively by using the underlying p-GaInP layer 1107 as an etching stopper.

Next, removal of the resist is conducted, and after applying an appropriate surface cleaning process, growth of the p-AlAs/GaAs semiconductor distributed Bragg reflector 1109 is conducted by a regrowth process. Here, it should be noted that the growth of the p-AlAs/GaAs semiconductor distributed Bragg reflector 1109 is started from the p-GaAs layer 1108, wherein the p-GaAs layer 1108 is grown with the thickness chosen such that there is caused a phase difference of $\pi/2$ therein (¼ thickness of the oscillation wavelength in the GaAs layer).

Thus, in the region where the etching of the p-GaAs layer 1108 is conducted, the respective layers constituting the semiconductor distributed Bragg reflector 1109 are formed to have the thicknesses so as to satisfy the phase condition of multiple reflection of the semiconductor distributed Bragg reflector with respect to the designed laser oscillation wavelength.

In the region where the etching removal of the p-GaAs layer 1108 has not been made, on the other hand, the GaAs layer is formed to have an increased thickness as compared with the region where the etching has been made. Further, there is provided a contact layer (not shown) by the outermost GaAs layer of the upper p-AlAs/GaAs distributed Bragg reflector 109 by increasing the carbon concentration at the surface part thereof.

Next, a resist pattern is formed on the device surface, and a current confinement structure 1110 is formed in the form of a high resistance region by a hydrogen-ion implantation process. Here, the current confinement diameter of the current confinement structure 1110 is set to 8 μm.

It should be noted that FIG. 21A shows the region not conducted with the hydrogen ion implantation (current injection region) by hatching, wherein it will be noted that the current injection region is formed inside the low refractive index core so as to overlap with the low refractive index core spatially.

Next, a p-side electrode 1111 is formed on the device surface and an n-side electrode 1112 is formed on the rear side of the substrate after polishing of the rear side. Thereby, a surface-emission laser diode having the cross-section shown in FIGS. 21B and 21C is obtained.

Thus, by changing the thickness of the layers located close to the cavity spacer layer and constituting the distributed Bragg reflector by using the etching and regrowth process, it becomes possible to change the laser oscillation wavelength in the laser cavity direction (the direction perpendicular to the substrate) within the plane parallel to the substrate surface.

Here, it should be noted that the resonant wavelength in the region where the etching has been made is shifted shorter than the resonant wavelength where the etching has not been made.

Here, it should be noted that the effective refractive index in the direction parallel to the substrate becomes relatively smaller as explained in relation to the nineteenth mode of the present invention. More specifically, there is achieved a change of effective refractive index of about 0.1 for the shift of the resonant wavelength of 50 nm.

Hereinafter, the construction of the surface-emission laser diode of Example 15 will be explained in detail.

With the surface-emission laser diode of Example 15, there is provided a low refractive index core of a small region having a small effective refractive index at the central part of the laser oscillation region in the direction parallel to the substrate surface as shown in FIG. 21A.

Further, there is provided a cladding layer of high refractive index region around the low refractive index core, and with this, there is formed an antiguiding structure.

Further, in the region inside the high refractive cladding layer and contacting the low refractive index core, there is formed a periodic structure of refractive index in which a low refractive index region and a high refractive index region are repeated three times.

Here, it should be noted that the low refractive index core has a rectangular shape as shown in FIG. 21A, and thus, the low refractive index core has a width D1 in the first direction relatively larger than a width D2 thereof in the second direction. More specifically, in the surface-emission laser diode of Example 15, the low refractive index core has the width D1 of 10 μm in the first direction and the width D2 of 8 μm in the second direction.

Further, the wavelength in the direction parallel to the substrate surface is determined by the width d and effective refractive index $n_0$ of the low refractive index core and by the effective index $n_1$ of the high refractive index layer surrounding the low refractive index core as shown in Equation (1). Thus, in the first direction and in the second direction in which the width d of the low refractive index core is different, the wavelength in the direction parallel to the substrate surface takes different wavelength values.

Herein, the wavelength of the fundamental transverse mode in the high refractive index cladding layer parallel to the substrate surface is designated as $\lambda_1^{\ 1}$ in the foregoing first direction and $\lambda_1^{\ 2}$ in the foregoing second direction. Here, it should be noted that the wavelength in the direction parallel to the substrate surface means the wavelength corresponding to the wavenumber of the fundamental transverse mode in the high refractive cladding layer in the direction parallel to the substrate surface.

Further, in both of the first and second directions, the width d1 of the high refractive index region and the width d2 of the low refractive index region constituting the periodic structure are set, with regard to the wavelength of the fundamental transverse mode parallel to the substrate surface in the first direction, such that there appears a phase difference of odd integer multiple of $\pi/2$ in the respective regions in the respective directions (odd integer multiple of ¼ the wavelength in the respective media in the direction parallel to the substrate surface).

Thus, in the first direction, there is formed a cavity structure similar to the one provided in the vertical direction by using the periodic structure formed of the regions of different refractive indices as the reflector.

Here, it should be noted that, in the cavity structure formed in the first direction, the refractive index of the core is smaller than the refractive index of the high refractive index region provided adjacent thereto in the first direction. Thus, there is formed a half wavelength cavity structure in which the boundary between the low refractive index core and the high refractive index region forms a node of the standing wave.

It should be noted that the wavelength in the low refractive index region in the direction parallel to the substrate surface corresponds to twice the width of the low refractive index core.

Thus, by forming the low refractive index region to have the width d2 with regard to the width D1 of the low refractive index core in the first direction, such that the width d2 is equal to ¼ times the quantity 2D1, the foregoing condition is satisfied.

The wavelength $\lambda_1^{\;1}$ in the high refractive index region in the direction parallel to the substrate surface is obtained from Equation (1). Thus, the foregoing condition is satisfied by setting the width $d_1$ of the high refractive index to be ¼ times the wavelength $\lambda_1^{\;1}$ parallel to the substrate surface in the first direction. In the illustrated example of the surface emission laser diode of Example 15, $d_1$ and $d_2$ are set respectively as $d_1$=1.27 µm (=3$\lambda_1^{\;1}$/4) and $d_2$=5 µm (=$D_1$/2).

In this way, the reflection wavelength band (stop band) formed by the periodic structure is chosen so as to correspond to the wavelength $\lambda_1^{\;1}$ of the fundamental transverse mode in the direction parallel to the substrate surface, and thus, the fundamental transverse mode having the polarization in the first direction is confined into the low refractive index core by causing resonance with the cavity structure provided in the direction parallel to the substrate surface.

Here, the width of the stop band is decreased by decreasing the number of repetitions in the periodic structure, and this, it is possible to selectively confine the fundamental transverse mode. Thus, the periodic structure of Example 15 selectively confines the fundamental transverse mode having the polarization in the first direction.

In the second direction, on the other hand, the width of the low refractive index core is formed to have a reduced width as compared with the width in the first direction, and thus, the wavelength $\lambda_1^{\;2}$ of the fundamental transverse mode in the direction parallel to the substrate surface having the polarization in the second direction is offset in the short wavelength side as compared with the wavelength $\lambda_1^{\;1}$ of the fundamental transverse mode in the direction parallel to the substrate and having the polarization direction in the first direction, while this means that the value of the wavelength $\lambda_1^{\;2}$ is outside the stop band formed by the periodic structure of the refractive index. As a result, confinement of the transverse mode is weakened in the second direction as compared with the first direction.

Thus, with regard to the transverse mode in the second direction, there occurs extensive mode leakage in the direction parallel to the substrate surface, and because of this extensive mode leakage, laser oscillation in the transverse mode having the polarization direction in the second direction is effectively suppressed.

Further, it should be noted that the wavelength in the direction parallel to the substrate surface (direction parallel to the substrate) offsets in the shorter wavelength direction with increasing order of the higher-order transverse mode, and thus, it becomes possible to set the wavelength parallel to the substrate surface in the second direction to be shorter for all the higher-order transverse modes than the wavelength of the fundamental transverse mode parallel to the substrate surface in the first direction, by choosing the width D2 of the low refractive index core in the second direction to be smaller than the width D2 of the low refractive index core in the first direction. In other words, it is possible to set the wavelength offset from the stop band of the periodic structure of the refractive index optimized with regard to the first direction. Thus, it becomes possible to increase the loss in the second direction for all of the higher order transverse modes, and the laser oscillating which such higher order transverse mode is effectively suppressed.

Thus, with the surface emission laser diode of Example 15, it becomes possible to obtain a single fundamental transverse laser oscillation having the polarization in the first direction up to high output power state.

Further, with the surface-emission laser diode of Example 15, in which transverse mode control is not achieved by the selectively oxidized current confinement layer contrary to the case of the selectively oxidized surface-emission laser diode, it becomes possible to increase the diameter of current confinement. Thereby, the surface-emission laser diode of Example 15 has the preferable feature of low device resistance.

Further, because there is formed no mesa structure by etching process, the laser diode has excellent heat radiation performance. Thus, the device of Example 15 has another advantageous feature that the level of output saturation caused by heat is increased. Further, contrary to the case of the surface-emission laser diode of the selective oxidation type, the laser diode of Example 15 does not include a selectively oxidized current confinement layer inside the device structure. Thus, parasitic capacitance is decreased and the laser diode can be modulated at high speed.

Figure 22:
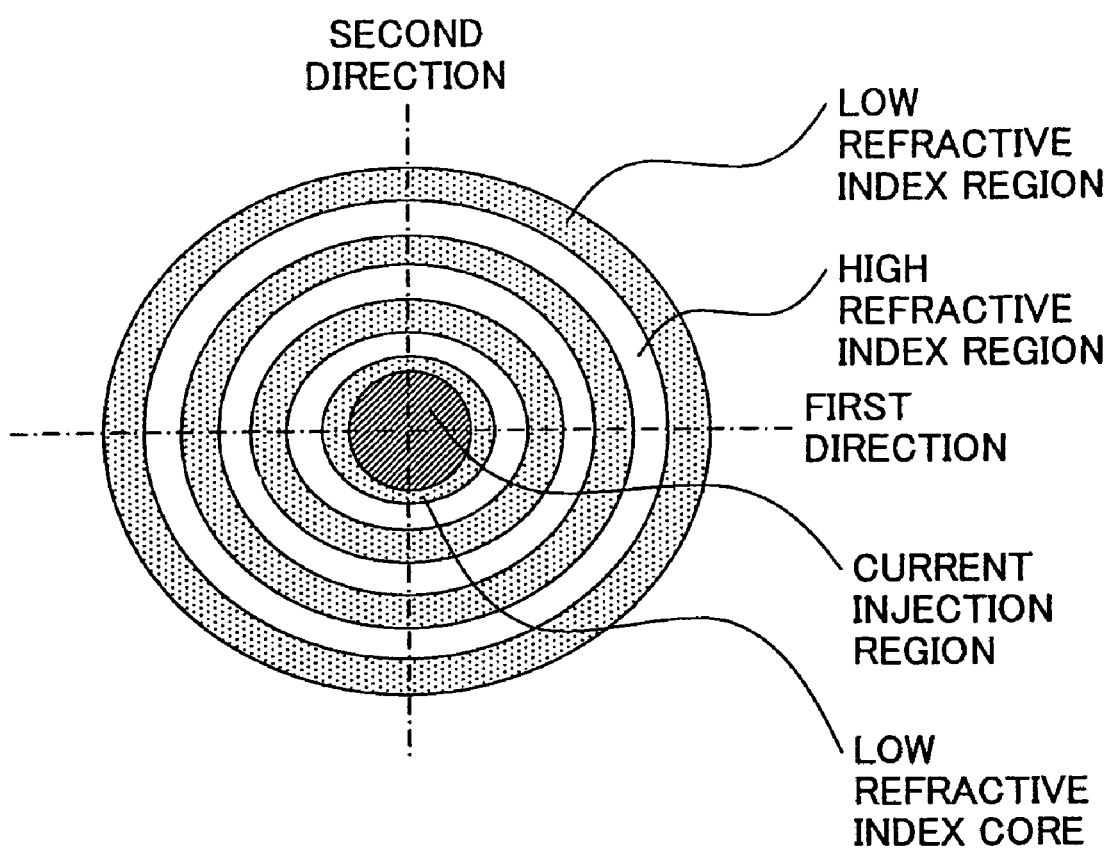
FIG. 22 is a diagram showing a modification of the surface-emission laser diode of FIGS. 21A-21C.

While Example 15 has been explained for the case the periodic structure of refractive index provided in the direction perpendicular to the laser cavity direction (direction parallel to the substrate) and the hydrogen ion injection region have a rectangular shape in the plan view, the present invention is not limited to such a specific construction, and it is also possible to use an elliptic shape as shown in FIG. 22.

In the surface-emission laser diode of FIG. 22, the major axis direction and minor axis direction of ellipse are chosen respectively as the first direction and the second direction, and the width of the low refractive index region and the high refractive index region of the periodic structure of refractive index are such that the wavelength of the fundamental transverse mode parallel to the substrate surface in the first direction corresponds to the center of the stop band wavelength.

With this, it becomes possible to obtain a single fundamental transverse mode oscillation having the polarization in the first direction similarly to the device of FIGS. 21A-21C.

EXAMPLE 16

Figure 23A:
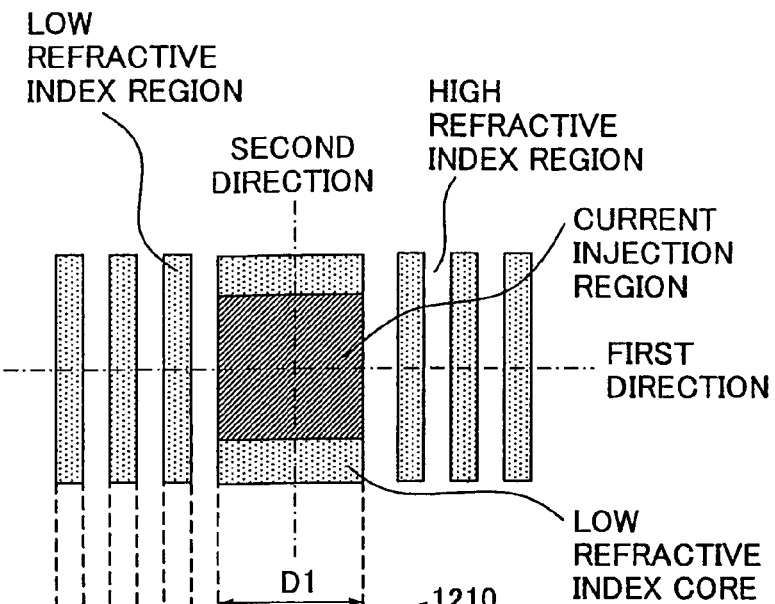
FIGS. 23A-23C are diagrams showing the surface-emission laser diode of Example 16.
Figure 23B:
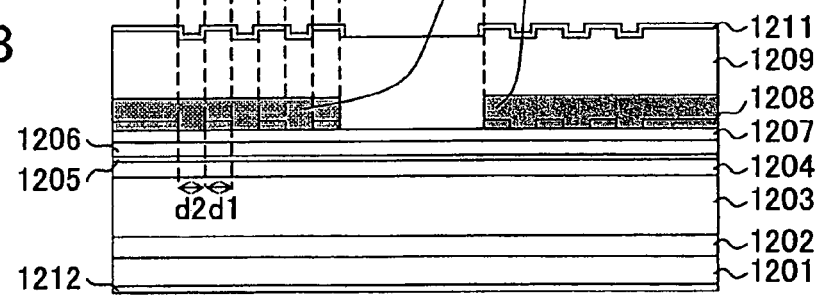
Figure 23C:
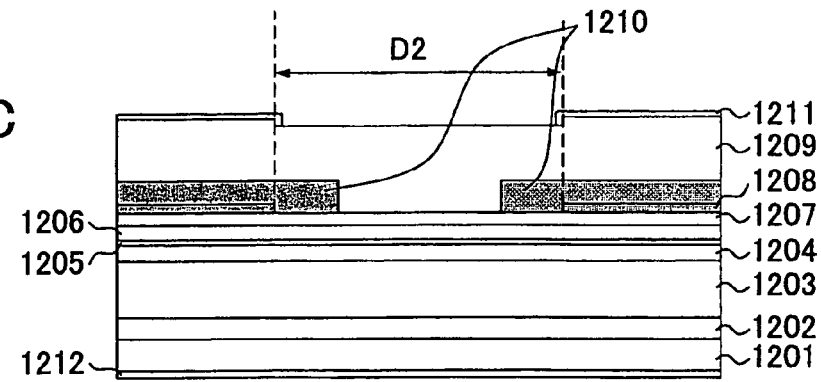

FIGS. 23A-23C show a surface-emission laser diode according to Example 16 of the present invention, wherein FIG. 23A shows a top plan view of the laser diode, while FIGS. 23B and 23C respectively show the laser diode in a cross-section taken in a first direction and a second direction represented in FIG. 23A.

The laser diode of Example 16 is a surface-emission laser diode having an active layer of GaInNAs and operating in the 1.3 µm band. The surface emission laser diode of Example 16 is formed according to the process and steps similar to those used with Example 15 while using dimethyl hydrazine (DMHy) as the nitrogen source of the active layer.

Hereinafter, the structure thereof will be explained.

More specifically, the device of Example 16 is constructed on an n-GaAs substrate 1201 and includes an n-GaAs buffer layer 1202 formed on the substrate 1201, and an n-AlAs/GaAs lower semiconductor distributed Bragg reflector 1203 is formed on the buffer layer 1202, wherein the lower distributed Bragg reflector 1203 includes therein repetition of an n-AlAs/GaAs pair repeated for 36 times.

Further, a cavity spacer layer 204 of undoped GaAs is formed on the lower distributed Bragg reflector 1203, and a multiple quantum well active layer 1205 of GaInNAs/GaAs multiple quantum well structure is formed further on the cavity spacer layer 1204.

Further, another cavity spacer layer 1206 of undoped GaAs is formed on the active layer 1205, and a p-$Ga_{0.5}In_{0.5}P$ layer 1207 and a p-GaAs layer 1208 are grown consecutively.

Here, the semiconductor layers constituting the semiconductor distributed Bragg reflector 1203 are formed with the thickness such that there is caused a phase difference of $\pi/2$ of laser oscillation light wave in each of the semiconductor layers (thickness corresponding to ¼ the oscillation wavelength in the respective semiconductor layers), similarly to the case of Example 15. Thereby, there is formed a cavity having the 1λ cavity structure similarly to Example 15.

Further, the p-$Ga_{0.5}In_{0.5}P$ layer 1207 is formed to have a thickness such that there appears a phase difference of $\pi/2$ in the laser oscillation light in the $Ga_{0.5}In_{0.5}P$ layer (¼ thickness of the oscillation wavelength in the respective semiconductor layers). Further, the thickness of the p-GaAs layer is set to 50 nm.

Next, by using a photolithographic process, there is formed a resist pattern on the device surface in correspondence to the high refractive index region shown in FIG. 23A, and the GaAs layer 208 is removed by using a sulfuric acid etchant.

Next, the resist is removed, and after appropriate surface cleaning processing, growth of the layer 1209 forming a part of the upper p-AlAs/GaAs distributed Bragg reflector is conducted such that the growth starts from the GaAs layer 1208. In the surface-emission laser diode, it should be noted that the upper distributed semiconductor Bragg reflector is formed of the layers 1207, 1208 and 1209. Thereby, it should be noted that the first GaAs layer 1208 forming the first regrowth layer is grown so as to have a thickness in which a phase difference of $\pi/2$ is caused for the oscillation light wave in the GaAs layer 1208 (¼ thickness of oscillation wavelength in the GaAs layer 1208).

Thus, in the region of the p-GaAs layer 1208 where the etching has been made, the layers constituting the semiconductor distributed Bragg reflector are formed with respective thicknesses that satisfy the phase condition of multiple reflection of the semiconductor distributed Bragg reflector. On the other hand, in the region of the p-GaAs layer 1208 where the etching has not been made, the GaAs layer 208 is formed with increased thickness as compared with the region where the etching has been made.

Next, a resist pattern is formed on the device surface, and a current confinement structure 210 is formed in the form of a high resistance region by a hydrogen-ion implantation process. Here, the current confinement diameter of the current confinement structure 1210 is set to 14 μm.

With the surface-emission laser diode of Example 16, the low refractive index core has a width D1 of 14 μm in the first direction relatively and the width D2 of 20 μm in the second direction.

It should be noted that the region not conducted with the hydrogen ion implantation (current injection region) is shown in FIG. 23A by hatching, wherein it will be noted that the current injection region is formed inside the low refractive index core so as to overlap with the low refractive index core spatially.

Here, it should be noted that the resonant wavelength in the region where the etching of the p-GaAs layer 1208 has been made is shifted relatively shorter than the resonant wavelength where the etching has not been made. Thereby, there is formed a low refractive index region having a small effective refractive index in the direction perpendicular to the laser cavity direction (direction parallel to the substrate).

With the surface-emission laser diode of Example 16, there is provided a low refractive index core of a small region having a small effective refractive index at the central part of the laser oscillation region in the direction parallel to the substrate surface as shown in FIGS. 23A-23C.

Further, there is provided a cladding layer of high refractive index region around the low refractive index core, and with this, there is formed an antiguiding structure.

Further, in the region inside the high refractive cladding layer and contacting with the low refractive index core, there is formed a periodic structure of refractive index in the first direction in which a low refractive index region and a high refractive index region are repeated three times. With the device of Example 16, there is provided no periodic structure in the second direction as shown in FIGS. 23A-23C.

Further, in the first direction, the width d1 of the high refractive index region and the width d2 of the low refractive index region constituting the periodic structure are set, with regard to the wavelength of the fundamental transverse mode parallel to the substrate surface in the first direction, such that there appears a phase difference of odd integer multiple of $\pi/2$ in the respective regions in the respective directions (odd integer multiple of ¼ the wavelength in the respective media in the direction parallel to the substrate surface).

Thus, in the first direction, there is formed a cavity structure similar to the one provided in the vertical direction by using the periodic structure formed of the regions of different refractive indices as the reflector similarly to Example 15.

Thus, the fundamental transverse mode having polarization in the first direction cause resonance with the foregoing periodic structure and is confined in the direction parallel to the substrate. Thereby, loss by mode leakage in the direction parallel to the substrate surface is effectively suppressed.

With regard to the second region, on the other hand, only the high refractive index cladding makes contact with the low refractive index core, and there is formed a complete half waveguide structure by the real refractive index difference. Thus, there is caused mode leakage for the entire modes in the direction parallel to the substrate surface, and thus, there appears large mode loss in the polarization in the second direction.

Here, it should be noted that the wavelength in the low refractive index region in the direction parallel to the substrate surface corresponds to twice the width of the low refractive index core as explained with reference to Example 15.

Thus, by forming the low refractive index region to have the width d2 with regard to the width D1 of the low refractive index core in the first direction, such that the width d2 is equal to ¼ times the quantity 2D1, the foregoing condition is satisfied.

The wavelength $\lambda_1^1$ in the high refractive index region in the direction parallel to the substrate surface is obtained from Equation (1). Thus, the foregoing condition is satisfied by setting the width $d_1$ of the high refractive index to be ¼ times the wavelength $\lambda_1^1$ parallel to the substrate surface in the first direction. Here, $\lambda_1^1$ represents the wavelength of the fundamental transverse mode in the high refractive index cladding corresponding to the wavenumbers in the direction parallel to the substrate surface. In the surface emission laser diode of Example 16, $d_1$ and $d_2$ are set respectively as $d_1$=1.69 μm (=$3\lambda_1^1/4$) and $d_2$=7 μm (=$D_1/2$).

From the foregoing, the loss of the fundamental transverse mode having the polarization in the first direction becomes minimum with the surface-emission laser diode of Example 16, and there occurs laser oscillation selectively in the fundamental transverse mode with polarization in the first direction. Further, with the periodic structure of refractive index provided in the first direction, the surface-emission laser diode of Example 16 can maintain the single mode fundamental transverse laser oscillation up to high output power state.

Thus, with the surface emission laser diode of Example 16, it becomes possible to obtain a single fundamental transverse laser oscillation having the polarization in the first direction up to high output power state.

Further, with the surface-emission laser diode of Example 15, in which transverse mode control is not achieved by the selectively oxidized current confinement layer contrary to the case of the selectively oxidized surface-emission laser diode, it becomes possible to increase the diameter of current confinement. Thereby, the surface-emission laser diode of Example 15 has the preferable feature of low device resistance.

Further, because there is formed no mesa structure by etching process, the laser diode has excellent heat radiation performance. Thus, the device of Example 15 has another advantageous feature that the level of output saturation caused by heat is increased. Further, contrary to the case of the surface-emission laser diode of the selective oxidation type, the laser diode of Example 15 does not include a selectively oxidized current confinement layer inside the device structure. Thus, parasitic capacitance is decreased and the laser diode can be modulated at high speed.

Figure 24:
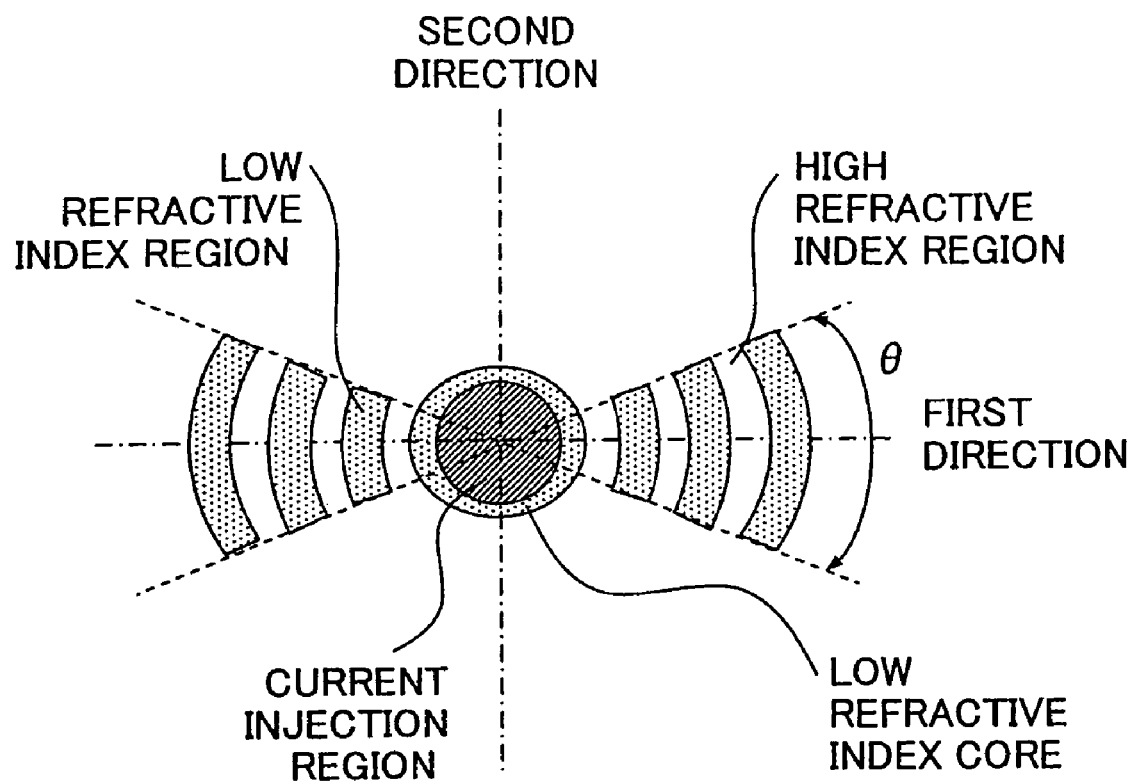
FIG. 24 is a diagram showing a modification of the surface-emission laser diode of FIGS. 23A-23C.

While the foregoing explanation has been made for the case a rectangular low refractive index core shown in FIGS. 23A-23C is provided as an example of providing the confinement structure of the transverse mode only in the first direction, the present invention is not limited to such a specific construction, and it is also possible to use a low refractive index core of elliptic shape as shown in FIG. 24.

FIG. 24 shows an example of the surface-emission laser diode having a construction similar to the one shown in FIGS. 23A-23C except that a low refractive index core of elliptical shape is used.

In FIG. 24, it should be noted that the layered structure in the vertical direction, the resonance condition by the periodic structure of refractive index in the direction parallel to the substrate source, or the like, are determined identical to the case of the device of FIGS. 23A-23C, except that the core of the low refractive index and the periodic structure of refractive index are formed to have an elliptical shape.

In the surface-emission laser diode of FIG. 24, it should be noted that the periodic structure of refractive index is provided so as to extend over an angular range θ including the first direction. In this way, in the case the core is formed to have an elliptical shape or circular shape, it is possible to secure a certain angular range with regard to the first direction.

EXAMPLE 17

Figure 25A:
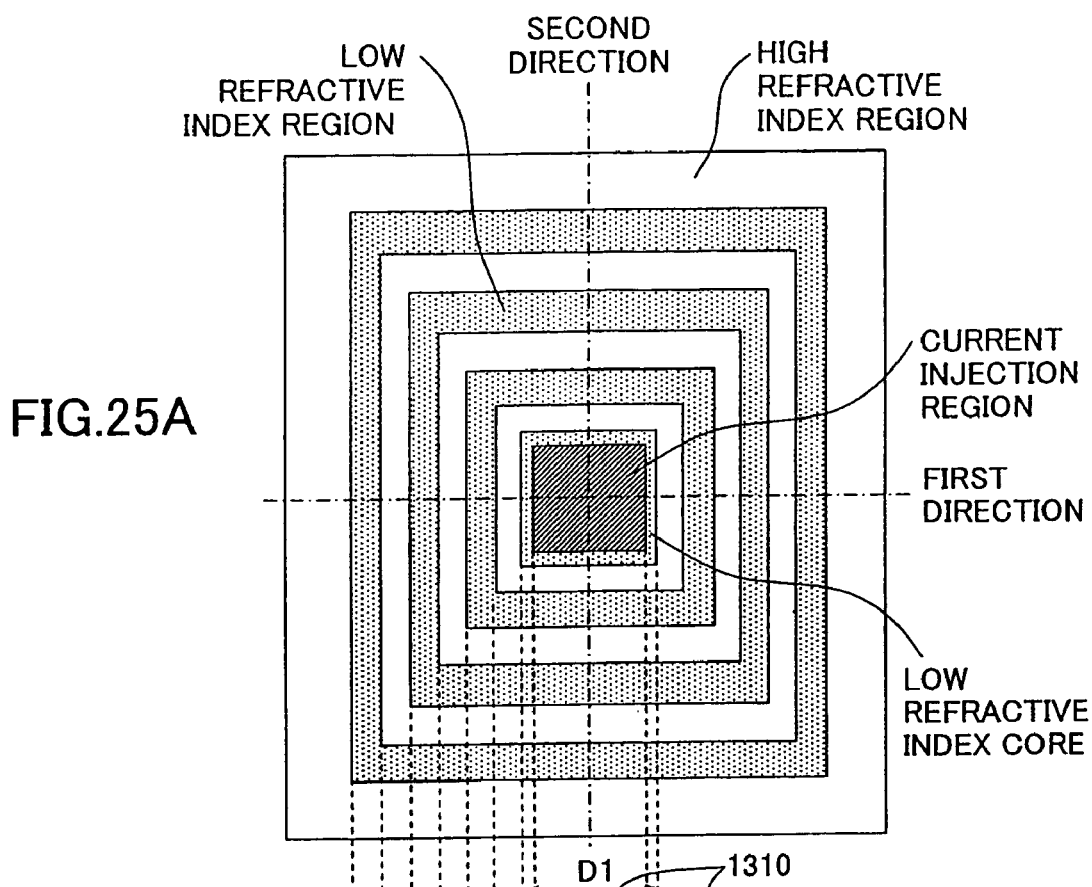
FIGS. 25A-25C are diagrams showing the surface-emission laser diode of Example 17.
Figure 25B:
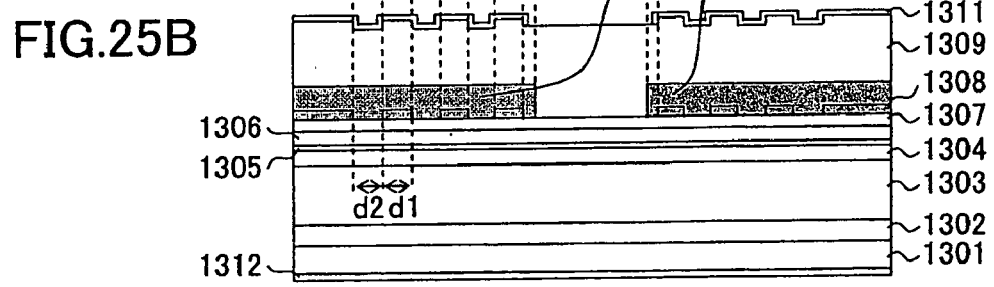
Figure 25C:
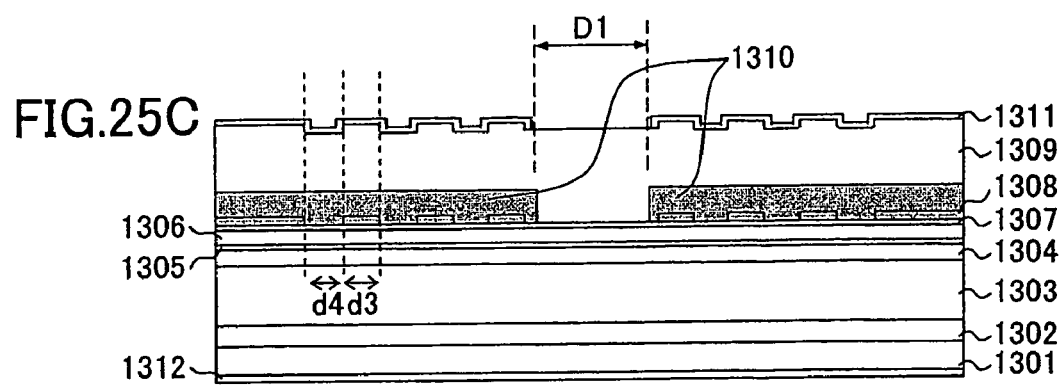

FIGS. 25A-25C show a surface-emission laser diode according to Example 17 of the present invention, wherein FIG. 25A shows a top plan view of the laser diode, while FIGS. 25B and 25C respectively show the laser diode in a cross-section taken in a first direction and a second direction represented in FIG. 25A.

The laser diode of Example 17 is a surface-emission laser diode having an active layer of GaAs and operating in the 0.85 μm band.

The surface-emission laser diode of Example 17 is formed conducting a crystal growth process by using an organic metal chemical vapor deposition (MOCVD) process similarly to the case of Example 15 and Example 16

Hereinafter, the fabrication process thereof will be explained according to the fabrication process.

More specifically, the device of Example 17 is constructed on an n-GaAs substrate 1301 and includes an n-GaAs buffer layer 1302 formed on the substrate 1301, and an n-AlAs/GaAs lower semiconductor distributed Bragg reflector 1303 is formed on the buffer layer 1302, wherein the lower distributed Bragg reflector 1303 includes therein repetition of an n-AlAs/$Al_{0.15}Ga_{0.85}As$ pair repeated for 40 times.

Further, a cavity spacer layer 1304 of undoped $Al_{0.15}Ga_{0.85}As$ is formed on the lower distributed Bragg reflector 1303, and a multiple quantum well active layer 1305 of GaAs/$Al_{0.15}Ga_{0.85}As$ is formed further on the cavity spacer layer 1304.

Further, another cavity spacer layer 1306 of undoped $Al_{0.15}Ga_{0.85}As$ is formed on the active layer 305, and a p-$Ga_{0.5}In_{0.5}P$ layer 1307 and a p-$Al_{0.15}Ga_{0.85}As$ layer 308 are grown consecutively.

Here, the semiconductor layers constituting the semiconductor distributed Bragg reflector 1303 are formed with the thickness such that there is caused a phase difference of π/2 of laser oscillation light in each of the semiconductor layers (thickness corresponding to ¼ the oscillation wavelength in the respective semiconductor layers).

Further, the p-$Ga_{0.5}In_{0.5}P$ layer 1307 is formed as a part of an upper distributed Bragg reflector and is grown with the thickness such that there occurs a phase difference π/2 in the laser oscillation light wave in the $Ga_{0.5}In_{0.5}P$ layer (¼ thickness of the oscillation wavelength in the $Ga_{0.5}In_{0.5}P$ layer). Further, the thickness of the p-$Al_{0.15}Ga_{0.85}As$ layer 1308 is set to 30 nm.

Further, the GaAs/$Al_{0.15}Ga_{0.85}As$ quantum well active layer 1305 and the GaAs cavity spacer layers 1304 and 1306 above and below the active layer 1305 are formed with respective thicknesses such that there is caused a total phase difference of 2π in the laser oscillation light wave in these semiconductor layers. Thereby, there is formed a one-wavelength cavity by these layers. In order to achieve high stimulation emission probability, the GaAs/$Al_{0.15}Ga_{0.85}As$ quantum well active layer 1305 is formed in correspondence to the anti-node of the standing wave of laser oscillation light wave formed at the mid part of the cavity spacer layers 1304 and 1306.

Next, a resist pattern is formed on the device surface in correspondence to the high refractive index region shown in FIG. 25A, and the p-$Al_{0.15}Ga_{0.85}As$ layer 308 corresponding to the low refractive index region of FIG. 25A is removed by a wet etching process while using a sulfuric acid etchant. Here, it should be noted that the wet etching of the p-GaAs layer 1308 is conducted selectively by using the underlying p-$Al_{0.15}Ga_{0.85}InP$ layer 307 as an etching stopper.

Next, removal of the resist is conducted, and after applying an appropriate surface cleaning process, growth of the p-AlAs/$Al_{0.15}Ga_{0.85}As$ semiconductor distributed Bragg reflector 1309 is conducted by a regrowth process for twenty six periods. Here, it should be noted that the growth of the p-AlAs/$Al_{0.15}Ga_{0.85}As$ semiconductor distributed Bragg reflector 1309 is started from the p-$Al_{0.15}Ga_{0.85}As$ layer, wherein the p-$Al_{0.15}Ga_{0.85}As$ layer is grown with the thickness chosen such that there is caused a phase difference of π/2 therein (¼ thickness of the oscillation wavelength in the $Al_{0.15}Ga_{0.85}As$ layer).

Further, there is provided a contact layer (not shown) by the outermost GaAs layer of the upper p-AlAs/$Al_{0.15}Ga_{0.85}As$ distributed Bragg reflector 1309 by increasing the carbon doping at the surface part thereof.

Thus, in the region where the etching of the p-$Al_{0.15}Ga_{0.85}As$ layer 1308 is conducted, the respective layers constituting the semiconductor distributed Bragg reflector 1309 are formed to have the thicknesses so as to satisfy the phase condition of multiple reflection of the semiconductor distributed Bragg reflector with respect to the designed laser oscillation wavelength.

In the region where the etching removal of the p-$Al_{0.15}Ga_{0.85}As$ layer 1308 has not been made, on the other hand, the $Al_{0.15}Ga_{0.85}As$ layer is formed to have an increased thickness as compared with the region where the etching has been made.

Next, a resist pattern is formed on the device surface, and a current confinement structure 1310 is formed in the p-AlAs/ $Al_{0.15}Ga_{0.85}As$ semiconductor distributed Bragg reflector 1309 in the form of a high resistance region by a hydrogen-ion implantation process. Here, the current confinement diameter of the current confinement structure 1310 is set to 8 μm.

It should be noted that FIG. 25A shows the region not conducted with the hydrogen ion implantation (current injection region) by hatching, wherein it will be noted that the current injection region is formed inside the low refractive index core so as to overlap with the low refractive index core spatially.

Next, a p-side electrode 1311 is formed on the device surface and an n-side electrode 1312 is formed on the rear side of the substrate after polishing of the rear side. Thereby, a surface-emission laser diode shown in FIGS. 25A-25C is obtained.

Hereinafter, the construction of the surface-emission laser diode of Example 17 will be explained in detail.

With the surface-emission laser diode of Example 17, there is provided a low refractive index core of a small region having a small effective refractive index at the central part of the laser oscillation region in the direction parallel to the substrate surface as shown in FIGS. 25A-25C.

Further, there is provided a cladding layer of high refractive index region around the low refractive index core, and with this, there is formed an antiguiding structure.

Further, in the region inside the high refractive cladding layer and contacting with the low refractive index core, there is formed a periodic structure of refractive index in which a low refractive index region and a high refractive index region are repeated three times.

In Example 17, it should be noted that the low refractive index core has a square shape as shown in FIG. 25A, and thus, the low refractive index core has a width D1 of 8 μm.

In Example 17, it should be noted that the construction of the refractive index is different between the first direction and the second direction shown in FIG. 25A, wherein the width d1 and d2 of the high refractive index region and the low refractive index region are set in the first direction such that there appears a phase difference of an odd integer multiple of π/2 in the respective regions (odd integer multiple of ¼ of the wavelength $\lambda_1^1$ in the direction parallel to the substrate surface in the respective media). Here, it should be noted that $\lambda_1^1$ represents the wavelength of the fundamental transverse mode in the high refractive index cladding layer in the direction parallel to the substrate taken in the first and second direction, similarly to Example 15. (In Example 17, in which the low refractive index core has a square shape, the wavelength $\lambda_1^1$ in the first direction and $\lambda_1^2$ in the second direction are identical). More specifically, with the surface-emission laser diode of Example 17, widths $d_1$ and $d_2$ are set to $d_1$=1.1 μm(=$3\lambda_1^1/4$), $d_2$=5 μm (=$D_1/2$)

Thus, in the first direction, there is formed a cavity structure similar to the one formed in the vertical direction by using the periodic structure formed of regions of different refractive indices as the mirror.

In the second direction, on the other hand, the widths d3 and d4 of the high refractive index region and the low refractive index region are provided relatively larger than the widths $d_1$ and $d_2$. More specifically, $d_3$ and $d_4$ are set to be about 1.3 times larger than $d_1$ and $d_2$ as $d_3$=1.43 μm, $d_4$=5.2 μm.

In this way, by setting the width of the low refractive index region and the width of the high refractive index region in the second direction to be larger than the width of the low refractive index region and the width of the high refractive index determined so as to achieve optimum confinement of the fundamental transverse mode in the first direction, it becomes possible to decrease the reflectivity for all of the modes.

As explained with reference to Equation (1), the wavelength of the higher-order transverse mode is always offset in the short wavelength direction as compared with the wavelength of the fundamental transverse mode, and thus, by setting the stop band wavelength of the periodic structure in the long wavelength side, it becomes possible to set the reflectivity for all of the modes.

Thus, with the device of Example 17, the mode having electric field amplitude (polarization) only in the first direction is selectively confined, while there occurs only weak confinement in the second direction for all of the modes. Thus, laser oscillation is suppressed effectively in those modes having polarization in the second direction due to the mode leakage and associated loss, and laser oscillation occurs selectively in the fundamental transverse mode having polarization in the first direction.

Thus, with the surface emission laser diode of Example 17, it is possible to obtain a single fundamental mode laser oscillation having polarization aligned in the first direction, up to high out put power level.

Further, with the surface-emission laser diode of Example 17, in which transverse mode control is not achieved by the selectively oxidized current confinement layer contrary to the case of the selectively oxidized surface-emission laser diode, it becomes possible to increase the diameter of current confinement. Thereby, the surface-emission laser diode of Example 17 has the preferable feature of low device resistance.

Further, because there is formed no mesa structure by etching process, the laser diode has excellent heat radiation performance. Thus, the device of Example 17 has another advantageous feature that the level of output saturation caused by heat is increased. Further, contrary to the case of the surface-emission laser diode of the selective oxidation type, the laser diode of Example 17 does not include a selectively oxidized current confinement layer inside the device structure. Thus, parasitic capacitance is decreased and the laser diode can be modulated at high speed.

While Example 17 has been explained for the case the periodic structure of refractive index provided in the direction perpendicular to the laser cavity direction (direction parallel to the substrate) and the hydrogen ion injection region have a rectangular shape in the plan view, the present invention is not limited to such a specific construction, and it is also possible to use an elliptic shape as shown in FIG. 22.

While explanation has been made for various examples above with regard to the case of using an MOCVD process for the crystal growth process, it is also possible with the present invention to use a molecular beam crystal growth (MBE) process or other crystal growth processes. Further, it is possible to use a semi-insulating substrate or a p-type substrate in place of the n-type substrate. Further, the laser oscillation wavelength is not limited to the foregoing 0.85 μm band or 1.3 μm band, and the laser diode can oscillate with the wavelength of 0.65 μm band, 0.98 μm band, 1.5 μm band, or the like.

According to the oscillation wavelength, it is possible to use other materials for the laser diode. For example, it is possible to use an AlGaInP mixed crystal for the 0.65 μm band. For the 0.98 μm band, it is possible to use an InGaAs mixed crystal. Further, a GaInNAs(Sb) mixed crystal can be used for the 1.5 μm band. Thereby, materials transparent in such a wavelength band are used for the distributed Bragg reflector with such a combination so as to maximize the refractive index difference therebetween.

Further, the device structure may be different from the structure explained with reference to the foregoing examples. Further, the devices explained with the foregoing examples may be tuned to oscillate with other oscillation wavelengths. By choosing the materials and construction of the distributed Bragg reflector appropriately according to the desired oscillation wavelength, any of the devices explained above can be tuned to the desired oscillation wavelength.

In order to reduce the device resistance further, it is effective to provide a heterospike buffering layer between the Al(Ga)As/GaAs heterointerface with a composition intermediate therebetween. Further, such a heterospike buffering layer may be provided to the interface of the selective oxidizing layer.

With regard to the heterospike buffering layer, it is possible to use a single layer having a composition intermediate of the two layers constituting the heterointerface or combination of plural layers of different compositions. Further, it is also possible to change the composition continuously.

EXAMPLE 18

Figure 26:
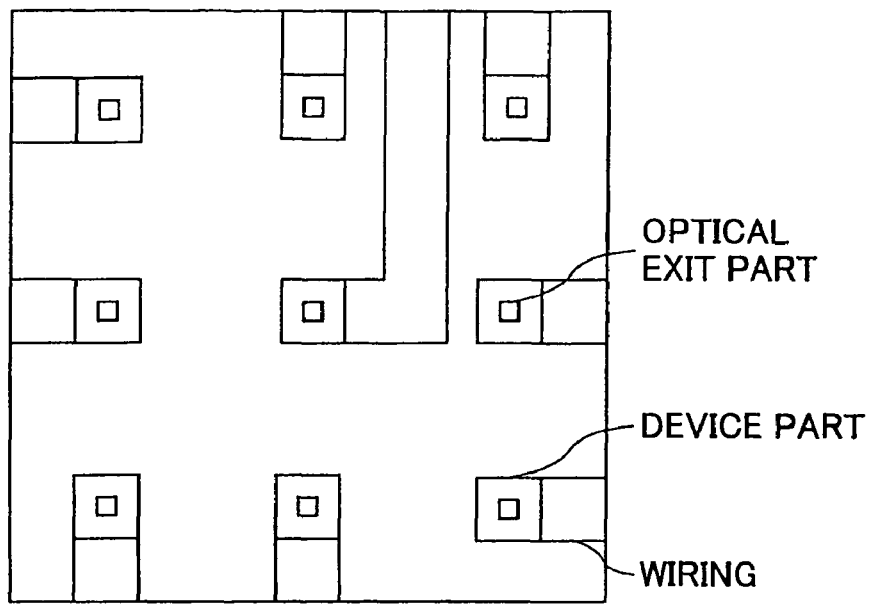
FIG. 26 is a plan view (top plan view) showing a surface-emission laser array of Example 18.

FIG. 26 shows a surface-emission laser array according to Example 18 of the present invention. More specifically, FIG. 18 shows the construction of a monolithic laser array in which the surface-emission laser diodes of the present invention are arranged two-dimensionally in the 4×4 formation in a top plan view.

In FIG. 26, there is provided wirings on the upper electrodes individually so as to drive the laser diodes independently. The surface-emission laser diode array of FIG. 26 is formed by the process and method similar to the one used in any of the examples explained before.

For the surface-emission laser diodes constituting the surface-emission laser array of FIG. 26, the surface-emission laser diode of any of Examples 15 through Example 17 (the surface-emission laser diode in which the polarization direction is aligned in a specific desired direction and capable of maintaining single fundamental transverse mode laser oscillation up to high output power state) is used. Thereby, the polarization direction is controlled by patterning conducted by photolithographic process, it is possible to set the polarization direction individually for each of the laser diode elements constituting the array.

Thus, with Example 18, it becomes possible to obtain a surface-emission laser array in which the polarization direction is controlled stably in a desired specific direction and is capable of oscillating in single transverse mode up to high output state.

EXAMPLE 19

Figure 27:
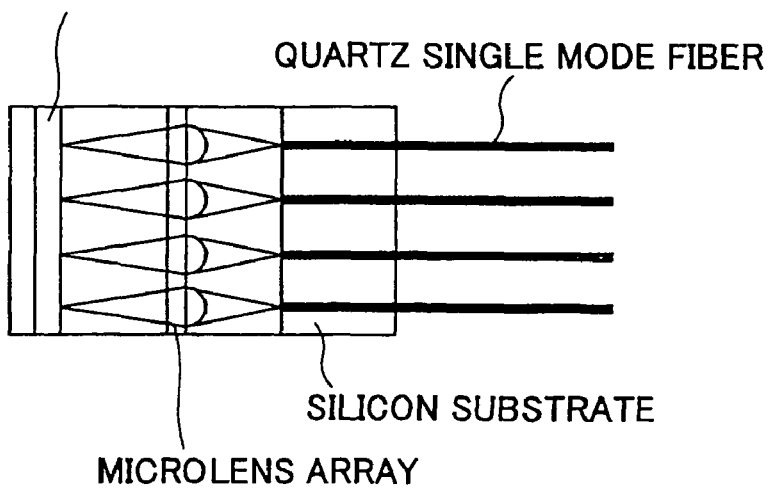
FIG. 27 is a diagram showing the laser array module as an example of the optical interconnection system of Example 19.
Figure 28:
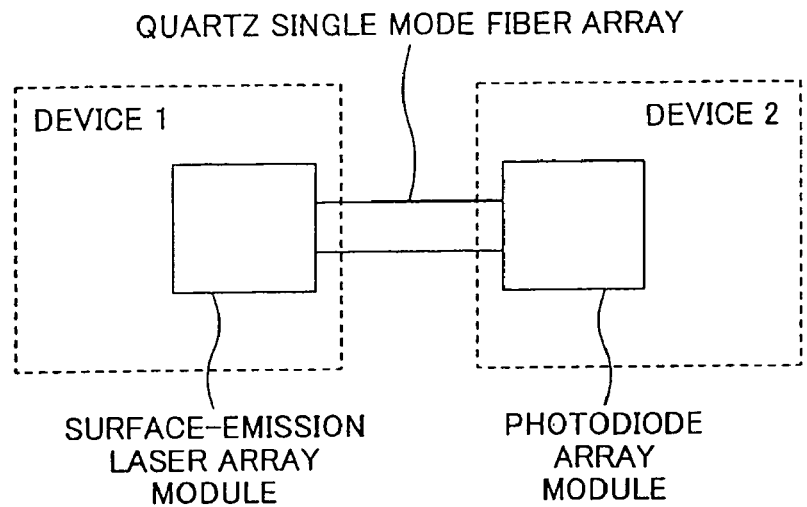
FIG. 28 is a diagram showing a parallel optical interconnection system connecting between devices as an example of the optical interconnection system of Example 19.

FIG. 27 is a diagram showing a surface-emission laser module as an example of the optical interconnection system according to Example 19, while FIG. 28 is a diagram showing an example of a parallel optical interconnection system that connects different devices.

The laser array module of FIG. 27 is constructed by mounting a one-dimensional monolithic surface-emission laser array of the present invention, a microlens array and a fiber array on a silicon substrate.

Here, the surface-emission laser array is provided in the direction toward the fibers and are coupled with the silica single mode fibers mounted on V-shaped grooves formed on the silicon substrate via the microlens array. The surface-emission laser array has an oscillation wavelength of 1.3 μm band and achieves high speed transmission over the silica single mode fibers.

With the interconnection system of FIG. 28, a device 1 and a device 2 are connected by an optical fiber array. Thereby, the device 1 at the transmission side includes a one-dimensional laser array module that uses the surface-emission laser diode or the surface-emission laser array of the present invention and a driving circuit thereof. Further, the device 2 at the reception side includes a photodiode array module and a signal detection circuit.

With the optical interconnection system of Example 19, a stable fundamental transverse mode laser oscillation is obtained with regard to the environmental temperature change or change of driving condition while maintaining the polarization in a specific direction, as a result of use of the surface-emission laser array of the present invention. Because there occurs little change of coupling efficiency with the optical fibers, it becomes possible with the present invention to construct a highly reliable interconnection system.

While foregoing example has been explained with regard to the parallel optical interconnection system, it is also possible to construct a serial transmission system by using a single device. Further, it is also possible to apply the system of Example 19 to inter board connection, inter chip connection and intra chip connection.

EXAMPLE 20

Figure 29:
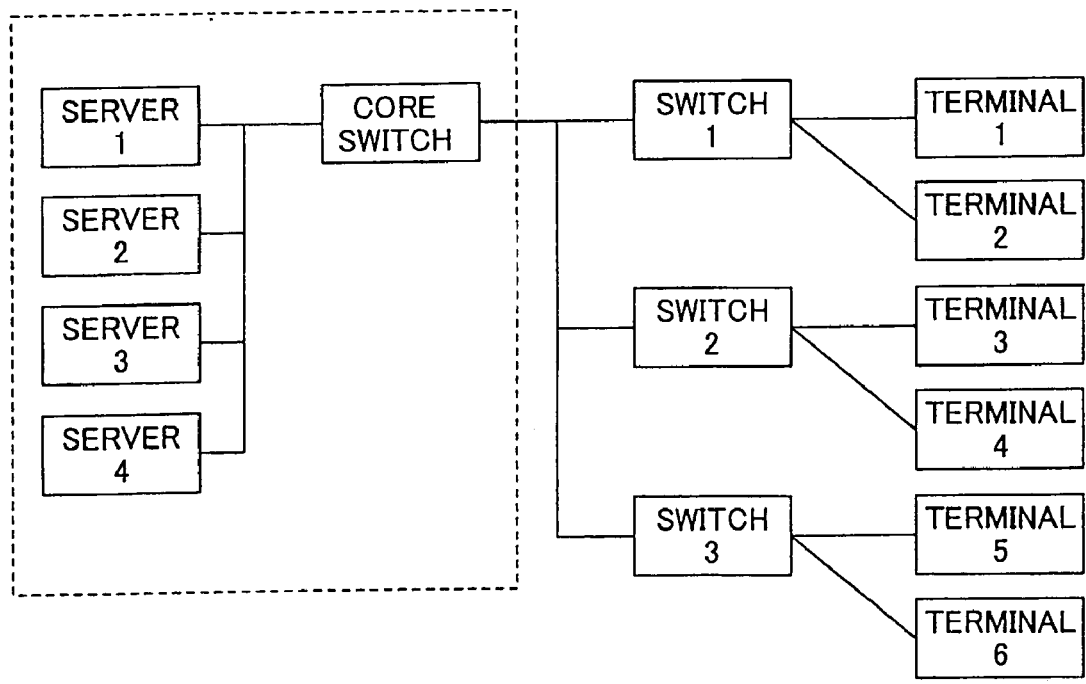
FIG. 29 is a diagram showing an optical LAN system as an example of an optical telecommunication system of Example 20.

FIG. 29 shows an optical communicating system according to Example 20 for the case the optical communication system is used as an optical LAN.

With the optical LAN system of FIG. 29, the surface-emission laser diode of surface-emission laser array of the present invention is used for the optical source of optical transmission between a server and a core switch, between a core switch and individual switches, and between individual switches and individual terminals.

Thereby, connection between the devices is achieved by using a silica single mode fiber or a multimode fiber.

By using the surface-emission laser diode or surface-emission laser array of the present invention for the optical source, in which the surface-emission laser diode or surface-emission laser array of the present invention is used for the optical source, stable fundamental transverse mode laser oscillation is achieved with the LAN system of FIG. 29 while maintaining the polarization is a predetermined direction, in spite of environmental temperature change or change of drive condition, and it became possible to construct a highly reliable system because of little change of coupling efficiency with optical fibers.

EXAMPLE 21

Figure 30:
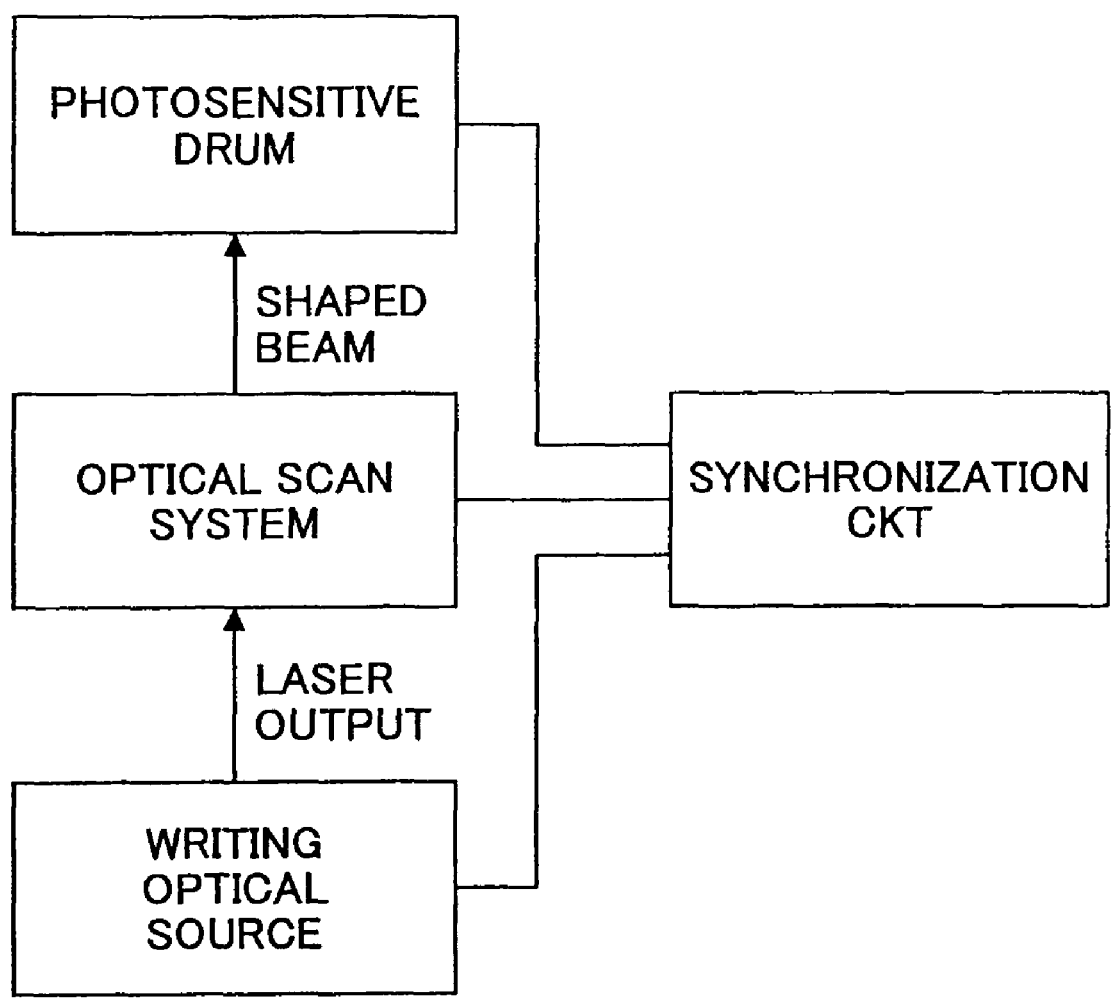
FIG. 30 is a diagram showing an electro-graphic system of Example 21.

FIG. 30 is a diagram showing an electro-photographic system according to Example 21 of the present invention.

The electrophotographic system of FIG. 30 comprises a photosensitive drum, scanning and converging optical system (optical scanning system), a writing optical source and a synchronization control part, wherein the surface-emission laser diode or the surface-emission laser array of the present invention is used for the wiring optical source.

The electrophotographic system of FIG. 30 is controlled by a synchronization control circuit, and the optical beam from the optical source is focused upon the photosensitive drum by the scanning and converging optical system that includes a polygonal mirror. Thereby, there is formed an electrostatic latent image on the photosensitive drum. For the surface-emission laser diode, it is possible to use the one having the oscillation wavelength of 780 nm band.

Conventionally, it has been difficult with the surface-emission laser diode to operate with high output power because of extensive heat generation, while in the case of the surface-emission laser diode of the present invention, operation with higher output power becomes possible as compared with the conventional device. Thus, the surface-emission laser diode of the present invention is suitable for the writing optical source of the electrophotographic system.

Further, because the laser oscillation is in the single fundamental transverse mode, a single-peak far field image is obtained, and focusing of the optical beam is achieved easily. With this, a high definition image is obtained with the present invention.

Further, with the red surface-emission laser diode that uses the AlGaInP material for the active layer, laser oscillation at about 650 nm is possible, while this oscillation wavelength is shorter than the case of using an AlGaAs material. Thereby, the tolerance of design in the optical system is increased. Thus, such a red surface-emission laser diode is suitable for the writing optical source of high definition electrophotographic systems.

It should be noted that such a surface-emission laser diode can be constructed by using the material of AlGaInP system for the active layer and by using the material of AlGaAs or AlGaInP system for the distributed Bragg reflector.

Further, it is possible to achieve crystal growth in lattice matching with the GaAs substrate with the use of such a material, and thus, it is possible to use such an AlAs material for the selective oxidation layer.

On the other hand, with the use of AlGaInP material, there arises a problem that the laser diode becomes extremely susceptible to temperature change, and associated with this, problems such as saturation of output power or failure of laser oscillation are caused with temperature increase associated with device heat generation.

With the surface-emission laser diode fabricated with the present invention, the higher-order transverse mode distribution is shifter toward the mesa sidewall surface as a result of use of the antiguiding structure, while such a shift decreases the degree of coupling of the higher-order transverse mode distribution with the gain region. Thereby, laser oscillation with higher-order transverse mode is effectively suppressed, while this enables use of larger diameter for the current confinement region.

Thus, with the present invention, it becomes possible to decrease the diameter of the current confinement region, which has been a problem with a red surface-emission laser diode, and it becomes possible to realize a device of low resistance.

Thus, with the present invention, it becomes possible to realize a red surface-emission laser diode of reduced heat generation and capable of oscillating in the single fundamental transverse mode with higher output power as compared with the conventional device, while such a laser diode is quite suitable for the writing optical source of electrophotographic system.

Further, with the surface-emission laser diode of the present invention, the polarization is controlled in a specific direction, and because of this, uniform beam spot is obtained on the photosensitive drum, and thus, properties preferable for the optical source of an electrophotographic system is provided.

Thus, while there exists a problem that the beam spot shape may change depending on the polarization direction, the surface-emission laser diode of the present invention can avoid this problem because the polarization direction is controlled with the present invention. Thus, the surface-emission laser diode constructed by the present invention is suitable for the writing optical source of an electrophotographic system.

Further, as a result of use of the surface-emission laser array of Example 18, it becomes possible to increase the writing speed as compared with the conventional device. Thereby, it becomes possible with the present invention to obtain a high speed and high definition electrophotographic system.

EXAMPLE 22

Figure 31:
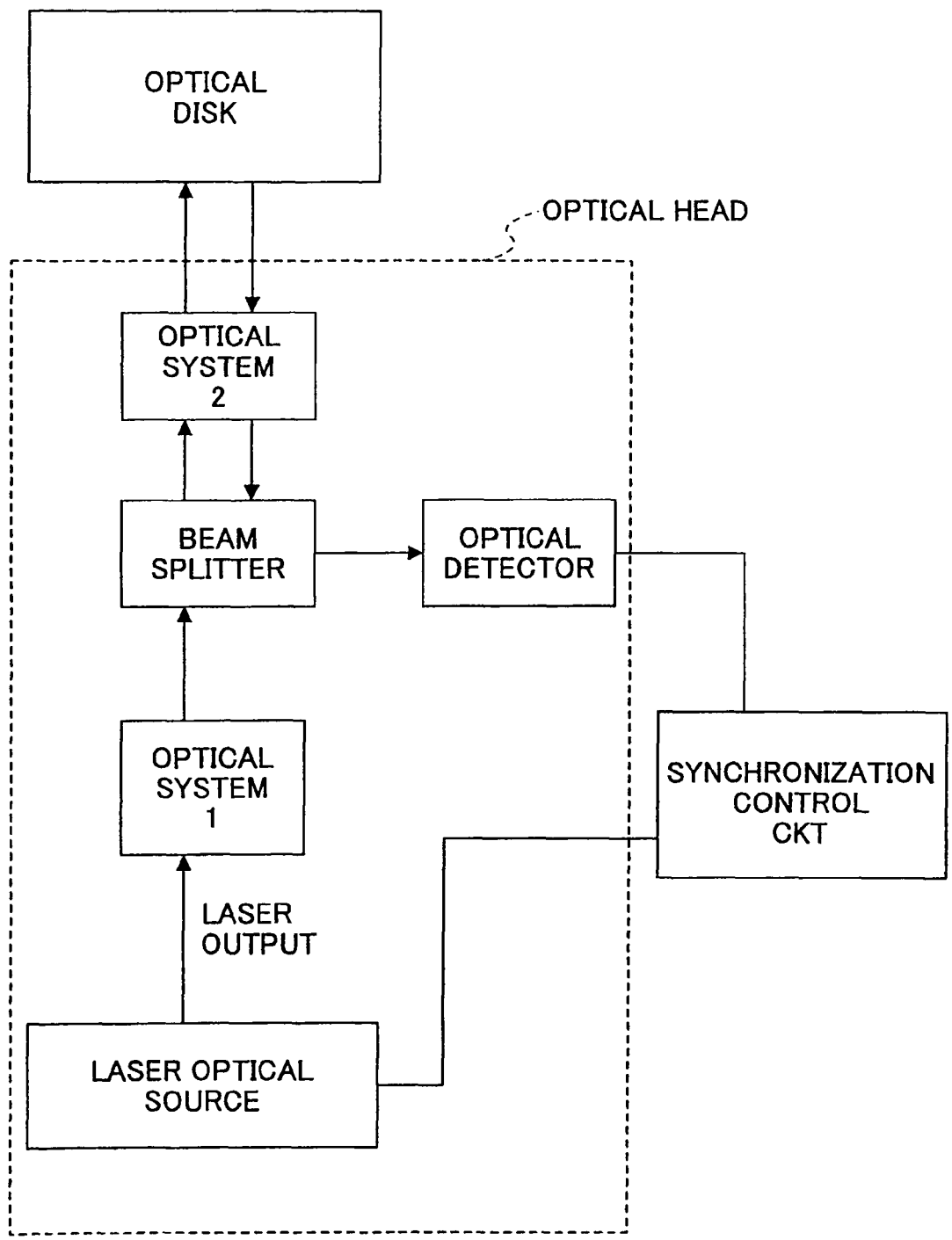
FIG. 31 is a diagram showing the optical disk system of Example 22.

FIG. 31 is a diagram showing an optical disk system according to Example 22 of the present invention.

The optical disk system of FIG. 31 is formed of an optical disk, an optical system 1, an optical system 2, a beam splitter, an optical detector, a laser optical source, and a synchronization part (synchronization control circuit), wherein the surface-emission laser diode or surface-emission laser array of the present invention is used for the laser optical source.

Here, it should be noted that the optical system 1, optical system 2, beam splitter, optical detector and the laser optical source constitute an optical head, wherein the optical head is driven by an actuator and achieves access to an arbitrary track on the disk. Here, the optical system 1 is constructed by a diffraction grating and a beam expansion lens, while the optical system 2 is constructed of a ¼ wavelength plate and a beam converging lens.

With the optical disk system of FIG. 20, the laser beam from the laser source is focused upon the disk surface by the optical source 1 and the optical source 2 under control of the synchronization circuit, and the disk surface is irradiated with the laser beam.

On the disk surface, there is formed a track by information pits arranged in the form of a regular array, and the laser beam reflected from such a disk surface is directed to the optical detector in the reading operation by the beam splitter after passing through the optical system 2 again. In the optical detector, the information signal and also the tracking signal formed by the information pits are detected, and servo control of the optical head is achieved based on the detected signals with regard to the distance between the disk and the head and with regard to the head and the track.

With the surface-emission laser diode of the present invention, the polarization direction is aligned in a specific direction and a larger output power is possible as compared with the conventional device while maintaining the single fundamental transverse mode operation. Because of this, a single peak beam spot is obtained stably. Thereby, the optical system necessary for beam shaping is simplified, and the cost of the optical disk system is reduced.

Because the polarization direction is controlled easily in a specific direction, the surface-emission laser diode of the present invention is particularly useful for the reading optical source of a magneto-optical disk.

Because it becomes possible to obtain a single peak beam spot with reliability, the optical disk system constructed by using the surface-emission laser diode of the present invention provides excellent reliability. Further, it becomes possible to achieve high speed reading as a result of use of the surface-emission laser array of Example 10.

Thus, with the present invention, it becomes possible to obtain a high speed and highly reliable optical disk system.

Further, the present invention is by no means limited to the embodiments described heretofore, but various variations and modifications may be made without departing from the scope of the invention.

The present invention is based on Japanese priority applications 2003-396815 filed on Nov. 27, 2003, 2004-148902 filed on May 19, 2004, 2004-184492 filed on Jun. 23, 2004, and 2004-322041 filed on Nov. 5, 2004, the entire contents of which are incorporated herein as reference.

What is claimed is:

1. A surface-emission laser diode, comprising:
an active layer;
a pair of cavity spacer layers formed at both sides of said active layer;
a current confinement structure defining a current injection region into said active layer; and
a pair of distributed Bragg reflectors opposing with each other across a structure formed of said active layer and said pair of cavity spacer layers,
said current confinement structure comprising a high resistance region formed by an ion implantation process,
said pair of distributed Bragg reflectors being formed of semiconductor materials,
wherein there is provided a region containing an oxide of Al and having a relatively low refractive index than a surrounding region in any of said semiconductor distributed Bragg reflector or said cavity spacer layer in correspondence to a part spatially overlapping with said current injection region in a laser cavity direction, and
wherein there is provided any of a GaAs layer or a GaInP mixed crystal layer adjacent with an AlGaAs mixed crystal layer constituting said region of relatively low refractive index with respect to said surrounding region not injected with said molecules containing oxygen and located on an identical plane of said part where said ion implantation of said molecules has been made.

2. A surface emission laser diode, comprising:
an active layer;
a pair of cavity spacer layers formed at both sides of said active layer;
a current confinement structure defining a current injection region into said active layer; and
a pair of distributed Bragg reflectors opposing with each other across a structure formed of said active layer and said pair of cavity spacer layers,
said current confinement structure comprising a high resistance region formed by an ion implantation process,
said pair of distributed Bragg reflectors being formed of semiconductor materials,
wherein there is provided a region containing an oxide of Al and having a relatively low refractive index than a surrounding region in any of said semiconductor distributed Bragg reflector or said cavity spacer layer in correspondence to a part spatially overlapping with said current injection region in a laser cavity direction, and
wherein an AlGaAs mixed crystal layer, constituting said region of relatively low refractive index with respect to said surrounding region not made with ion implantation of molecules containing oxygen and located on an identical plane perpendicular to said laser cavity direction, is provided at a location corresponding to an anti-node of a standing wave of laser oscillation occurring in said cavity structure, said AlGaAs mixed crystal layer being doped to a higher concentration level as compared with other AlGaAs mixed crystal layers constituting said surface-emission laser diode.

3. A surface-emission laser diode according to claim 1, wherein said region of relatively low refractive index is provided in plural numbers.

4. A surface-emission laser diode according to claim 1, wherein said region of relatively low refractive index is provided inside an n-type distributed Bragg reflector constituting one of said pair of distributed Bragg reflectors.

5. A surface-emission laser diode, comprising:
an active layer;
a pair of cavity spacer layers formed at both sides of said active layer;
a current confinement structure defining a current injection region into said active layer; and
a pair of distributed Bragg reflectors opposing with each other across a structure formed of said active layer and said pair of cavity spacer layers,
said current confinement structure comprising a high resistance region formed by an ion implantation process,
said pair of distributed Bragg reflectors being formed of semiconductor materials,
wherein there is provided a region containing an oxide of Al and having a relatively low refractive index than a surrounding region in any of said semiconductor distributed Bragg reflector or said cavity spacer layer in correspondence to a part spatially overlapping with said current injection region in a laser cavity direction, and
wherein there is further provided a region of relatively high refractive index around said region of relatively low refractive index provided in spatial overlapping with said laser cavity region in said laser cavity direction, and
wherein there is further provided a cladding region of low refractive index with respect to said high refractive region such that said cladding region is located around said region of high refractive index.

6. A surface-emission laser diode according to claim 5, wherein there is provided an anisotropy in a width of said high refractive region surrounded by said cladding region.

7. A surface-emission laser diode according to claim 5, wherein said cladding region is provided in a pair in a direction perpendicular to said laser cavity direction across a laser cavity region.

8. A surface-emission laser diode according to claim 1, wherein said region of relatively low refractive index has an anisotropic shape.

9. A surface-emission laser diode according to claim 1, wherein said active layer comprises a group III-V compound semiconductor material, said group III element comprises at least one of Ga and In, and wherein said group V element comprises one or more of As, N, Sb and P.

10. A surface-emission laser array comprising a plurality of surface-emission laser diodes, said plurality of surface-emission laser diodes being arranged to form an array,
each of said plurality of surface-emission laser diodes comprising the surface-emission laser diode of claim 1.

11. An optical communication system that uses a surface-emission laser diode as a communication optical source,
said surface-emission laser diode comprising the surface-emission laser diode of claim 1.

* * * * *